US010108091B2

(12) United States Patent
Sato

(10) Patent No.: US 10,108,091 B2
(45) Date of Patent: *Oct. 23, 2018

(54) PHOTOSENSITIVE TRANSFER MATERIAL, PATTERN FORMATION METHOD, AND ETCHING METHOD

(71) Applicant: FUJIFILM Corporation, Tokyo (JP)

(72) Inventor: Morimasa Sato, Fujinomiya (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/185,861

(22) Filed: Jun. 17, 2016

(65) Prior Publication Data

US 2016/0291468 A1    Oct. 6, 2016

Related U.S. Application Data

(63) Continuation of application No. PCT/JP2014/081749, filed on Dec. 1, 2014.

(30) Foreign Application Priority Data

Dec. 18, 2013    (JP) .................................. 2013-260818

(51) Int. Cl.
    *H01L 21/311*    (2006.01)
    *H01L 21/302*    (2006.01)
    (Continued)

(52) U.S. Cl.
    CPC .............. *G03F 7/039* (2013.01); *C08F 12/22* (2013.01); *G03F 7/0233* (2013.01);
    (Continued)

(58) Field of Classification Search
    None
    See application file for complete search history.

(56) References Cited

U.S. PATENT DOCUMENTS

2004/0217945 A1*  11/2004  Miyamoto ............ G06F 3/0412
                                              345/173
2007/0008442 A1*   1/2007  Ishigaki ................ G02F 1/1362
                                              349/42
(Continued)

FOREIGN PATENT DOCUMENTS

JP    2002-287345 A    10/2002
JP    2004-341058 A    12/2004
(Continued)

OTHER PUBLICATIONS

International Preliminary Report on Patentability dated Jun. 30, 2016, from the International Bureau in corresponding International application No. PCT/JP2014/081749.
(Continued)

*Primary Examiner* — Stephanie P Duclair
(74) *Attorney, Agent, or Firm* — Sughrue Mion, PLLC

(57) ABSTRACT

A photosensitive transfer material including a support and a photosensitive resin composition layer, in which the photosensitive resin composition layer includes a polymer component (A) including a polymer having a constituent unit (a1) that includes a group in which an acid group is protected by an acid-decomposable group and a photoacid generator (B), and the photosensitive resin composition layer does not have an ethylenic crosslinking structure is a positive-type material, is excellent in terms of heat-resistant rectangular properties, etchant resistance, and resist peeling properties, and generates only a small amount of dust during processes; a pattern formation method, and an etching method.

4 Claims, 3 Drawing Sheets

(51) Int. Cl.
| | |
|---|---|
| *H01L 21/461* | (2006.01) |
| *G03F 7/039* | (2006.01) |
| *G03F 7/09* | (2006.01) |
| *G03F 7/16* | (2006.01) |
| *C08F 12/22* | (2006.01) |
| *G03F 7/023* | (2006.01) |
| *G03F 7/11* | (2006.01) |
| *G03F 7/20* | (2006.01) |
| *G03F 7/32* | (2006.01) |
| *G03F 7/40* | (2006.01) |

(52) U.S. Cl.
CPC ............ *G03F 7/0392* (2013.01); *G03F 7/094* (2013.01); *G03F 7/11* (2013.01); *G03F 7/161* (2013.01); *G03F 7/20* (2013.01); *G03F 7/32* (2013.01); *G03F 7/40* (2013.01); *Y02P 20/582* (2015.11)

(56) References Cited

U.S. PATENT DOCUMENTS

| | | | | |
|---|---|---|---|---|
| 2012/0107563 | A1* | 5/2012 | Yonezawa | G03F 7/0392 428/156 |
| 2015/0219993 | A1 | 8/2015 | Ito et al. | |

FOREIGN PATENT DOCUMENTS

| | | |
|---|---|---|
| JP | 2006-003861 A | 1/2006 |
| JP | 2006-178423 A | 7/2006 |
| JP | 2007-163772 A | 6/2007 |
| JP | 2008-134474 A | 6/2008 |
| JP | 2010-211109 A | 9/2010 |
| JP | 4544219 B2 | 9/2010 |
| JP | 4654938 B2 | 3/2011 |
| JP | 2012-181488 A | 9/2012 |
| JP | 2013-210616 A | 10/2013 |
| TW | 200736837 A | 10/2007 |
| WO | 2014/065220 A1 | 5/2014 |

OTHER PUBLICATIONS

Office Action dated Feb. 28, 2017, issued from the Japanese Patent Office in corresponding Japanese Application No. 2013-260818.
Office Action dated Apr. 26, 2017 issued by Korean Intellectual Property Office in counterpart Korean Application No. 10-2016-7015944.
International Search Report of PCT/JP2014/081749 dated Dec. 22, 2014.
Written Opinion of the International Searching Authority of PCT/JP2014/081749 dated Dec. 22, 2014.
Office Action dated Aug. 8, 2017, from the Japanese Patent Office in counterpart Japanese Application No. 2013-260818.
Office Action dated Aug. 7, 2018, from the Intellectual Property Office of Taiwan in counterpart TW Application No. 103143396.

* cited by examiner

PHOTOSENSITIVE TRANSFER MATERIAL, PATTERN FORMATION METHOD, AND ETCHING METHOD

CROSS-REFERENCE TO RELATED APPLICATIONS

This application is a Continuation of PCT International Application No. PCT/JP2014/081749, filed on Dec. 1, 2014, which claims priority under 35 U.S.C. Section 119(a) to Japanese Patent Application No. 2013-260818 filed on Dec. 18, 2013. Each of the above applications is hereby expressly incorporated by reference, in its entirety, into the present application.

BACKGROUND OF THE INVENTION

1. Field of the Invention

The present invention relates to a photosensitive transfer material, a pattern formation method, and an etching method.

2. Description of the Related Art

In organic EL display devices, liquid crystal display devices, capacitance-type input devices, and the like, a pattern-formed interlayer dielectric film is provided. In order to form the interlayer dielectric film, a method is widely used in which the number of steps necessary to obtain a required pattern shape is small and, furthermore, from the viewpoint that sufficient flatness is obtainable, a photosensitive resin composition layer transferred onto an arbitrary substrate using a photosensitive transfer material is exposed through a mask having a desired pattern, is partially hardened, and then is developed.

On the basis of the difference in the photosensitive system, photosensitive resin compositions are classified into negative photosensitive resin compositions which remain as images when irradiated with an active light ray and positive photosensitive resin compositions which remain as images when not irradiated with an active light ray. In the case of the negative resin compositions, since exposed portions are hardened, it is necessary to dispose of individual substrates in a case in which the obtained pattern shape is poor. On the other hand, in the case of the positive resin compositions, since the solubility of exposed portions is increased using a photosensitizing agent that generates an acid when irradiated with an active light ray, both exposed portions and non-exposed portions are not hardened immediately before a timing of moment of pattern exposure and, in a case in which the obtained pattern shape is poor, substrates are reusable (reworkable) through full-surface exposure or the like. Therefore, from the viewpoint of being excellent in terms of so-called peeling properties in reworking processes, the positive photosensitive resin compositions are preferred.

As examples of the transfer material in which the above-described positive photosensitive resin composition is used, transfer materials described in JP4544219B, JP4654938B, and JP2010-211109A are known.

JP4544219B describes a transfer film including a support film and a resin film formed of a positive radiation-sensitive resin composition on the support film. In this document, as the positive radiation-sensitive resin composition, a chemical amplification-type positive radiation-sensitive resin composition including a polymer having a structural unit that includes an acid-decomposable functional group which is disassociated by an acid and generates an acidic functional group and a crosslinking structure, a radiation-sensitive acid generator, and an organic solvent is described, and, as the polymer having a crosslinking structure, particularly, a polymer having a crosslinking structure derived from a monomer having an ethylenic double bond is used. The document describes that, when the positive radiation-sensitive resin composition is used as a dry film resist for plate patterning, sensitivity, resolving properties, and the like are excellent, adhesiveness to substrates is excellent, residue is not generated in opening portions after development, the occurrence of cracking of the resin film after plating can be suppressed, plates being pressed into the resin film can be suppressed, the dimensional change in patterns formed in response to a change in the exposure intensity is small, and the generation of T-top by amines present in the environment can be solved. Particularly, it is described that, according to Paragraph [0050] of JP4544219B, in a case in which a plating sculpture is formed, when a metal column is formed in a groove formed by patterning a resin film by means of plating, there is a problem in that, in a resin film having a weak strength, the groove in the resin film may deform; however, when the positive radiation-sensitive resin composition of JP4544219B is used, an ethylenic crosslinking structure can be formed in the resin film and thus a firm resin film can be formed, and a metal column having a vertical side wall can be formed. In addition, in [0058] of JP4544219B, it is described that, when 0.1 mol % to 10 mol % of a structural unit including a crosslinking structure with respect to the total of other structural units is included, an appropriate molecular weight for obtaining a favorable resolution as a resist can be obtained without causing the gelation of the transfer film, and sufficient plating resistance is developed.

In a case in which a positive radiation-sensitive resin composition including the polymer having a crosslinking structure described in JP4544219B is used as an etching resist, in order to impart etchant resistance, a thermal treatment after development is essential, which is not described in JP4544219B. Meanwhile, JP4544219B describes that the resin film in the transfer film can be used with a thickness in a range of 5 µm to 200 µm.

JP4654938B describes a method in which a resist pattern is formed using a photosensitive element formed by applying a chemical amplification-type positive photosensitive resin composition onto a support. JP4654938B describes a chemical amplification-type positive photosensitive resin composition including a thermopolymerizing compound having a bond that is cut by an acid and two or more ethylenic unsaturated bonds in the molecule, a thermopolymerization initiator that initiates a thermopolymerization reaction of the thermopolymerizing compound, and a compound that generates an acid when irradiated with an active energy ray. This document discloses a positive photosensitive resin composition in which a thermopolymerizing compound having an —O—C—O— portion is used. However, the thermopolymerizing compound described in JP4654938B is not a polymer and the document describes only polymerizing compounds (monomers). Since [0021] in JP4654938B describes that the —O—C—O— portion in the thermopolymerizing compound is cut by an acid and is thus decomposed into an —OH group and a ketone compound, and the formation of this —OH group makes the thermopolymerizing compound soluble in an alkaline aqueous solution, the —O—C—O— portion in the thermopolymerizing compound does not protect an acidic group. In addition, since a hardened film after exposure is developed using methanol in examples of JP4654938B, there is no study described in JP4654938B regarding the use of a thermopolymerizing compound having an acidic group in order to improve developing properties using an alkaline aqueous solution.

JP2010-211109A describes that, by using a manufacturing method of a resin pattern including a step of applying a positive photosensitive resin composition to a film base material and then removing a solvent, thereby producing a photosensitive dry film, a step of pressing the photosensitive dry film onto a pattern-disposed substrate, thereby forming a photosensitive layer, a step of irradiating the photosensitive layer with an active light ray through a mask, a step of developing the photosensitive layer using an alkaline aqueous solution, a step of rinsing the photosensitive layer using at least one solvent selected from the group consisting of water and acidic aqueous solutions, a step of irradiating the entire photosensitive layer with an active light ray, and a step of hardening the photosensitive layer at a temperature in a range of 100° C. to 400° C., the warping of FPC obtained after a baking step is reduced and mechanical properties are improved, whereby solvent resistance can be improved. In the chemical amplification-type positive dry film of JP2010-211109A, a polyimide resin is used as an alkali-soluble resin and a naphthoquinone diazide compound is combined with the polyimide resin as a photosensitizing agent that generates an acid when irradiated with an active light ray, but there is no description regarding an aspect in which the alkali-soluble resin has a crosslinking group or a protected group of an acid group.

SUMMARY OF THE INVENTION

In a case in which a pattern is formed using a transfer film, favorable etchant resistance after a thermal treatment which is carried out after development and favorable resist peeling properties are required. In a case in which a polymer having a structural unit that includes an acid-decomposable functional group which is disassociated by an acid and generates an acidic functional group is used, it is necessary to carry out post-baking (heating after exposure and development) for exposure and development in order to accelerate the detachment of the acid-decomposable functional group which is disassociated by an acid and generates an acidic functional group. In addition, in a case in which a resin having no protected group of an acid group is used, there are also cases in which it is necessary to carry out post-baking in order to improve the resistance of a pattern-formed resist portion to etchants. In a case in which post-baking is carried out, it becomes important that the sectional shape of a patterned portion after the post-baking is a dome shape having no edges and small taper angles (so-called heat-resistant rectangular properties are favorable) from the viewpoint of the resolution of etched metal patterns.

However, in transfer materials in which a polymer having a specific protected group as in JP4544219B and having an ethylenic crosslinking structure is used, there are cases in which the resist peeling properties deteriorate after post baking. In addition, it was found that the transfer film described in JP4654938B in which a monomer having a protected group is used instead of a polymer having a protected group remains unsatisfactory in terms of the heat-resistant rectangular properties.

In the method described in JP2010-211109A in which a polyimide resin having no protected group of an acid group is used and naphthoquinone diazide generating nitrogen during exposure is used as a photosensitizing agent, in a case in which a transfer material is produced, there are cases in which dust is generated during the process and the like of a material, and there has been a defect in which defects may be easily generated in a pattern due to the influence of dust generation.

An object of the present invention is to provide a photosensitive transfer material which is a positive-type material, is excellent in terms of heat-resistant rectangular properties, etchant resistance, and resist peeling properties, and generates only a small amount of dust during processes.

As a result of intensive studies, the present inventors found that, when a photosensitive transfer material including a support and a photosensitive resin composition layer in which the photosensitive resin composition layer includes a polymer component having a constituent unit that includes a group in which an acid group is protected by an acid-decomposable group and a photoacid generator, and a photosensitive resin composition layer does not have an ethylenic crosslinking structure is used, a photosensitive transfer material which is excellent in terms of heat-resistant rectangular properties, etchant resistance, and resist peeling properties and generates only a small amount of dust during processes is obtained and the above-described problems can be solved.

The present invention which is specific means for solving the above-described problems is as described below.

[1] A photosensitive transfer material comprising a support and a photosensitive resin composition layer, in which the photosensitive resin composition layer includes a polymer component (A) including a polymer having a constituent unit (a1) that includes a group in which an acid group is protected by an acid-decomposable group and a photoacid generator (B), and a photosensitive resin composition layer does not have an ethylenic crosslinking structure.

[2] The photosensitive transfer material according to [1], in which the constituent unit (a1) that includes a group in which an acid group is protected by an acid-decomposable group is preferably a constituent unit that includes a group in which a carboxyl group or a phenolic hydroxyl group is protected in an acetal form.

[3] The photosensitive transfer material according to [1] or [2], in which the photosensitive resin composition layer preferably includes a heterocyclic compound (C).

[4] The photosensitive transfer material according to [3], in which a content of the heterocyclic compound (C) is preferably in a range of 0.1% by mass to 10% by mass of a total solid content amount of the photosensitive resin composition layer.

[5] The photosensitive transfer material according to [3] or [4], in which the heterocyclic compound (C) preferably includes an epoxy group.

[6] The photosensitive transfer material according to any one of [1] to [5], in which the polymer component (A) including a polymer having the constituent unit (a1) that includes a group in which an acid group is protected by an acid-decomposable group is preferably a polymer component including a polymer having a constituent unit represented by General Formula (A1) or General Formula (A1') represented below,

GENERAL FORMULA (A1)

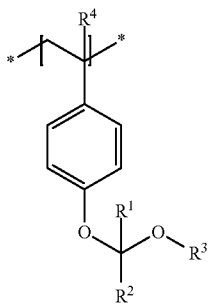

(in General Formula (A1), each of $R^1$ and $R^2$ independently represents a hydrogen atom, an alkyl group, or an aryl group, either or both $R^1$ and $R^2$ is an alkyl group or an aryl group, $R^3$ represents an alkyl group or an aryl group, $R^1$ or $R^2$ and $R^3$ may be combined together so as to form a cyclic ether, and $R^4$ represents a hydrogen atom or a methyl group).

GENERAL FORMULA (A1')

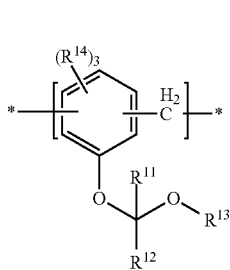

(in General Formula (A1'), each of $R^{11}$ and $R^{12}$ independently represents a hydrogen atom, an alkyl group, or an aryl group, either or both $R^{11}$ and $R^{12}$ is an alkyl group or an aryl group, $R^{13}$ represents an alkyl group or an aryl group, $R^{11}$ or $R^{12}$ and $R^{13}$ may be combined together so as to form a cyclic ether, and each of $R^{14}$s independently represents a hydrogen atom, a hydroxyl group, a halogen atom, an alkyl group, an alkoxy group, an alkenyl group, an aryl group, an aralkyl group, an alkoxycarbonyl group, a hydroxyalkyl group, an aryl carbonyl group, or a cycloalkyl group).

[7] The photosensitive transfer material according to any one of [1] to [6], in which the photosensitive resin composition layer preferably includes a polymer component (A) including two or more kinds of polymers having the constituent unit (a1) that includes a group in which an acid group is protected by an acid-decomposable group and preferably including a polymer having a constituent unit represented by General Formula (A2') represented below as the polymer having the constituent unit (a1) that includes a group in which an acid group is protected by an acid-decomposable group.

GENERAL FORMULA (A2')

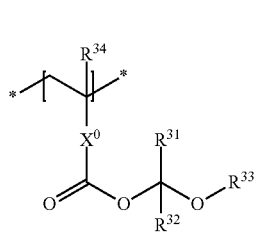

(in General Formula (A2'), each of $R^{31}$ and $R^{32}$ independently represents a hydrogen atom, an alkyl group, or an aryl group, either or both $R^{31}$ and $R^{32}$ is an alkyl group or an aryl group, $R^{33}$ represents an alkyl group or an aryl group, $R^{31}$ or $R^{32}$ and $R^{33}$ may be combined together so as to form a cyclic ether, $R^{34}$ represents a hydrogen atom or a methyl group, and $X^0$ represents a single bond or an arylene group).

[8] The photosensitive transfer material according to any one of [1] to [7], in which a film thickness of the photosensitive resin composition layer is preferably in a range of 0.5 μm to 10 μm.

[9] The photosensitive transfer material according to any one of [1] to [8] preferably further comprises a sensitizer in the photosensitive resin composition layer.

[10] The photosensitive transfer material according to any one of [1] to [9] preferably further comprises a basic compound in the photosensitive resin composition layer.

[11] The photosensitive transfer material according to any one of [1] to [10] preferably further comprises a protective film for the photosensitive resin composition layer.

[12] The photosensitive transfer material according to any one of [1] to [11] is preferably a photosensitive transfer material for forming a removable etching resist.

[13] A pattern formation method comprising: a photosensitive resin composition layer formation step of forming a photosensitive resin composition layer on at least one surface of a substrate using the photosensitive transfer material according to any one of [1] to [12], an exposure step of exposing the photosensitive resin composition layer, and a development step of developing the exposed photosensitive resin composition layer.

[14] The pattern formation method according to [13] preferably further comprises a post-baking step of heating a pattern image made of the photosensitive resin composition layer obtained by means of development.

[15] An etching method comprising: a step of carrying out etching using a pattern produced using the pattern formation method according to [13] or [14] as an etching resist; and a step of removing the pattern through a chemical treatment after an etching treatment.

According to the present invention, it is possible to provide a photosensitive transfer material which is a positive-type material, is excellent in terms of heat-resistant rectangular properties, etchant resistance, and resist peeling properties, and generates only a small amount of dust during processes.

DESCRIPTION OF THE PREFERRED EMBODIMENTS

Figure 1:
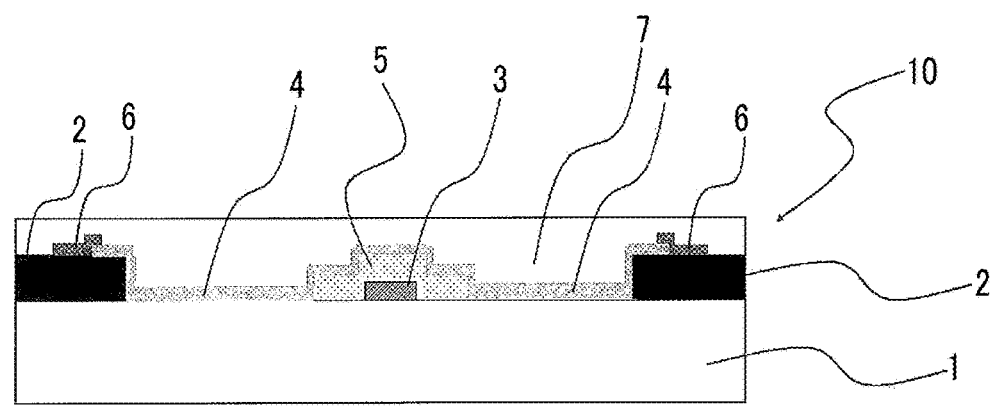
FIG. 1 is a sectional view illustrating a constitution of a capacitance-type input device including transparent electrode patterns that can be formed using a photosensitive transfer material of the present invention.

Hereinafter, a photosensitive transfer material, a pattern formation method, and an etching method of the present invention will be described.

Hereinafter, components will be described on the basis of the representative embodiments and specific examples of the present invention, but the present invention is not limited to the embodiments and specific examples. In the present specification, numerical ranges expressed using "to" will be considered to include numerical values before and after the "to" as the lower limit value and the upper limit value.

[Photosensitive Transfer Material]

A photosensitive transfer material of the present invention includes a support and a photosensitive resin composition layer, the photosensitive resin composition layer includes a polymer component (A) including a polymer having a constituent unit (a1) that includes a group in which an acid group is protected by an acid-decomposable group and a photoacid generator (B), and the photosensitive resin composition layer does not have an ethylenic crosslinking structure.

In the above-described constitution, the photosensitive transfer material of the present invention is a positive-type material, is excellent in terms of heat-resistant rectangular properties, etchant resistance, and resist peeling properties, and generates only a small amount of dust during processes.

The photosensitive transfer material of the present invention is preferably excellent in terms of handling properties and, particularly, more preferably has low tackiness (adherence properties). In particular, compared with the positive-type photosensitive resin composition described in JP4654938B in which a polymerizing compound (monomer) is used, the photosensitive transfer material of the present invention including the polymer component is excellent in terms of handling properties and tackiness.

Furthermore, the photosensitive transfer material of the present invention has excellent sensitivity and favorable resolving power and preferably has excellent line width stability.

Hereinafter, a preferred aspect of the photosensitive transfer material of the present invention will be described.

{Support}

The photosensitive transfer material of the present invention includes a support.

As the support, it is possible to use a flexible material that does not significantly deform, shrink, and elongate under pressurization or under pressurization and heating. Examples of the support include polyethylene terephthalate films, cellulose triacetate films, polystyrene films, polycarbonate films, and the like and, among them, biaxially-stretched polyethylene terephthalate films are particularly preferred.

The thickness of the support is not particularly limited, but is generally in a range of 5 μm to 200 μm, and, particularly, is preferably in a range of 10 μm to 150 μm in terms of easy handling and versatility.

In addition, the support may be transparent and may contain dyed silicon, an alumina sol, a chromium salt, a zirconium salt, and the like.

To the support used in the photosensitive transfer material of the present invention, it is possible to impart conductivity using the method described in JP2005-221726A.

{Photosensitive Resin Composition Layer}

The photosensitive transfer material of the present invention includes a photosensitive resin composition layer, the photosensitive resin composition layer includes a polymer component (A) including a polymer having a constituent unit (a1) that includes a group in which an acid group is protected by an acid-decomposable group and a photoacid generator (B), and the photosensitive resin composition layer does not have an ethylenic crosslinking structure.

The photosensitive transfer material of the present invention is a material in which the photosensitive resin composition layer does not have an ethylenic crosslinking structure, which makes the photosensitive transfer material advantageous in terms of solvent solubility and solubility during development. These advantages cannot be obtained in the positive radiation-sensitive resin composition having a crosslinking structure which is disclosed by JP4544219B or in a transfer film for which the positive radiation-sensitive resin composition is used. Meanwhile, in [0058] of JP4544219B, it is described that, in the specific polymer that is used in the positive radiation-sensitive resin composition described in JP4544219B, the fraction of a structural unit derived from a monomer (I) having two or more ethylenic unsaturated double bonds (a structural unit having a crosslinking structure) is preferably in a range of 0.1 mol % to 10 mol % with respect to a total of 100 mol % of structural units other than the monomer (I) having two or more ethylenic unsaturated double bonds (a structural unit having an acid-decomposable functional group, a structural unit having a carboxyl group, and other structural units).

The "ethylenic crosslinking structure" refers to a crosslinking structure that is formed using a homopolymer or a copolymer for which monomers having two or more ethylenic unsaturated double bonds are used.

The photosensitive resin composition having no ethylenic crosslinking structures means that a polymer having an ethylenic crosslinking structure is not substantially included in the photosensitive resin composition. In the photosensitive transfer material of the present invention, it is preferable that the photosensitive resin composition does not have ethylenic crosslinking structures and, additionally, does not have any crosslinking structures including crosslinking structures other than the above-described crosslinking structures. In the photosensitive transfer material of the present invention, the photosensitive resin composition also preferably does not have ethylenic crosslinking structures and more preferably does not have a polymer having a crosslinking structure. The photosensitive transfer material of the present invention also preferably does not have a monomer containing a crosslinking group.

In addition, in the present specification, examples of the ethylenic crosslinking group include groups having an ethylenic unsaturated double bond.

In the photosensitive resin composition, the total of the content of the polymer having an ethylenic crosslinking group and the content of the monomer having a crosslinking group is preferably less than 0.1% by mass and more preferably less than 0.01% by mass. Particularly, it is preferable that the monomer having two or more crosslinking groups is not included in the monomer having a crosslinking group, and the content of the monomer having two or more crosslinking groups in the photosensitive resin composition is preferably less than 0.1% by mass and more preferably less than 0.01% by mass. Meanwhile, the fraction of the component of the photosensitive resin composition mentioned herein refers to the fraction in the entire solid content from which a solvent is removed.

It is preferable that the constituent unit having a crosslinking group is not substantially included in the polymer having the constituent unit (a1) that includes a group in which an acid group is protected by an acid-decomposable group, and the mixing fraction of the constituent unit having a crosslinking group is more preferably less than 0.1 mol % and particularly preferably less than 0.01% by mass with respect to the constituent unit (a1) that includes a group in which an acid group is protected by an acid-decomposable group.

<Component A: Polymer Component>

In the photosensitive resin composition layer, the polymer component (A) includes a polymer having a constituent unit (a1) that includes a group in which an acid group is protected by an acid-decomposable group.

The polymer component (A) may further include polymers other than the above-described polymer. The polymer component (A) (hereinafter, in some cases, referred to as the "(A) component") in the present invention includes other polymers that are added as necessary to the polymer component unless particularly otherwise described.

<<Constituent Unit (a1)>>

When the polymer component (A) includes the constituent unit (a1), it is possible to produce a photosensitive transfer material including an extremely highly sensitive photosensitive resin composition layer.

Regarding the acid group or acid-decomposable group in the "group in which the acid group is protected by the acid-decomposable group" in the present invention, well-known acid group and acid-decomposable groups can be used as the acid group and the acid-decomposable group and there is no particular limitation. Specific examples of the acid group preferably include a carboxyl group and a phenolic hydroxyl group. In addition, as the acid-decomposable group, it is possible to use a group that is relatively easily decomposed by an acid (for example, an acetal-based functional group such as an ester structure of a group represented by Formula (A1) or (A1') represented below; a tetrahydropyranyl ester group; or a tetrahydrofuranyl ester group) or a group that is not relatively easily decomposed by an acid (for example, a tertiary alkyl group such as a tert-butyl ester group or a tertiary alkyl carbonate group such as a tert-butyl carbonate group).

The constituent unit (a1) that includes a group in which an acid group is protected by an acid-decomposable group is preferably a constituent unit that includes a protected phenolic hydroxyl group protected by an acid-decomposable group or a constituent unit that includes a protected carboxyl group protected by an acid-decomposable group.

In the photosensitive transfer material of the present invention, the constituent unit (a1) that includes a group in which an acid group is protected by an acid-decomposable group is more preferably a constituent unit that includes a group in which a carboxyl group or a phenolic hydroxyl group is protected in an acetal form.

Hereinafter, the constituent unit that includes a protected phenolic hydroxyl group protected by an acid-decomposable group and the constituent unit that includes a protected carboxyl group protected by an acid-decomposable group will be sequentially and respectively described.

<<<Constituent Unit that Includes Protected Phenolic Hydroxyl Group Protected by Acid-decomposable Group>>>

Regarding the constituent unit that includes a protected phenolic hydroxyl group protected by an acid-decomposable group, the constituent unit that includes a phenolic hydroxyl group is a constituent unit that includes a protected phenolic hydroxyl group protected by an acid-decomposable group that will be represented below in detail.

The constituent unit that includes a phenolic hydroxyl group is preferably a constituent unit in which a hydroxyl group of a constituent unit derived from hydroxystyrene or α-methyl hydroxystyrene (for example, a constituent unit in a novolac-based resin) is protected by an acid-decomposable group from the viewpoint of sensitivity and is more preferably a polymer having a constituent unit represented by General Formula (A1) or General Formula (A1') represented below since, furthermore, resolution can also be increased.

GENERAL FORMULA (A1)

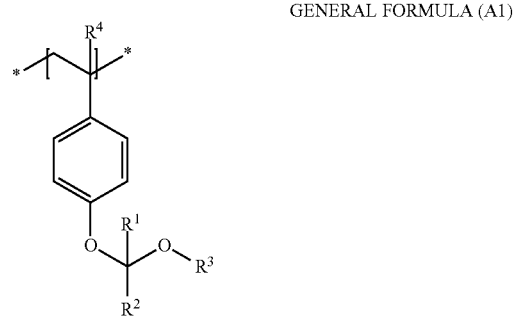

In General Formula (A1), each of $R^1$ and $R^2$ independently represents a hydrogen atom, an alkyl group, or an aryl group, either or both $R^1$ and $R^2$ is an alkyl group or an aryl group, $R^3$ represents an alkyl group or an aryl group, $R^1$ or $R^2$ and $R^3$ may be combined together so as to form a cyclic ether, and $R^4$ represents a hydrogen atom or a methyl group.

In General Formula (A1), in a case in which each of $R^1$ and $R^2$ is an alkyl group, the alkyl group preferably has 1 to 10 carbon atoms. In a case in which each of $R^1$ and $R^2$ is an aryl group, a phenyl group is preferred. Each of $R^1$ and $R^2$ is preferably a hydrogen atom or an alkyl group having 1 to 4 carbon atoms and either or both $R^1$ and $R^2$ is more preferably a hydrogen atom.

In General Formula (A1), $R^3$ represents an alkyl group or an aryl group, is preferably an alkyl group having 1 to 10 carbon atoms, and is more preferably an alkyl group having 1 to 6 carbon atoms.

$R^1$ or $R^2$ and $R^3$ may be combined together so as to form a cyclic ether and $R^1$ or $R^2$ and R are preferably combined together so as to form a cyclic ether. The number of ring members in the cyclic ether is not particularly limited, but is preferably 5 or 6 and more preferably 5.

In General Formula (A1), $R^4$ represents a hydrogen atom or a methyl group and is preferably a hydrogen atom.

GENERAL FORMULA (A1′)

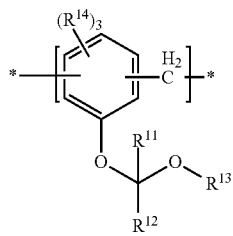

in General Formula (A1′), each of $R^{11}$ and $R^{12}$ independently represents a hydrogen atom, an alkyl group, or an aryl group, either or both $R^{11}$ and $R^{12}$ is an alkyl group or an aryl group, $R^{13}$ represents an alkyl group or an aryl group, $R^{11}$ or $R^{12}$ and $R^{13}$ may be combined together so as to form a cyclic ether, and each of $R^{14}$s independently represents a hydrogen atom, a hydroxyl group, a halogen atom, an alkyl group, an alkoxy group, an alkenyl group, an aryl group, an aralkyl group, an alkoxycarbonyl group, a hydroxyalkyl group, an aryl carbonyl group, or a cycloalkyl group.

In General Formula (A1′), in a case in which each of $R^{11}$ and $R^{12}$ is an alkyl group, the alkyl group preferably has 1 to 10 carbon atoms. In a case in which each of $R^{11}$ and $R^{12}$ is an aryl group, a phenyl group is preferred. Each of $R^{11}$ and $R^{12}$ is preferably a hydrogen atom or an alkyl group having 1 to 4 carbon atoms and either or both $R^{11}$ and $R^{12}$ is more preferably a hydrogen atom.

In General Formula (A1′), $R^{13}$ represents an alkyl group or an aryl group, is preferably an alkyl group having 1 to 10 carbon atoms, and is more preferably an alkyl group having 1 to 6 carbon atoms.

$R^{11}$ or $R^{12}$ and $R^{13}$ may be combined together so as to form a cyclic ether.

In General Formula (A1′), $R^{14}$ represents a hydrogen atom or a methyl group and is preferably a hydrogen atom.

As the acid-decomposable group that can be used in the constituent unit that includes the protected phenolic hydroxyl group protected by an acid-decomposable group, a well-known group can be used and there is no particular limitation. Among acid-decomposable groups, a constituent unit that includes a protected phenolic hydroxyl group protected by an acetal is preferred from the viewpoint of the basic properties of the photosensitive resin composition, particularly, sensitivity, pattern shape, the preservation stability of the photosensitive resin composition, and the formability of contact holes. Furthermore, among acid-decomposable groups, the phenolic hydroxyl group is more preferably a protected phenolic hydroxyl group protected in an acetal form represented by General Formula (a1-10) represented below from the viewpoint of sensitivity. In a case in which the phenolic hydroxyl group is a protected phenolic hydroxyl group protected in an acetal form represented by General Formula (a1-10) represented below, the protected phenolic hydroxyl group, as a whole, forms a structure of —Ar—O—$CR^{101}R^{102}(OR^{103})$. Ar represents an arylene group.

GENERAL FORMULA (a1-10)

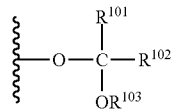

(In General Formula (a1-10), each of $R^{101}$ and $R^{102}$ independently represents a hydrogen atom or an alkyl group but both $R^{101}$ and $R^{102}$ cannot be hydrogen atoms at the same time. $R^{103}$ represents an alkyl group. $R^{101}$ or $R^{102}$ and $R^{103}$ may be combined together so as to form a cyclic ether.)

In General Formula (a1-10), each of $R^{101}$ to $R^{103}$ independently represents a hydrogen atom or an alkyl group and the alkyl group may be any of a straight alkyl group, a branched alkyl group, and a cyclic alkyl group. Both $R^{101}$ and $R^{102}$ cannot represent hydrogen atoms at the same time and either or both $R^{101}$ and $R^{102}$ represents an alkyl group.

In General Formula (a1-10), in a case in which each of $R^{101}$, $R^{102}$, and $R^{103}$ represents an alkyl group, the alkyl group may be any of a straight alkyl group, a branched alkyl group, and a cyclic alkyl group.

The straight or branched alkyl group preferably has 1 to 12 carbon atoms, more preferably 1 to 6 carbon atoms, and still more preferably has 1 to 4 carbon atoms. Specific examples thereof include a methyl group, an ethyl group, an n-propyl group, an i-propyl group, an n-butyl group, an i-butyl group, a sec-butyl group, a tert-butyl group, an n-pentyl group, a neopentyl group, an n-hexyl group, a thexyl group (2,3-dimethyl-2-butyl group), an n-heptyl group, an n-octyl group, a 2-ethylhexyl group, an n-nonyl group, an n-decyl group, and the like.

The cyclic alkyl group preferably has 3 to 12 carbon atoms, more preferably 4 to 8 carbon atoms, and still more preferably has 4 to 6 carbon atoms. Examples of the cyclic alkyl group include a cyclopropyl group, a cyclobutyl group, a cyclopentyl group, a cyclohexyl group, a cycloheptyl group, a cyclooptyl group, a norbornyl group, an isobornyl group, and the like.

The alkyl group may have a substituent and examples of the substituent include a halogen atom, an aryl group, and an alkoxy group. In a case in which the alkyl group has a halogen atom as the substituent, each of $R^{101}$, $R^{102}$, and $R^{103}$ becomes a haloalkyl group and, in a case in which the alkyl group has an aryl group as the substituent, each of $R^{101}$, $R^{102}$, and $R^{103}$ becomes an aralkyl group.

Examples of the halogen atom include a fluorine atom, a chlorine atom, a bromine atom, and an iodine atom and, among them, a fluorine atom or a chlorine atom is preferred.

The aryl group is preferably an aryl group having 6 to 20 carbon atoms and more preferably an aryl group having 6 to 12 carbon atoms. Specific examples thereof include a phenyl group, an α-methylphenyl group, a naphthyl group, and the like, and examples of the entire alkyl group substituted by an aryl group, that is, the aralkyl group include a benzyl group, an α-methylbenzyl group, a phenethyl group, a naphthylmethyl group, and the like.

The alkoxy group is preferably an alkoxy group having 1 to 6 carbon atoms and more preferably an alkoxy group having 1 to 4 carbon atoms, and a methoxy group or an ethoxy group is more preferred.

In a case in which the alkyl group is a cycloalkyl group, the cycloalkyl group may have a straight or branched alkyl group having 1 to 10 carbon atoms as the substituent and, in a case in which the alkyl group is a straight or branched alkyl group, the straight or branched alkyl group may have a cycloalkyl group having 3 to 12 carbon atoms as the substituent.

These substituents may be further substituted by the above-described substituent.

In General Formula (a1-10), in a case in which each of $R^{101}$, $R^{102}$, and $R^{103}$ represents an aryl group, the aryl group preferably has 6 to 12 carbon atoms and more preferably has 6 to 10 carbon atoms. The aryl group may have a substituent and preferable examples of the substituent include alkyl groups having 1 to 6 carbon atoms. Examples of the aryl group include a phenyl group, a tolyl group, a silyl group, a cumenyl group, a 1-naphtyl group, and the like.

In addition, $R^{101}$, $R^{102}$, and $R^{103}$ are bonded together and hydrogen atoms to which $R^{101}$, $R^{102}$, and $R^{103}$ are bonded are integrated together, whereby a ring can be formed. Examples of a ring structure obtained in a case in which $R^{101}$ and $R^{102}$, $R^{101}$ and $R^{103}$, or $R^{102}$ and $R^{103}$ are bonded together include a cyclobutyl group, a cyclopentyl group, a cyclohexyl group, a cycloheptyl group, a tetrahydrofuranyl group, an adamantyl group, a tetrahydropyranyl group, and the like.

In General Formula (a1-10), either or both $R^{101}$ and $R^{102}$ is preferably a hydrogen atom or a methyl group.

Preferable examples of an acetal ester structure of the phenolic hydroxyl group includes a case in which $R^{101}$ is a methyl group, $R^{102}$ is a hydrogen atom, and $R^{103}$ is an ethyl group, a case in which $R^{101}$ is a methyl group, $R^{102}$ is a hydrogen atom, $R^{103}$ is an ethyl group, and $R^{101}$ and $R^{103}$ are combined together so as to form a five-membered ring, a case in which each of $R^{101}$, $R^{102}$, and $R^{103}$ is a methyl group, and a case in which each of $R^{101}$ and $R^{102}$ is a methyl group and a case in which $R^{103}$ is a benzyl group.

Examples of a polymerizing monomer used to form the constituent unit that includes the protected phenolic hydroxyl group in which the phenolic hydroxyl group is protected in an acetal form include polymerizing monomers described in Paragraph [0042] of JP2011-215590A.

Among them, 1-alkoxyalkyl protectors of 4-hydroxyphenyl methacrylate and tetrahydropyranyl protectors of 4-hydroxyphenyl methacrylate are preferred from the viewpoint of transparency.

Specific examples of the acetal-protected group in the phenolic hydroxyl group include 1-alkoxyalkyl groups and examples thereof include 1-ethoxyethyl group, 1-methoxyethyl group, 1-n-butoxyethyl group, 1-isobutoxyethyl group, 1-(2-chloroethoxy)ethyl group, 1-(2-ethylhexyloxy)ethyl group, 1-n-propoxyethyl group, 1-cyclohexyloxyethyl group, 1-(2-cyclohexylethoxy)ethyl group, 1-benzyloxyethyl group, and the like. These 1-alkoxyalkyl groups can be singly used or a combination of two or more 1-alkoxyalkyl groups can be used.

As the polymerizing monomer used to form the constituent unit that includes the protected phenolic hydroxyl group protected by an acid-decomposable group, a commercially available polymerizing monomer may be used or a polymerizing monomer synthesized using a well-known method can also be used. The polymerizing monomer can be synthesized by reacting a compound having a phenolic hydroxyl group with a vinyl ether in the presence of an acid catalyst. In the above-described synthesis, it is also possible to copolymerize a monomer having a phenolic hydroxyl group with another monomer in advance and then react the monomer having a phenolic hydroxyl group with a vinyl ether in the presence of an acid catalyst.

Specific preferable examples of the constituent unit that includes a protected phenolic hydroxyl group protected by an acid-decomposable group include constituent units represented below, but the present invention is not limited thereto.

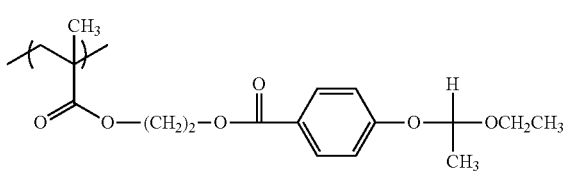

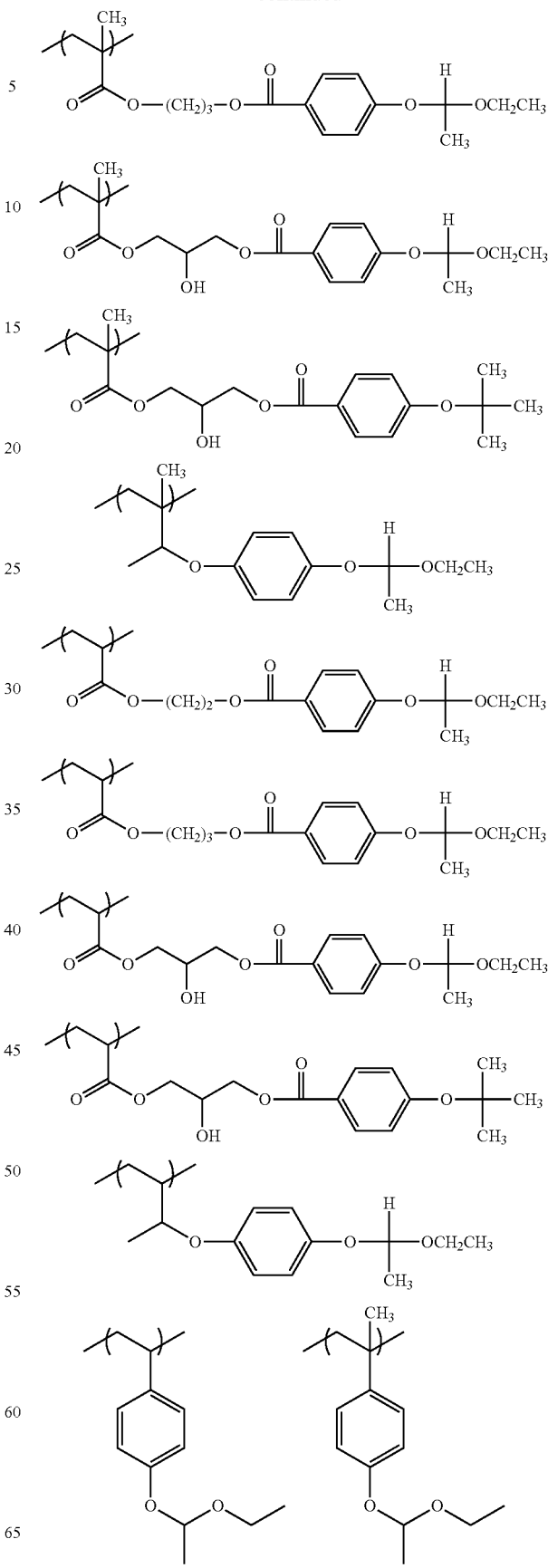

-continued

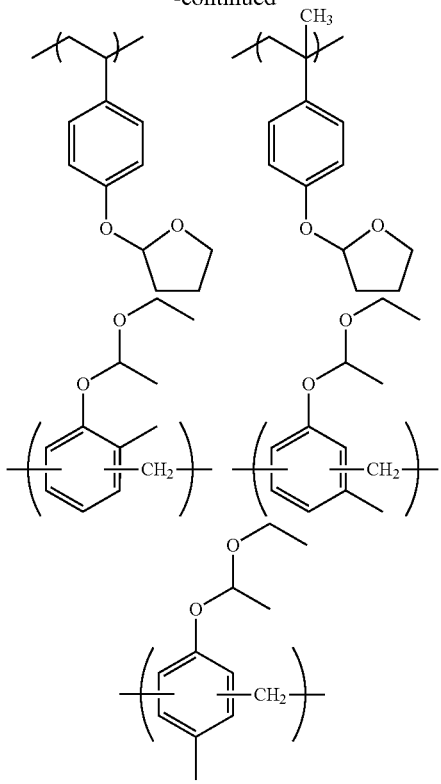

The copolymerization fraction of the constituent unit that includes a protected phenol group protected by an acid-decomposable group in the polymer having the constituent unit (a1) that includes a group in which an acid group is protected by an acid-decomposable group is preferably in a range of 10 mol % to 50 mol %, more preferably in a range of 20 mol % to 40 mol %, and particularly preferably in a range of 25 mol % to 40 mol % of the polymer having the constituent unit that includes a protected phenol group protected by an acid-decomposable group.

Under the condition that all of the polymer component (in a case in which the polymer component is a mixture of two or more polymers, all the polymers included) is decomposed in the constituent unit (monomer unit), the fraction of the constituent unit (a1) that includes a protected phenol group in which an acid group is protected by an acid-decomposable group is preferably in a range of 0 mol % to 40 mol %, more preferably in a range of 10 mol % to 35 mol %, and particularly preferably in a range of 15 mol % to 30 mol % in relation to the molar number of all the constituent unit.

<<<Constituent Unit that Includes Protected Carboxyl Group Protected by Acid-decomposable Group>>>

The constituent unit that includes a protected carboxyl group protected by an acid-decomposable group is a constituent unit that includes a protected carboxyl group in which a carboxyl group in the constituent unit that includes the carboxyl group is protected by an acid-decomposable group that will be described below in detail.

Regarding the constituent unit that includes a carboxyl group which can be used in the constituent unit that includes a protected carboxyl group protected by an acid-decomposable group, there is no particular limitation and a well-known constituent unit can be used. Examples thereof include a constituent unit (a1-1-1) derived from an unsaturated carboxylic acid or the like that includes at least one carboxyl group in the molecule such as an unsaturated monocarboxylic acid, an unsaturated dicarboxylic acid, or an unsaturated tricarboxylic acid and a constituent unit (a1-1-2) that includes both an ethylenic unsaturated group and an acid anhydride-derived structure.

Hereinafter, the constituent unit (a1-1-1) derived from an unsaturated carboxylic acid or the like that includes at least one carboxyl group in the molecule and the constituent unit (a1-1-2) that includes both an ethylenic unsaturated group and an acid anhydride-derived structure which can be used as the constituent unit that includes a carboxyl group will be sequentially and respectively described.

<<<<Constituent Unit (a1-1-1) Derived from Unsaturated Carboxylic Acid that Includes at Least One Carboxyl Group in Molecule>>>>

As an unsaturated carboxylic acid that can be used in the present invention as the constituent unit (a1-1-1) derived from an unsaturated carboxylic acid or the like that includes at least one carboxyl group in the molecule, it is possible to use acids listed below. That is, examples of the unsaturated monocarboxylic acid include acrylic acid, methacrylic acid, crotonic acid, α-chloroacrylic acid, cinnamic acid, 2-(meth)acryloyloxyethyl succinate, 2-(meth)acryloyloxyethyl hexahydrophthalate, 2-(meth)acryloyloxyethyl phthalate, and the like. Examples of the unsaturated dicarboxylic acid include maleic acid, fumaric acid, itaconic acid, citraconic acid, mesaconic acid, and the like. An unsaturated polyvalent carboxylic acid used to obtain the constituent unit that includes a carboxyl group may be an acid anhydride thereof. Specific examples thereof include maleic anhydride, itaconic anhydride, citraconic anhydride, and the like. The unsaturated polyvalent carboxylic acid may be a mono(2-methacryloyloxyalkyl) ester of a polyvalent carboxylic acid and examples thereof include mono(2-acryloyloxyethyl) succinate, mono(2-methacryloyloxyethyl) succinate, mono (2-acryloyloxyethyl) phthalate, mono(2-methacryloyloxyethyl) phthalate, and the like. The unsaturated polyvalent carboxylic acid may be a mono(meth)acrylate of both terminal dicarboxy polymers thereof and examples thereof include ω-carboxypolycaprolactone monoacrylate, ω-carboxypolycaprolactone monomethacrylate, and the like. In addition, as the unsaturated carboxylic acid, it is also possible to use acrylic acid-2-carboxyethyl ester, methacrylic acid-2-carboxyethyl ether, monoalkyl ester maleate, monoalkyl ester fumarate, 4-carboxystyrene, or the like.

Among them, from the viewpoint of development properties, acrylic acid, methacrylic acid, 2-(meth)acryloyloxyethyl succinate, 2-(meth)acryloyloxyethyl hexahydro phthalate, 2-(meth)acryloyloxyethyl phthalate, or an anhydride or the like of an unsaturated polyvalent carboxylic acid is preferably used and acrylic acid, methacrylic acid, or 2-(meth)acryloyloxyethyl hexahydro phthalate is more preferably used to form the constituent unit (a1-1-1) derived from an unsaturated carboxylic acid that includes at least one carboxyl group in the molecule.

The constituent unit (a1-1-1) derived from an unsaturated carboxylic acid that includes at least one carboxyl group in the molecule may be made up of one acid alone or may be made up of two or more acids.

<<<<Constituent Unit (a1-1-2) that Includes Both Ethylenic Unsaturated Group and Acid Anhydride-Derived Structure>>>>

The constituent unit (a1-1-2) that includes both an ethylenic unsaturated group and an acid anhydride-derived structure is preferably a unit derived from a monomer obtained by reacting a hydroxyl group present in a constituent unit that includes an ethylenic unsaturated group and an acid anhydride.

As the acid anhydride, a well-known acid anhydride can be used and specific examples thereof include dibasic acid anhydrides such as maleic anhydride, succinic anhydride, itaconic anhydride, phthalic anhydride, tetrahydrophthalic acid anhydride, hexahydrophthalic acid anhydride, and chlorendic anhydride; and acid anhydrides such as trimellitic anhydride, pyromellitic anhydride, benzophenonetetracarboxylic anhydride and biphenyltetracarboxylic anhydride. Among them, from the viewpoint of development properties, phthalic anhydride, tetrahydrophthalic acid anhydride, or succinic anhydride is preferred.

From the viewpoint of development properties, the reaction ratio of the acid anhydride in relation to the hydroxyl group is preferably in a range of 10 mol % to 100 mol % and more preferably in a range of 30 mol % to 100 mol %.

As the acid-decomposable group that can be used in the constituent unit that includes a protected carboxyl group protected by an acid-decomposable group, it is possible to use the above-described constituent unit that includes a protected phenol group protected by the acid-decomposable group.

Among them, the acid-decomposable group is preferably a protected carboxyl group in which a carboxyl group is protected in an acetal form from the viewpoint of the basic properties of the photosensitive resin composition, particularly, sensitivity, pattern shape, the formability of contact holes, and the preservation stability of the photosensitive resin composition. Furthermore, among the above-described acid-decomposable groups, a protected carboxyl group in which a carboxyl group is protected in an acetal form represented by General Formula (a1-10) is more preferred from the viewpoint of sensitivity. In a case in which the carboxyl group is the protected carboxyl group in which a carboxyl group is protected in an acetal form represented by General Formula (a1-10), the protected carboxyl group, as a whole, forms a structure of $-(C=O)-O-CR^{101}R^{102}(OR^{103})$.

As the polymerizing monomer used to form the constituent unit that includes the protected carboxyl group represented by General Formula (a1-10), a commercially available polymerizing monomer may be used or a polymerizing monomer synthesized using a well-known method can also be used. The polymerizing monomer can be synthesized using the synthesis method described in Paragraphs [0037] to [0040] in JP2011-221494A.

Among constituent units that include the protected carboxyl group protected by an acid-decomposable group, a constituent unit represented by General Formula (A2') is preferred from the viewpoint of increasing the sensitivity.

General Formula (A2')

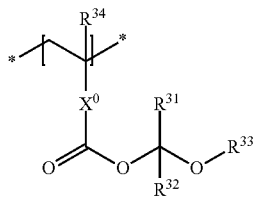

(In General Formula (A2'), each of $R^{31}$ and $R^{32}$ independently represents a hydrogen atom, an alkyl group, or an aryl group, either or both $R^{31}$ and $R^{32}$ is an alkyl group or an aryl group, $R^{33}$ represents an alkyl group or an aryl group, $R^{31}$ or $R^{32}$ and $R^{33}$ may be combined together so as to form a cyclic ether, $R^{34}$ represents a hydrogen atom or a methyl group, and $X^0$ represents a single bond or an arylene group.)

In General Formula (A2'), in a case in which each of $R^{31}$ and $R^{32}$ is an alkyl group, the alkyl group preferably has 1 to 10 carbon atoms. In a case in which each of $R^{31}$ and $R^{32}$ is an aryl group, a phenyl group is preferred. Each of $R^{31}$ and $R^{32}$ is preferably a hydrogen atom or an alkyl group having 1 to 4 carbon atoms.

In General Formula (A2'), $R^{33}$ represents an alkyl group or an aryl group, is preferably an alkyl group having 1 to 10 carbon atoms, and is more preferably an alkyl group having 1 to 6 carbon atoms.

In General Formula (A2'), $R^{31}$ or $R^{32}$ and $R^{33}$ may be combined together so as to form a cyclic ether. $R^{31}$ or $R^{32}$ and $R^{33}$ are preferably combined together so as to form a cyclic ether. The number of ring members in the cyclic ether is not particularly limited, but is preferably 5 or 6 and more preferably 5.

In General Formula (A2'), $R^{34}$ represents a hydrogen atom or a methyl group and is preferably a hydrogen atom.

In General Formula (A2'), $X^0$ represents a single bond or an arylene group and is preferably a single bond.

Among constituent units constituent units represented by General Formula (A2'), a constituent unit represented by General Formula (A2") is more preferred from the viewpoint of increasing the sensitivity.

General Formula (A2")

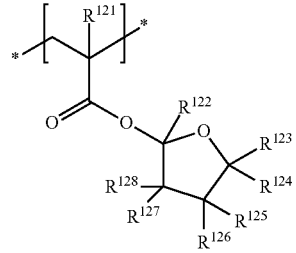

(In the formula, $R^{121}$ represents a hydrogen atom or an alkyl group having 1 to 4 carbon atoms and each of $R^{122}$ to $R^{128}$ independently represents a hydrogen atom or an alkyl group having 1 to 4 carbon atoms. In General Formula (A2"), $R^{121}$ is preferably a hydrogen atom or a methyl group. In General Formula (A2"), each of $R^{122}$ to $R^{128}$ is preferably a hydrogen atom.)

Specific preferable examples of the constituent unit that includes the protected carboxyl group protected by an acid-decomposable group include constituent units represented below. R represents a hydrogen atom or a methyl group.

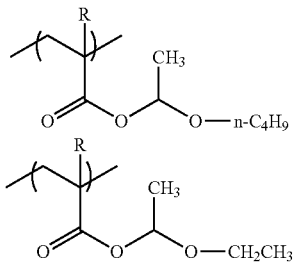

-continued

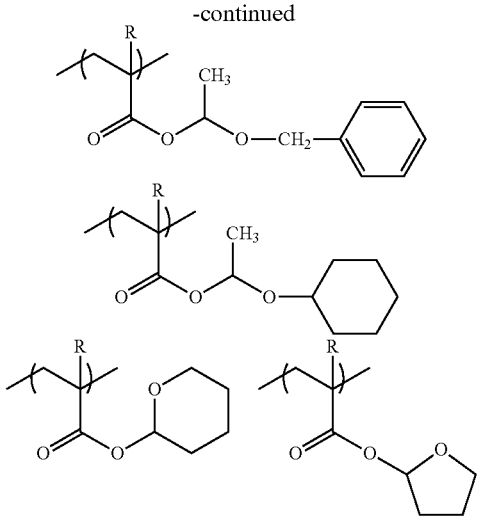

The copolymerization fraction of the constituent unit that includes the protected carboxyl group protected by an acid-decomposable group in the polymer having the constituent unit (a1) that includes a group in which an acid group is protected by an acid-decomposable group is preferably in a range of 5 mol % to 60 mol %, more preferably in a range of 10 mol % to 50 mol %, and particularly preferably in a range of 30 mol % to 50 mol % of the polymer having the constituent unit that includes the protected carboxyl group protected by an acid-decomposable group.

Under the condition that all of the polymer component is decomposed in the constituent unit (monomer unit), the fraction of the constituent unit (a1) that includes the protected carboxyl group in which an acid group is protected by an acid-decomposable group is preferably in a range of 0 mol % to 60 mol %, more preferably in a range of 10 mol % to 50 mol %, and particularly preferably in a range of 15 mol % to 25 mol % of the molar number of all the constituent units.

<<Other Constituent Units>>

The component (A) of the photosensitive resin composition layer may include another constituent unit (a3) in addition to the constituent unit (a1) that includes a group in which an acid group is protected by an acid-decomposable group. The constituent unit (a3) may include a polymer used in the polymer component (A), that is, a polymer having the constituent unit (a1) that includes a group in which an acid group is protected by an acid-decomposable group as a copolymerization component. In addition, separately from the polymer having the constituent unit (a1) that includes a group in which an acid group is protected by an acid-decomposable group which is used in the polymer component (A), a polymer which does not substantially have the constituent unit (a1) that includes a group in which an acid group is protected by an acid-decomposable group and has a different constituent unit may include the constituent unit (a3).

Regarding a monomer that serves as the constituent unit (a3), there is no particular limitation except for the fact that the monomer needs to prevent the photosensitive resin composition from forming an ethylenic crosslinking structure, and the monomer that serves as the constituent unit (a3) is preferably a monomer having only one polymerizable group (or crosslinking group), that is, not a monomer containing two or more crosslinking groups. Examples of the monomer that serves as the constituent unit (a3) include styrenes, (meth)acrylic acid alkyl esters, (meth)acrylic acid cyclic alkyl esters, (meth)acrylic acid aryl esters, unsaturated dicarboxylic acid diesters, bicyclo unsaturated compounds, maleimide compounds, unsaturated aromatic compounds, conjugated diene-based compounds, unsaturated monocarboxylic acids, unsaturated dicarboxylic acids, unsaturated dicarboxylic acid anhydrides, and other unsaturated compounds. In addition, the component (A) may include a constituent unit that includes an acid group as described below.

The monomer that serves as the constituent unit (a3) can be singly used or a combination of two or more monomers can be used.

Specific examples of the constituent unit (a3) include constituent units made of styrene, tert-butoxystyrene, methylstyrene, hydroxystyrene, α-methylstyrene, acetoxystyrene, methoxystyrene, ethoxystyrene, chlorostyrene, vinyl methyl benzoate, vinyl ethyl benzoate, 4-hydroxy benzoic acid (3-methacryloyloxypropyl) ester, (meth)acrylic acid, methyl (meth)acrylate, ethyl (meth)acrylate, n-propyl (meth)acrylate, isopropyl (meth)acrylate, 2-hydroxyethyl (meth)acrylate, 2-hydroxypropyl (meth)acrylate, benzyl (meth)acrylate, isobornyl (meth)acrylate, acrylonitrile, or ethylene glycol monoacetoacetate mono(meth)acrylate. Additionally, examples thereof include the compounds described in Paragraphs [0021] to [0024] in JP2004-264623A.

The constituent unit (a3) is preferably styrene or a group having an aliphatic cyclic skeleton from the viewpoint of electrical characteristics. Specific examples thereof include styrene, tert-butoxystyrene, methylstyrene, hydroxystyrene, α-methylstyrene, dicyclopentanyl (meth)acrylates, cyclohexyl (meth)acrylates, isobornyl (meth)acrylates, benzyl (meth)acrylates, and the like.

The constituent unit (a3) is preferably (meth)acrylic acid alkyl ester from the viewpoint of adhesiveness. Specific examples thereof include methyl (meth)acrylates, ethyl (meth)acrylates, propyl (meth)acrylates, n-butyl (meth)acrylates, and the like, and methyl (meth)acrylates are more preferred.

The content fraction of the constituent unit (a3) in the constituent units that constituent the polymer having the constituent unit (a1) that includes a group in which an acid group is protected by an acid-decomposable group is preferably 60 mol % or less, more preferably 50 mol % or less, and still more preferably 40 mol % or less. The lower limit value may be 0 mol % but it is possible to set the lower limit value to, for example, 1 mol % or more and, furthermore, 5 mol % or more. When the content fraction is within the above-described numerical range, a variety of characteristics of a hardened film obtained from the photosensitive resin composition become favorable.

The component (A) of the photosensitive resin composition layer preferably includes a constituent unit that includes an acid group as the constituent unit (a3). The inclusion of a constituent unit that includes an acid group makes the photosensitive resin composition layer easily soluble in an alkaline developer and the effects of the present invention are more effectively exhibited. The acid group in the present invention refers to a proton-dissociable group having a pKa of 10 or less. Generally, the acid group is incorporated into the polymer as the constituent unit that includes the acid group using a monomer capable of forming the acid group. When a constituent unit that includes the above-described acid group is included in the polymer, there is a tendency that the photosensitive resin composition layer becomes easily soluble in an alkaline developer.

Examples of the acid group in the constituent unit that includes an acid group which is used as the constituent unit include constituent units derived from a carboxylic acid group, constituent units derived from a sulfonamide group, constituent units derived from a phosphoric acid group, constituent units derived from a sulfonic acid group, constituent units derived from a phenolic hydroxyl group, sulfonamide group, sulfonylimide group, and the like, and constituent units derived from a carboxylic acid group and/or constituent units derived from a phenolic hydroxyl group are preferred.

The constituent unit that includes an acid group used as the constituent unit is more preferably a constituent unit obtained by substituting a constituent unit derived from styrene or a constituent unit derived from a vinyl compound by the acid group or a constituent unit derived from a (meth)acrylic acid.

The component (A) of the photosensitive resin composition layer also preferably includes a constituent unit that includes an ester of the acid group from the viewpoint of optimizing solubility in developers and the physical properties of films.

In the present invention, particularly, the component (A) of the photosensitive resin composition layer preferably includes a constituent unit that includes a carboxyl group or a constituent unit that includes a phenolic hydroxyl group as the constituent unit (a3) from the viewpoint of sensitivity.

The polymer having the constituent unit that includes a protected phenol group protected by an acid-decomposable group as the constituent unit (a1) that includes a group in which the acid group is protected by an acid-decomposable group preferably includes a constituent unit derived from a phenolic hydroxyl group as the copolymerization component, more preferably includes a constituent unit derived from hydroxystyrene or α-methyl hydroxystyrene as the copolymerization component, and particularly preferably includes a constituent unit derived from hydroxystyrene as the copolymerization component even in the constituent unit (a3).

The copolymerization fraction of the constituent unit that includes the acid group in the polymer having the constituent unit that includes a protected phenol group protected by an acid-decomposable group is preferably in a range of 50 mol % to 90 mol % and more preferably in a range of 60 mol % to 75 mol % of the polymer having the constituent unit that includes a protected phenol group protected by an acid-decomposable group in a case in which the acid group is a phenolic acid group.

In a case in which the acid group is a carboxylic acid group, the copolymerization fraction is preferably in a range of 0 mol % to 30 mol % and more preferably in a range of 5 mol % to 10 mol % of the polymer having the constituent unit that includes a protected phenol group protected by an acid-decomposable group.

The copolymerization fraction of the constituent unit that includes an ester of the acid group in the polymer having the constituent unit that includes a protected phenol group protected by an acid-decomposable group is preferably in a range of 0 mol % to 30 mol %, more preferably in a range of 0 mol % to 10 mol %, and particularly preferably 0 mol % of the polymer having the constituent unit that includes a protected phenol group protected by an acid-decomposable group.

The polymer having the constituent unit that includes a protected carboxyl group protected by an acid-decomposable group as the constituent unit (a1) that includes a group in which an acid group is protected by an acid-decomposable group preferably includes a constituent unit derived from a carboxylic acid group and/or an ester thereof as the copolymerization component and more preferably includes a constituent unit derived from (meth)acrylic acid, benzyl (meth)acrylate, or 2-hydroxyethyl (meth)acrylate as the copolymerization component even in the constituent unit (a3).

The copolymerization fraction of the constituent unit that includes the acid group in the polymer having the constituent unit that includes a protected carboxyl group protected by an acid-decomposable group is preferably in a range of 50 mol % to 90 mol % and more preferably in a range of 60 mol % to 75 mol % of the polymer having the constituent unit that includes a protected carboxyl group protected by an acid-decomposable group in a case in which the acid group is a phenolic acid group.

In a case in which the acid group is a carboxylic acid group, the copolymerization fraction is preferably in a range of 0 mol % to 30 mol % and more preferably in a range of 5 mol % to 10 mol % of the polymer having the constituent unit that includes a protected carboxyl group protected by an acid-decomposable group.

The copolymerization fraction of the constituent unit that includes an ester of the acid group in the polymer having the constituent unit that includes a protected carboxyl group protected by an acid-decomposable group is preferably in a range of 10 mol % to 80 mol %, more preferably in a range of 30 mol % to 70 mol %, and particularly preferably in a range of 40 mol % to 60 mol % of the polymer having the constituent unit that includes a protected carboxyl group protected by an acid-decomposable group.

<Preferred Embodiments of Polymer Component>

Compared with the constituent unit that includes a protected phenolic hydroxyl group protected by an acid-decomposable group, the constituent unit that includes a protected carboxyl group protected by an acid-decomposable group has a characteristic of rapid development. Therefore, in a case in which it is necessary to rapidly develop the photosensitive resin composition layer after exposure, the constituent unit that includes a protected carboxyl group protected by an acid-decomposable group is preferred. Conversely, in a case in which slow development is required, the constituent unit that includes a protected phenolic hydroxyl group protected by an acid-decomposable group is preferably used.

In the photosensitive transfer material of the present invention, the number of the polymers having the constituent unit (a1) that includes a group in which an acid group is protected by an acid-decomposable group in the polymer component (A) may be one or more. The photosensitive transfer material of the present invention preferably includes two or more polymers having the constituent unit (a1) that includes a group in which an acid group is protected by an acid-decomposable group as the polymer component. Among them, the photosensitive transfer material of the present invention more preferably includes a polymer having the constituent unit that includes a protected phenolic hydroxyl group protected by an acid-decomposable group and a polymer having the constituent unit that includes a protected carboxyl group protected by an acid-decomposable group as the polymer component.

In the photosensitive transfer material of the present invention, the photosensitive resin composition layer particularly preferably includes two or more polymers having the constituent unit (a1) that includes a group in which an acid group is protected by an acid-decomposable group as the polymer component and includes a polymer having the constituent unit represented by General Formula (A2') as the polymer having the constituent unit (a1) that includes a group in which an acid group is protected by an acid-decomposable group from the viewpoint of increasing sensitivity.

The photosensitive resin composition layer particularly preferably includes two or more polymers having the constituent unit (a1) that includes a group in which an acid group is protected by an acid-decomposable group as the polymer component and includes either or both a polymer having the constituent unit represented by General Formula (A1) and a polymer having the constituent unit represented by General Formula (A1') as the polymer having the constituent unit (a1) that includes a group in which an acid group is protected by an acid-decomposable group and a polymer having the constituent unit represented by General Formula (A2') from the viewpoint of increasing sensitivity and resolution.

In a case in which the photosensitive resin composition layer particularly preferably includes two or more polymers having the constituent unit (a1) that includes a group in which an acid group is protected by an acid-decomposable group as the polymer component, the ratio between the polymer having the constituent unit that includes a protected phenolic hydroxyl group protected by an acid-decomposable group and the polymer having the constituent unit that includes a protected carboxyl group protected by an acid-decomposable group is preferably in a range of 10:90 to 100:0, more preferably in a range of 30:70 to 60:40, and particularly preferably 1:1 in terms of mass ratio.

<<Molecular Weight of Polymer Having Constituent Unit (a1) that Includes Group in which Acid Group is Protected by Acid-Decomposable Group>>

The molecular weight of the polymer having the constituent unit (a1) that includes a group in which an acid group is protected by an acid-decomposable group is preferably in a range of 1,000 to 200,000 and more preferably in a range of 2,000 to 50,000 in terms of polystyrene-equivalent weight-average molecular weight. When the molecular weight is within the above-described range, a variety of characteristics are favorable.

The ratio (dispersity) between the number-average molecular weight and the weight-average molecular weight is preferably in a range of 1.0 to 5.0 and more preferably in a range of 1.05 to 3.5.

<<Polymer Component (A) Manufacturing Method>>

Regarding the component (A) synthesis method, there are a variety of known methods; however, as an example, the component (A) can be synthesized by polymerizing a polymerizing monomer mixture including at least polymerizing monomers used to form the constituent units represented by (a1) and (a3) in an organic solvent using a polymerization initiator. In addition, the component (A) can also be synthesized using a so-called macromolecular reaction.

In the photosensitive resin composition layer, the fraction of the component (A) is preferably in a range of 50 parts by mass to 99.9 parts by mass and more preferably in a range of 70 parts by mass to 98 parts by mass in relation to 100 parts by mass of the total solid content.

<<Other Polymer Components>>

Separately from the polymer having the constituent unit (a1) that includes a group in which an acid group is protected by an acid-decomposable group which is used in the polymer component (A), a polymer which does not substantially have the constituent unit (a1) that includes a group in which an acid group is protected by an acid-decomposable group and has a different constituent unit may be included. In a case in which a polymer which does not substantially have the constituent unit (a1) that includes a group in which an acid group is protected by an acid-decomposable group and has a different constituent unit is included separately from the polymer used in the polymer component (A), the formulation amount of the polymer is preferably 60% by mass or less, more preferably 40% by mass or less, and still more preferably 20% by mass or less in the total polymer components.

The number of the polymers which do not substantially have the constituent unit (a1) and has the constituent unit (a3) in the photosensitive resin composition layer may be one or more.

The polymers which do not substantially have the constituent unit (a1) and has the constituent unit (a3) are preferably polymers which do not have an ethylenic crosslinking group, and, as the polymers which do not have an ethylenic crosslinking group, for example, polyhydroxystyrene, can be used, and commercially available products such as SMA 1000P, SMA 2000P, SMA 3000P, SMA 1440F, SMA 17352P, SMA 2625P, SMA 3840F (manufactured by Sartomer Company, Inc.), ARUFON UC-3000, ARUFON UC-3510, ARUFON UC-3900, ARUFON UC-3910, ARUFON UC-3920, ARUFON UC-3080 (manufactured by Toagosei Company, Limited), Joncryl 690, Joncryl 678, Joncryl 67, and Joncryl 586 (manufactured by BASF) can be used.

Meanwhile, in the photosensitive resin composition, the content of the polymer having an ethylenic crosslinking group as the polymer which does not include the constituent unit (a1) but has a different constituent unit (a3) is preferably less than 0.1% by mass and more preferably less than 0.01% by mass since the photosensitive resin composition is prevented from forming an ethylenic crosslinking structure.

<Component B: Photoacid Generator>

The photosensitive resin composition layer includes the photoacid generator (B).

The photoacid generator (B) (also referred to as "component (B)") used in the present invention is a compound capable of generating an acid when irradiated with a radioactive ray such as an ultraviolet ray, a far-ultraviolet ray, an X-ray, or charged particle radiation. The photoacid generator (B) used in the present invention is preferably a compound which responds to an active light ray having a wavelength of 300 nm or longer and preferably in a range of 300 nm to 450 nm and generates an acid, but is not limited by the chemical structure thereof. In addition, even a photoacid generator which does not directly respond to an active light ray having a wavelength of 300 nm or longer can be preferably used in combination with a sensitizer as long as the photoacid generator responds to an active light ray having a wavelength of 300 nm or longer and generates an acid when jointly used with a sensitizer. The value of pKa of an acid generated by the irradiation of a radioactive ray is preferably 4.0 or less and more preferably 3.0 or less. The lower limit value is not particularly specified, but can be set to, for example, −10.0 or more.

Examples of the photoacid generator (B) include ionic photoacid generators and non-ionic photoacid generators.

Examples of the non-ionic photoacid generator include trichloromethyl-s-triazines, diazomethane compounds, imide sulfonate compounds, oxime sulfonate compounds, and the like. Among them, the photosensitive transfer material of the present invention preferably includes an oxime sulfonate compound as the photoacid generator (B) from the viewpoint of insulating properties. The photoacid generators can be singly used or a combination of two or more photoacid generators can be used. Specific examples of the trichloromethyl-s-triazines and the diazomethane compounds include the compounds described in Paragraphs [0083] to [0088] in JP2011-221494A.

Preferable examples of the oxime sulfonate compounds, that is, compounds having an oxime sulfonate structure include compounds having an oxime sulfonate structure represented by General Formula (B1) represented below, and the content thereof is incorporated into the present specification.

GENERAL FORMULA (B1)

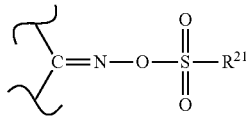

(In General Formula (B1), $R^{21}$ represents an alkyl group or an aryl group. The wavy line indicates a bond with a different group.)

Any groups may be substituted and the alkyl group in $R^{21}$ may be a straight alkyl group or a branched alkyl group.

The alkyl group as $R^{21}$ is preferably a straight or branched alkyl group having 1 to 10 carbon atoms. The alkyl group in $R^{21}$ may be substituted by an aryl group having 6 to 11 carbon atoms, an alkoxy group having 1 to 10 carbon atoms, or a cycloalkyl group (including a bridged alicyclic group such as a 7,7-dimethyl-2-oxonorbornyl group, and being preferably a bicycloalkyl group or the like).

The aryl group in $R^{21}$ is preferably an aryl group having 6 to 11 carbon atoms and more preferably a phenyl group or a naphthyl group. The aryl group in $R^{21}$ may be substituted by a lower alcohol group, an alkoxy group, or a halogen atom.

The compound having the oxime sulfonate structure represented by General Formula (B1) is also preferably an oxime sulfonate compound represented by General Formula (B2).

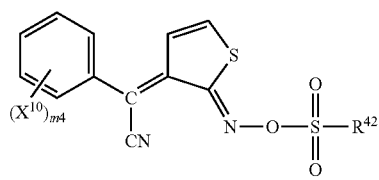

(In Formula (B2), $R^{42}$ represents an alkyl group or an aryl group, $X^{10}$ represents an alkyl group, an alkoxy group, or a halogen atom, m4 represents an integer of 0 to 3, and, when m4 is 2 or 3, a plurality of $X^{10}$ may be identical to or different from each other.)

The alkyl group as $X^{10}$ is preferably a straight or branched alkyl group having 1 to 4 carbon atoms.

The alkoxy group as $X^{10}$s is preferably a straight or branched alkoxy group having 1 to 4 carbon atoms.

The halogen atom as $X^{10}$ is preferably a chlorine atom or a fluorine atom. m4 is preferably 0 or 1. A compound represented by General Formula (B2) in which m4 is 1, $X^{10}$ is a methyl group, the substation position of $X^{10}$ is the ortho position, and $R^{42}$ is a straight alkyl group having 1 to 10 carbon atoms, a 7,7-dimethyl-2-oxonorbornyl methyl group, or a p-tolyl group is particularly preferred.

The compound having the oxime sulfonate structure represented by General Formula (B1) is also preferably an oxime sulfonate compound represented by General Formula (B3).

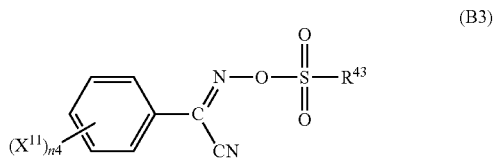

(In Formula (B3), $R^{43}$ is identical to $R^{42}$ in Formula (B2), $X^{11}$ represents a halogen atom, a hydroxyl group, an alkyl group having 1 to 4 carbon atoms, an alkoxy group having 1 to 4 carbon atoms, a cyano group, or a nitro group, and n4 represents an integer of 0 to 5.)

$R^{43}$ in General Formula (B3) is preferably a methyl group, an ethyl group, an n-propyl group, an n-butyl group an n-octyl group, a trifluoromethyl group, a pentafluoroethyl group, a perfluoro-n-propyl group, a perfluoro-n-butyl group, a p-tolyl group, 4-chlorophenyl group, or a pentafluorophenyl group and particularly preferably an n-octyl group.

$X^{11}$ is preferably an alkoxy group having 1 to 5 carbon atoms and more preferably a methoxy group.

n4 is preferably in a range of 0 to 2 and particularly preferably in a range of 0 or 1.

Specific examples of the compound represented by General Formula (B3) include α-(methylsulfonyloxyimino) benzyl cyanide, α-(ethylsulfonyloxyimino) benzyl cyanide, α-(n-propylsulfonyloxyimino) benzyl cyanide, α-(n-butylsulfonyloxyimino) benzyl cyanide, α-(4-toluenesulfonyloxyimino) benzyl cyanide, α-[(methylsulfonyloxyimino)-4-methoxyphenyl]acetonitrile, α-[(ethyl-sulfonyloxyimino)-4-methoxyphenyl]acetonitrile, α-[(n-propylsulfonyloxyimino)-4-methoxyphenyl]acetonitrile, α-[(n-butylsulfonyloxyimino)-4-methoxyphenyl]acetonitrile, and α-[(4-toluenesulfonyloxyimino)-4-methoxyphenyl]acetonitrile.

Specific examples of preferred oxime sulfonate compounds include compounds (i) to (viii) represented below and the oxime sulfonate compound can be singly used or two or more oxime sulfonate compounds can be jointly used. The compounds (i) to (viii) can be procured from commercially available products. In addition, the compounds (i) to (viii) can also be used in combination with a different photoacid generator (B).

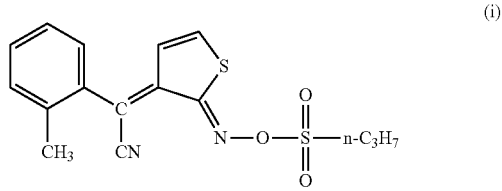

-continued (ii)
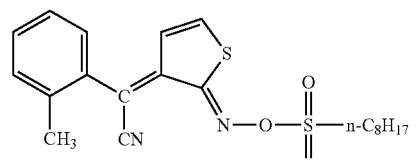

(iii)
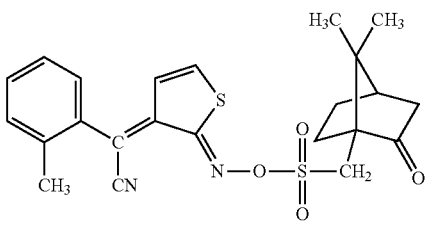

(iv)
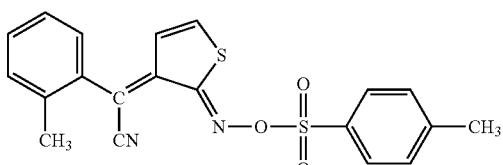

(v)
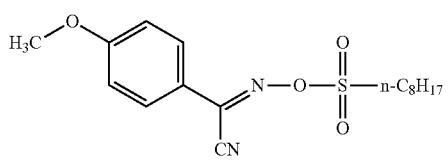

(vi)
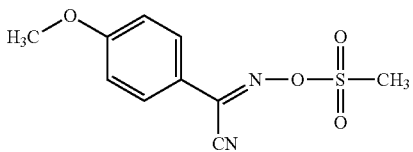

(vii)
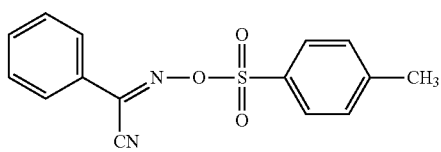

(viii)
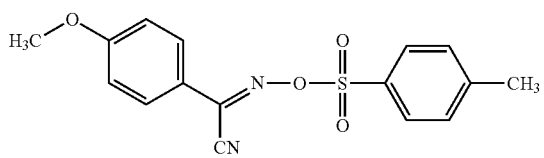

The compound having the oxime sulfonate structure represented by General Formula (B1) is also preferably an oxime sulfonate compound represented by General Formula (OS-1).

General Formula (OS-1)

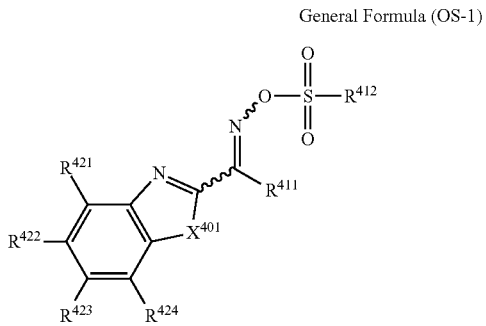

In General Formula (OS-1), $R^{411}$ represents a hydrogen atom, an alkyl group, an alkenyl group, an alkoxy group, an alkoxycarbonyl group, an acyl group, a carbamoyl group, a sulfamoyl group, a sulfo group, a cyano group, an aryl group, or a heteroaryl group. $R^{412}$ represents an alkyl group or an aryl group.

$X^{401}$ represents —O—, —S—, —NH—, —NR$^{415}$—, —CH$_2$—, —CR$^{416}$H—, or —CR$^{415}$R$^{417}$— and each of $R^{415}$ to $R^{417}$ represents an alkyl group or an aryl group.

Each of $R^{421}$ to $R^{424}$ independently represents a hydrogen atom, a halogen atom, an alkyl group, an alkenyl group, an alkoxy group, an amino group, an alkoxycarbonyl group, an alkylcarbonyl group, an arylcarbonyl group, an amide group, a sulfo group, a cyano group, or an aryl group. Two of $R^{421}$ to $R^{424}$ may be bonded together so as to form a ring.

Each of $R^{421}$ to $R^{424}$ is preferably a hydrogen atom, a halogen atom, or an alkyl group and an aspect in which two of $R^{421}$ to $R^{424}$ are bonded together so as to form an aryl group is also preferred. Furthermore, an aspect in which all of $R^{421}$ to $R^{424}$ are hydrogen atoms is preferred from the viewpoint of sensitivity.

The above-described functional groups may further have a substituent.

The compound represented by General Formula (OS-1) is more preferably a compound represented by General Formula (OS-2).

General Formula (OS-2)

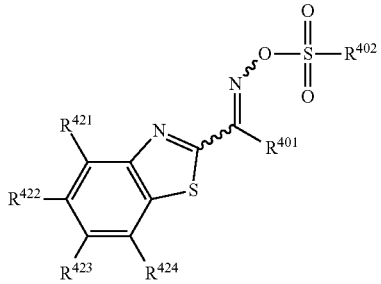

In General Formula (OS-2), $R^{401}$, $R^{402}$, and $R^{421}$ to $R^{424}$ are respectively identical to $R^{411}$, $R^{412}$, and $R^{421}$ to $R^{424}$ in General Formula (OS-1) and preferable examples thereof are also identical to those in General Formula (OS-1).

Among them, $R^{401}$ is more preferably a cyano group or an aryl group in both General Formula (OS-1) and General Formula (OS-2) and an aspect represented by General Formula (OS-2) in which $R^{401}$ is a cyano group, a phenyl group, or a naphthyl group is most preferred.

Regarding the steric structures (E, Z, and the like) of an oxime or benzothiazole ring in the oxime sulfonate compound, the oxime sulfonate compound may have any one of those steric structures or a mixture thereof.

Specific examples of the compound represented by General Formula (OS-1) that can be preferably used in the present invention include the compounds (exemplary compounds b-1 to b-34) described in Paragraphs [0128] to [0132] in JP2011-221494A, but the present invention is not limited thereto.

In the present invention, the compound having the oxime sulfonate structure represented by General Formula (B1) is preferably an oxime sulfonate compound represented by General Formula (OS-3), General Formula (OS-4), or General Formula (OS-5).

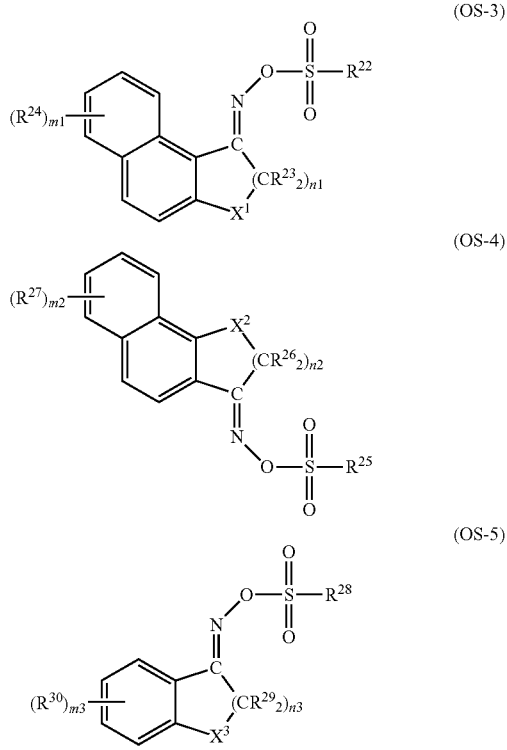

(In General Formulae (OS-3) to (OS-5), each of $R^{22}$, $R^{25}$, and $R^{28}$ independently represents an alkyl group, an aryl group, or a heteroaryl group, each of $R^{23}$, $R^{26}$, and $R^{29}$ independently represents a hydrogen atom, an alkyl group, an aryl group, or a halogen atom, each of $R^{24}$, $R^{27}$, and $R^{30}$ independently represents a halogen atom, an alkyl group, an alkyloxy group, a sulfonic acid group, an aminosulfonyl group, or an alkoxysulfonyl group, each of $X^1$ to $X^3$ independently represents an oxygen atom or a sulfur atom, each of n1 to n3 independently represents 1 or 2, and each of m1 to m3 independently represents an integer of 0 to 6.)

In General Formulae (OS-3) to (OS-5), the alkyl group, the aryl group, or the heteroaryl group as $R^{22}$, $R^{25}$, and $R^{28}$ may have a substituent.

In General Formulae (OS-3) to (OS-5), the alkyl group as $R^{22}$, $R^{25}$, and $R^{28}$ is preferably an alkyl group having a total of 1 to 30 carbon atoms which may have a substituent.

In General Formulae (OS-3) to (OS-5), the aryl group as $R^{22}$, $R^{25}$, and $R^{28}$ is preferably an aryl group having a total of 6 to 30 carbon atoms which may have a substituent.

In General Formulae (OS-3) to (OS-5), the heteroaryl group as $R^{22}$, $R^{25}$, and $R^{28}$ is preferably a heteroaryl group having a total of 4 to 30 carbon atoms which may have a substituent.

In General Formulae (OS-3) to (OS-5), in the heteroaryl group as $R^{22}$, $R^{25}$, and $R^{28}$, at least one ring needs to be a heteroaromatic ring and, for example, a heteroaromatic ring and a benzene ring may be condensed together.

In General Formulae (OS-3) to (OS-5), each of $R^{23}$, $R^{26}$, and $R^{29}$ is preferably a hydrogen atom, an alkyl group, or an aryl group and more preferably a hydrogen atom or an alkyl group.

In General Formulae (OS-3) to (OS-5), out of two or more of $R^{23}$, $R^{26}$, and $R^{29}$ that are present in the compound, one or two is preferably an alkyl group, an aryl group, or a halogen atom, one is more preferably an alkyl group, an aryl group, or a halogen atom, and it is particularly preferable that one is an alkyl group and the remainder is a hydrogen atom.

The alkyl group as $R^{23}$, $R^{26}$, and $R^{29}$ is preferably an alkyl group having a total of 1 to 12 carbon atoms which may have a substituent and more preferably an alkyl group having a total of 1 to 6 carbon atoms which may have a substituent.

The aryl group as $R^{23}$, $R^{26}$, and $R^{29}$ is preferably an aryl group having a total of 6 to 30 carbon atoms which may have a substituent.

In General Formulae (OS-3) to (OS-5), each of $X^1$ to $X^3$ independently represents O or S and is preferably O.

In General Formulae (OS-3) to (OS-5), a ring including $X^1$ to $X^3$ as ring members is a five-membered ring or a six-membered ring.

In General Formulae (OS-3) to (OS-5), each of $n^1$ to $n^3$ independently represents 1 or 2. In a case in which each of $X^1$ to $X^3$ is O, each of n1 to n3 is preferably independently 1 and, in a case in which each of $X^1$ to $X^3$ is S, each of n1 to n3 is preferably independently 2.

In General Formulae (OS-3) to (OS-5), each of $R^{24}$, $R^{27}$, and $R^{30}$ independently represents a halogen atom, an alkyl group, an alkyloxy group, a sulfonic acid group, an aminosulfonyl group, or an alkoxysulfonyl group. Among them, each of $R^2$, $R^{27}$, and $R^{30}$ is preferably independently an alkyl group or an alkyloxy group.

The alkyl group, the alkyloxy group, the sulfonic acid group, the aminosulfonyl group, and the alkoxysulfonyl group as $R^{24}$, $R^{27}$, and $R^{30}$ may have a substituent.

In General Formulae (OS-3) to (OS-5), the alkyl group as $R^{24}$, $R^{27}$, and $R^{30}$ is preferably an alkyl group having a total of 1 to 30 carbon atoms which may have a substituent.

In General Formulae (OS-3) to (OS-5), the alkyloxy group as $R^{24}$, $R^{27}$, and $R^{30}$ is preferably an alkyloxy group having a total of 1 to 30 carbon atoms which may have a substituent.

In General Formulae (OS-3) to (OS-5), each of m1 to m3 independently represents an integer of 0 to 6, is preferably an integer of 0 to 2, more preferably an integer of 0 or 1, and particularly preferably 0.

Regarding the respective substituents in General Formulae (OS-3) to (OS-5), the preferable range of the substituent in General Formulae (OS-3) to (OS-5) described in Paragraphs [0092] to [0109] in JP2011-221494A is also, similarly, preferred.

The compound having the oxime sulfonate structure represented by General Formula (B1) is particularly preferably an oxime sulfonate compound represented by any of General Formulae (OS-6) to (OS-11) represented below.

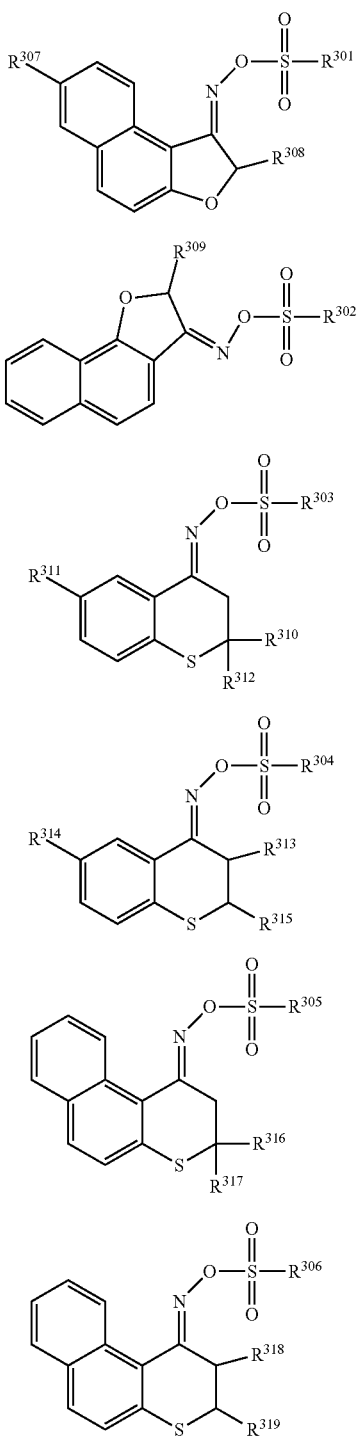

(OS-6)

(OS-7)

(OS-8)

(OS-9)

(OS-10)

(OS-11)

(In Formulae (OS-6) to (OS-11), each of $R^{301}$ to $R^{306}$ represents an alkyl group, an aryl group, or a heteroaryl group, $R^{307}$ represents a hydrogen atom or a bromine atom, each of $R^{308}$ to $R^{310}$, $R^{313}$, $R^{316}$, and $R^{318}$ independently represents a hydrogen atom, an alkyl group having 1 to 8 carbon atoms, a halogen atom, a chloromethyl group, a bromomethyl group, a bromoethyl group, a methoxymethyl group, a phenyl group, or a chlorophenyl group, each of $R^{311}$ to $R^{314}$ independently represents a hydrogen atom, a halogen atom, a methyl group, or a methoxy group, and each of $R^{312}$, $R^{315}$, $R^{317}$, and $R^{319}$ independently represents a hydrogen atom or a methyl group.)

The preferable range of General Formulae (OS-6) to (OS-11) is identical to the preferable range of General Formulae (OS-6) to (OS-11) described in Paragraphs [0110] to [0112] in JP2011-221494A.

Specific examples of the oxime sulfonate compound represented by General Formula (OS-3) to General Formula (OS-5) include the compound described in Paragraphs [0114] to [0120] in JP2011-221494A, but the present invention is not limited thereto.

In the photosensitive resin composition layer, the content of the non-ionic photoacid generator (B) is preferably used in a range of 0.1 parts by mass to 10 parts by mass and more preferably used in a range of 0.5 parts by mass to 10 parts by mass in relation to 100 parts by mass of the total resin components (preferably the total solid content and more preferably the sum of polymers) in the photosensitive resin composition. Two or more non-ionic photoacid generators can also be jointly used.

Examples of the ionic photoacid generator include diaryl iodonium salts, triaryl sulfonium salts, quaternary ammonium salts, and the like. Among them, triaryl sulfonium salts and diaryl iodonium salts are preferred.

The triaryl sulfonium salts used as the ionic photoacid generator are represented by General Formula (1) described below.

GENERAL FORMULA (1)

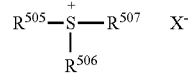

(1)

(In General Formula (1), each of $R^{505}$, $R^{506}$, and $R^{507}$ represents an alkyl group or an aromatic group which may have a substituent and, in the case of the alkyl group, the alkyl groups may be combined together so as to form a ring; $X^-$ represents a conjugate base.)

The alkyl group as $R^{505}$, $R^{506}$, and $R^{507}$ is preferably an alkyl group having 1 to 10 carbon atoms and may have a substituent. Examples of the alkyl group include a methyl group, an ethyl group, a propyl group, an isopropyl group, a butyl group, a tertiary butyl group, a pentyl group, a neopentyl group, a hexyl group, a cyclohexyl group, a heptyl group, an octyl group, and the like. Among them, a methyl group, an ethyl group, and a tertiary butyl group are preferred. In addition, in a case in which two or more of $R^{505}$, $R^{506}$, and $R^{507}$ are alkyl groups, the two or more alkyl groups are preferably combined together so as to form a ring and the ring is preferably a five-membered ring (thiacyclopentane) or a six-membered ring (thiacyclohexane) including a sulfur atom.

The aromatic group as $R^{505}$, $R^{506}$, and $R^{507}$ is preferably an aromatic group having 6 to 30 carbon atoms and may have a substituent. Examples of the aromatic group include a phenyl group, a naphthyl group, a 4-methoxyphenyl group, a 4-chlorophenyl group, a 4-methylphenyl group, a 4-tertiary butylphenyl group, a 4-phenyl thiophenyl group, a 2,4,6-trimethylphenyl group, a 4-methoxy-1-naphtyl group, and a 4-(4'-diphenylsulfoniophenylthio)phenyl group.

In addition, the ionic photoacid generator represented by General Formula (1) may also be bonded at any of $R^{505}$ to $R^{507}$ so as to form a multimeric complex such as a dimer. For example, the 4-(4'-diphenylsulfoniophenylthio)phenyl group is an example of the dimer and a counter anion in the 4-(4'-diphenylsulfoniophenylthio)phenyl group is identical to $X^-$.

The substituent that may be included in the alkyl group and the aromatic group as $R^{505}$, $R^{506}$, and $R^{507}$ is an aromatic group and, specifically, a phenyl group, a 4-methoxyphenyl group, a 4-chlorophenyl group, and a 4-(4'-diphenylsulfoniophenylthio)phenyl group are particularly preferred. These substituents may be further substituted by the above-described substituent.

The conjugate base as $X^-$ is preferably a conjugate base of alkyl sulfonic acid, a conjugate base of an aryl sulfonic acid, $BY_4^-$ (Y represents a halogen atom, which shall apply below), $PY_6^-$, $AsY_6^-$, $SbY_6^-$, or a monovalent anion represented by General Formula (3) or General Formula (4) represented below, and particularly preferably a conjugate base of alkyl sulfonic acid, a conjugate base of an aryl sulfonic acid, $PY_6^-$, or a monovalent anion represented by General Formula (3).

The conjugate bases of alkyl sulfonic acid and aryl sulfonic acid are preferably conjugate bases of alkyl sulfonic acid having 1 to 7 carbon atoms and, furthermore, more preferably conjugate bases of alkyl sulfonic acid having 1 to 4 carbon atoms. When expressed in an acid form, for example, methane sulfonic acid, trifluoromethane sulfonic acid, n-propanesulfonic acid, and hepthanesulfonic acid are particularly preferred.

Examples of the conjugate base of aryl sulfonic acid include, when expressed in an acid form, benzene sulfonic acid, chlorobenzene sulfonic acid, and paratoluene sulfonic acid.

Y in $BY_4^-$ $PY_6^-$, $AsY_6^-$, and $SbY_6^-$ as $X^-$ is preferably a fluorine atom or a chlorine atom and particularly preferably a fluorine atom.

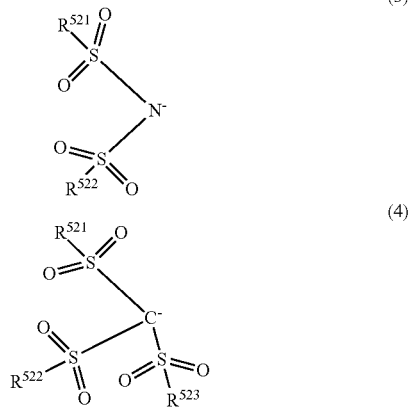

(In General Formula (3) and General Formula (4), each of $R^{521}$, $R^{522}$, and $R^{523}$ independently represents an alkyl group having 1 to 10 carbon atoms, an alkyl group having 1 to 10 carbon atoms which includes a fluorine atom, or a ring in which $R^{521}$ and $R^{522}$ are bonded together by an alkylene group having 2 to 6 carbon atoms or an alkylene group having 2 to 6 carbon atoms which includes a fluorine atom.)

In General Formula (3) and General Formula (4), examples of the alkyl group having 1 to 10 carbon atoms as $R^{521}$, $R^{522}$, and $R^{523}$ include a methyl group, an ethyl group, a butyl group, a tertiary butyl group, a cyclohexyl group, an octyl group, and the like. Examples of the alkyl group having 1 to 10 carbon atoms which includes a fluorine atom include a trifluoromethyl group, a pentafluoroethyl group, a heptafluoropropyl group, a nonafluorobtyl group, a dodecafluoropentyl group, a perfluorooctyl group, and the like. Among them, each of $R^{521}$, $R^{522}$, and $R^{523}$ is preferably an alkyl group having 1 to 10 carbon atoms which includes a fluorine atom and particularly preferably an alkyl group having 1 to 6 carbon atoms which includes a fluorine atom.

In General Formula (3) and General Formula (4), examples of the alkylene group having 2 to 6 carbon atoms in a case in which $R^{521}$ and $R^{522}$ are bonded together so as to form a ring include an ethylene group, a propylene group, a butylene group, a pentylene group, a hexylene group, and the like. Examples of the alkylene group which has 2 to 6 carbon atoms and includes a fluorine atom include a tetrafluoroethylene group, a hexafluoropropylene group, an octafluorobutylene group, a decafluoropentylene group, an undecafluorphexylene group, and the like. Among them, in a case in which $R^{521}$ and $R^{522}$ are bonded together so as to form a ring, $R^{521}$ and $R^{522}$ are preferably bonded together using an alkylene group which has 2 to 6 carbon atoms and includes a fluorine atom and $R^{521}$ and $R^{522}$ are particularly preferably bonded together using an alkylene group having 2 to 4 carbon atoms.

The ionic photoacid generator represented by General Formula (1) is preferably a photoacid generator represented by General Formula (5).

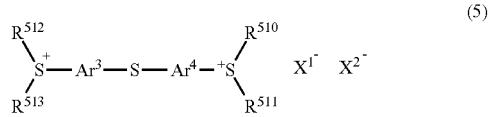

(In the formula, each of $R^{510}$, $R^{511}$, $R^{512}$, and $R^{513}$ independently represents an alkyl group or an aromatic group which may have a substituent, each of $Ar^3$ and $Ar^4$ independently represents a divalent aromatic group which may have a substituent, and each of $X^{1-}$ and $X^{2-}$ independently represent a conjugate base.)

The alkyl group and the aromatic group as $R^{510}$, $R^{511}$, $R^{512}$, and $R^{513}$ are identical to the alkyl group and the aromatic group represented by $R^{505}$, $R^{506}$, and $R^{507}$ in General Formula (1) and preferred aspects thereof are also identical.

The conjugate base as $X^{1-}$ and $X^{2-}$ is identical to the conjugate base represented by $X^-$ in General Formula (1) and preferred aspects thereof are also identical.

The divalent aromatic group as $Ar^3$ and $Ar^4$ is preferably a phenylene group or a naphthalene group and particularly preferably a phenylene group.

Specific examples of the triaryl sulfonium salts used as the ionic photoacid generator include triphenylsulfonium trifluoromethansulfonate, triphenylsulfonium trifluoroacetate, 4-methoxyphenyldiphenylsulfonium trifluoromethanesulfonate, 4-methoxyphenyldiphenylsulfonium trifluoroacetate, 4-phenylthiophenyldiphenylsulfonium trifluoromethanesulfonate, 4-phenylthiophenyldiphenylsulfonium trifluoroacetate, and the like.

Examples of commercially available compounds include TPS-102, 103, 105, 106, 109, 300, 1000, MDS-103, 105, 109, 205, 209, BDS-109, DTS-103, 105, MNPS-109, HDS-109 (all manufactured by Midori Kagaku Co., Ltd.), GSID-26-1 and Cyracure UVI-6976 (both manufactured by BASF).

The diaryl iodonium salts used as the ionic photoacid generator are represented by the General Formula (2) represented below.

GENERAL FORMULA (2)

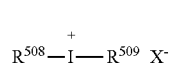

(2)

(In General Formula (2), each of $R^{508}$ and $R^{509}$ independently represents an aromatic group which may have a substituent and $X^-$ represents a conjugate base.)

In General Formula (2), the aromatic group as $R^{508}$ and $R^{509}$ is identical to the aromatic group represented by $R^{505}$, $R^{506}$, and $R^{507}$ in General Formula (1) and preferred aspects thereof are also identical.

In General Formula (2), the conjugate base as $X^-$ is identical to the conjugate base represented by $X^-$ in General Formula (1) and preferred aspects thereof are also identical.

The photoacid generator represented by General Formula (2) may also be bonded at any of $R^{508}$ and $R^{509}$ so as to form a multimeric complex such as a dimer. For example, the 4-(4'-diphenylsulfoniophenylthio)phenyl group is an example of the dimer and a counter anion in the 4-(4'-diphenylsulfoniophenylthio)phenyl group is identical to $X^-$.

Specific examples of the diaryl iodonium salts used as the ionic photoacid generator include diphenyliodonium trifluoroacetate, diphenyliodonium trifluoromethanesulfonate, 4-methoxyphenylphenyliodonium trifluoromethanesulfonate, 4-methoxyphenylphenyliodonium trifluoroacetate, phenyl, 4-(2'-hydroxy-1'-tetradecaoxy)phenyliodonium trifluoromethanesulfonate, 4-(2'-hydroxy-1'-tetradecaoxy)phenyliodonium hexafluoroantimonate, phenyl, 4-(2'-hydroxy-1'-tetradecaoxy)phenyliodonium-p-toluenesulfonate, and the like.

Examples of commercially available compounds include DPI-105, 106, 109, 201, BI-105, MPI-105, 106, 109, BBI-102, 103, 105, 106, 109, 110, 201, 300, and 301 (all manufactured by Midori Kagaku Co., Ltd.).

Specific examples of quaternary ammonium salts used as the ionic photoacid generator include tetramethylammonium butyl tris(2,6-difluorophenyl)borate, tetramethylammonium hexyl tris(p-chlorophenyl)borate, tetrametylammonium hexyl tris(3-trifluoromethylphenyl)borate, benzyldimethylphenyl ammonium butyl tri(2,6-difluorophenyl)borate, benzyldimethylphenyl ammonium hexyl tris(p-chlorophenyl)borate, benzyldimethylphenyl ammonium hexyl tris(3-trifluoromethyl phenyl)borate, and the like.

In addition to the above-described specific examples, specific examples of the component (B) include compounds represented below, but the present invention is not limited thereto.

PAG-1
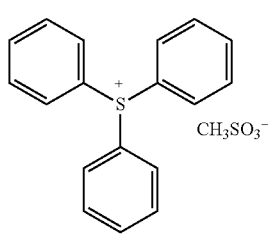

PAG-2
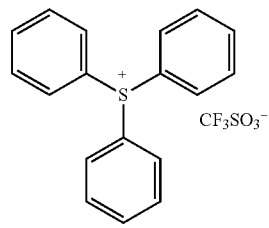

PAG-3
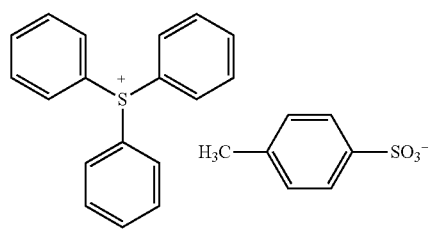

PAG-4
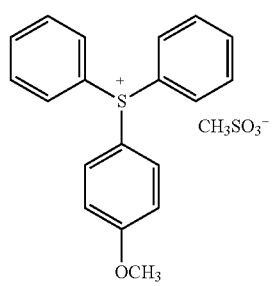

PAG-5
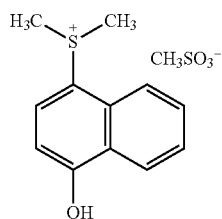

PAG-6
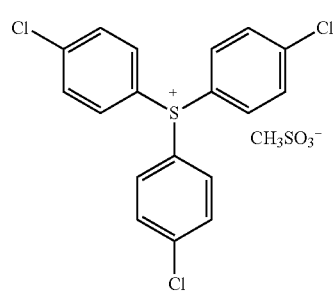

PAG-7
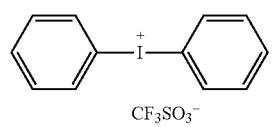

PAG-8
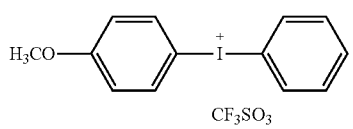

PAG-9
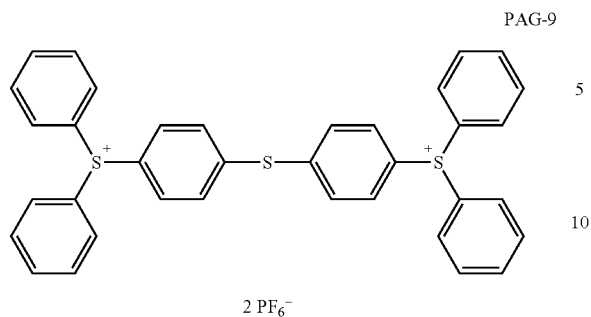
2 PF$_6^-$
PAG-10
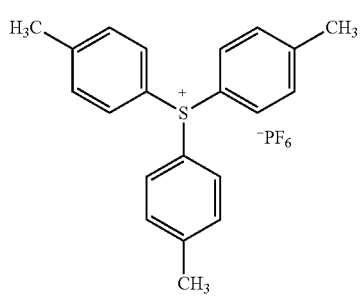
PAG-11
PAG-12
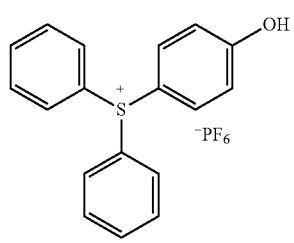
PAG-13
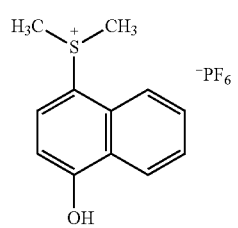
PAG-14
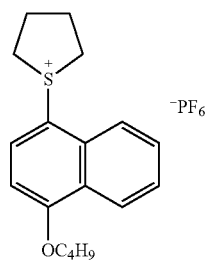
PAG-15
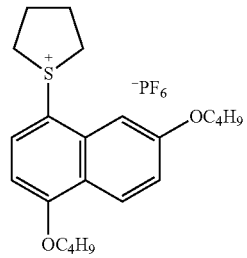
PAG-16
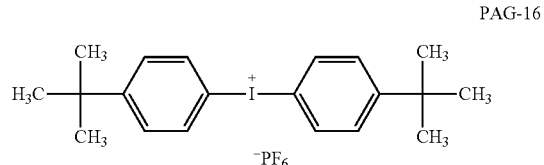
PAG-17
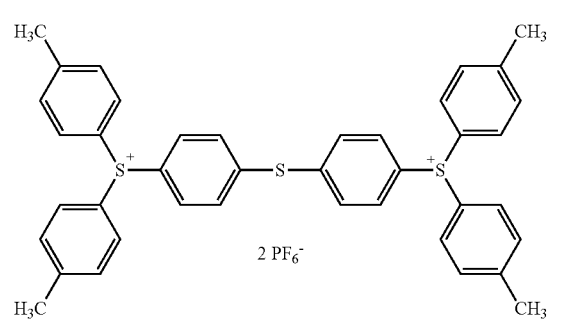
2 PF$_6^-$
PAG-18
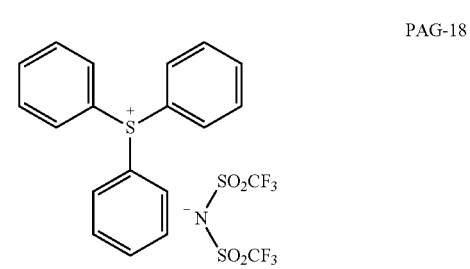
PAG-19
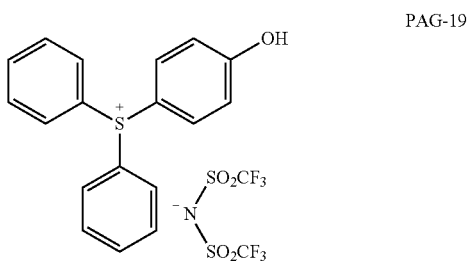
PAG-20
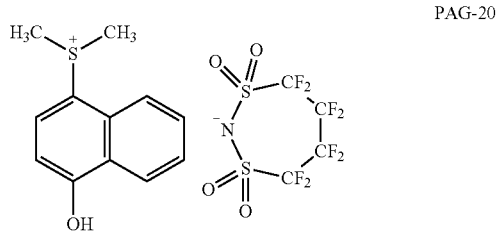

-continued

PAG-21
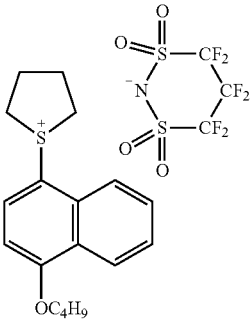

PAG-22
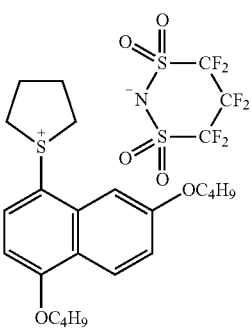

PAG-23
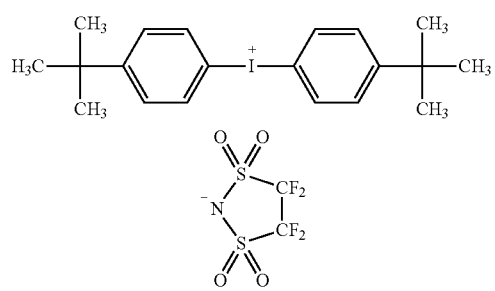

PAG-24
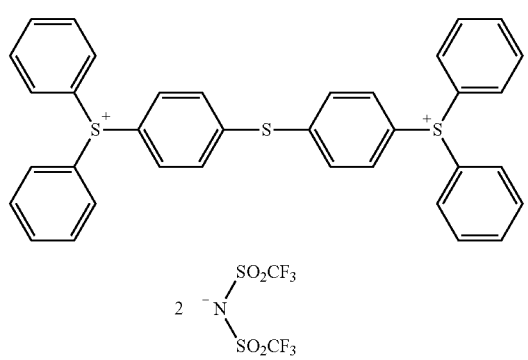

PAG-25
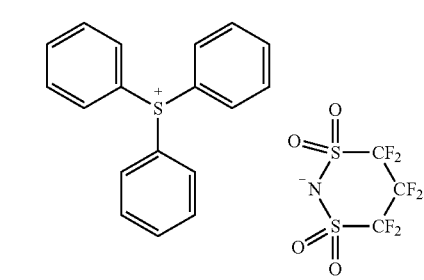

The content of the component B in the photosensitive resin composition layer is preferably in a range of 0.1 parts by mass to 10 parts by mass and more preferably in a range of 0.5 parts by mass to 5 parts by mass in relation to 100 parts by mass of the polymer component. When the content of the component B is 0.1 parts by mass or more, it is easy to obtain a desired sensitivity (an increase in sensitivity) and, when the content is 10 parts by mass or less, it is easy to ensure the transparency of a coated film.

In addition, the amount of the non-ionic photoacid generator added is preferably 1% by mass or less and an aspect in which the non-ionic photoacid generator is substantially not included is preferred.

<Component D: Solvent>

The photosensitive resin composition layer preferably includes a solvent. The photosensitive resin composition layer is preferably produced as a solution obtained by dissolving the essential components of the present invention and, furthermore, arbitrary components described below in a solvent.

As the solvent used in the photosensitive resin composition layer, a well-known solvent can be used and examples thereof include ethylene glycol monoalkyl ethers, ethylene glycol dialkyl ethers, ethylene glycol monoalkyl ether acetates, propylene glycol monoalkyl ethers, propylene glycol dialkyl ethers, propylene glycol monoalkyl ether acetates, diethylene glycol dialkyl ethers, diethylene glycol monoalkyl ether acetates, dipropylene glycol monoalkyl ethers, dipropylene glycol dialkyl ethers, dipropylene glycol monoalkyl ether acetates, esters, ketones, amides, lactones, and the like. Specific examples of the solvent used in the photosensitive resin composition layer also include the solvents described in Paragraphs [0174] to [0178] in JP2011-221494A, the content of which is incorporated into the present specification.

In addition, it is also possible to further add as necessary a solvent such as benzyl ethyl ether, dihexyl ether, ethylene glycol monomethyl ether acetate, diethylene glycol monomethyl ether, diethylene glycol monoethyl ether, isophorone, caproic acid, caprylic acid, 1-octanol, 1-nonal, benzyl alcohol, anisole, benzyl acetate, ethyl benzoate, diethyl oxalate, diethyl maleate, ethylene carbonate, or propylene carbonate to the solvent. These solvents can be singly used or a mixture of two or more solvents can be used. It is preferable that the solvent that can be used in the present invention is singly used or two solvents are jointly used, it is more preferable that two solvents are jointly used, and it is still more preferable that propylene glycol monoalkyl ether acetate, a dialkyl ether, or diacetate and a diethylene glycol dialkyl ether, or an ester and butylene glycol alkyl ether acetate are jointly used.

The component D is preferably a solvent having a boiling point in a range of 130° C. to lower than 160° C., a solvent having a boiling point of 160° C. or higher, or a mixture thereof.

Examples of the solvent having a boiling point in a range of 130° C. to lower than 160° C. include propylene glycol monomethyl ether acetate (boiling point of 146° C.), propylene glycol monoethyl ether acetate (boiling point of 158° C.), propylene glycol methyl-n-butyl ether (boiling point of 155° C.), and propylene glycol methyl-n-propyl ether (boiling point of 131° C.).

Examples of the solvent having a boiling point of 160° C. or higher include ethyl 3-ethoxy propionate (boiling point of 170° C.), diethylene glycol methyl ethyl ether (boiling point of 176° C.), propylene glycol monomethyl ether propionate (boiling point of 160° C.), dipropylene glycol methyl ether acetate (boiling point of 213° C.), 3-methoxy butyl ether acetate (boiling point of 171° C.), diethylene glycol diethyl ether (boiling point of 189° C.), diethylene glycol dimethyl ether (boiling point of 162° C.), propylene glycol diacetate (boiling point of 190° C.), diethylene glycol monoethyl ether acetate (boiling point of 220° C.), dipropylene glycol dimethyl ether (boiling point of 175° C.), and 1,3-butylene glycol diacetate (boiling point of 232° C.).

The content of the solvent in the photosensitive resin composition layer is preferably in a range of 50 parts by mass to 95 parts by mass and more preferably in a range of 60 parts by mass to 90 parts by mass per 100 parts by mass of the total resin components in the photosensitive resin composition.

<Component E: Sensitizer>

The photosensitive resin composition layer preferably includes a sensitizer in a combination with the photoacid generator (B) in order to accelerate the decomposition of the photosensitive resin composition layer and, particularly, when the non-ionic photoacid generator is used, the photosensitive resin composition layer preferably includes a sensitizer. When absorbing an active light ray or a radioactive ray, the sensitizer falls into an electroexcitation state. The sensitizer in an electroexcitation state comes into contact with the photoacid generator and thus exhibits actions of electron migration, energy migration, heat generation, and the like. Therefore, the photoacid generator causes a chemical change, is decomposed, and generates an acid.

The inclusion of the sensitizer further improves exposure sensitivity and is particularly effective in a case in which the non-ionic photoacid generator having a low visible light absorption efficiency is used and a case in which an exposure light source is a mixed ray of a g ray and a h ray.

The sensitizer is preferably an anthracene derivative, an acridone derivative, a thioxanthone derivative, a coumarin derivative, a base styryl derivative, or a distyryl benzene derivative and more preferably an anthracene derivative.

The anthracene derivative is preferably anthracene, 9,10-dibutoxyanthracene, 9,10-dichloroanthracene, 2-ethyl-9,10-dimethoxyanthracene, 9-hydroxymethylanthracene, 9-bromoanthracene, 9-chloroanthracene, 9,10-dibromoanthracene, 2-ethyleanthracene, or 9,10-dimethoxyanthracene.

The acridone derivative is preferably acridone, N-butyl-2-chloroacridone, N-methylacridone, 2-methoxyacridone, or N-ethyl-2-methoxyacridone.

The thioxanthone derivative is preferably thioxanthone, diethyl thioxanthone, 1-chloro-4-propoxythioxanthone, or 2-chlorothioxanthone.

The coumarin derivative is preferably coumarin-1, coumarin-6H, coumarin-110, or coumarin-102.

Examples of the base styryl derivative include 2-(4-dimethylaminostyryl)benzoxazole, 2-(4-dimethylaminostyryl)benzothiazole, or 2-(4-dimethylaminostyryl)naphthothiazole, Examples of the distyryl benzene derivative include distyryl benzene, di(4-methoxystyryl)benzene, or di(3,4,5-trimethoxystyryl) benzene.

Specific examples of the sensitizer are represented below, but the present invention is not limited thereto. In the drawing below, Me represents a methyl group, Et represents an ethyl group, and Bu represents an n-butyl group.

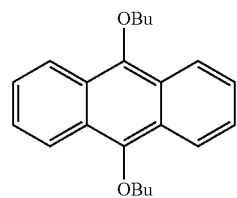

S-1

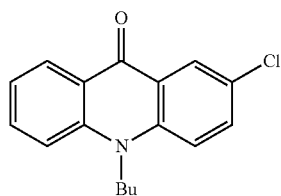

S-2

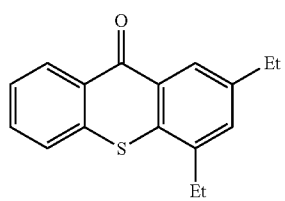

S-3

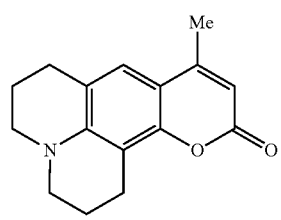

S-4

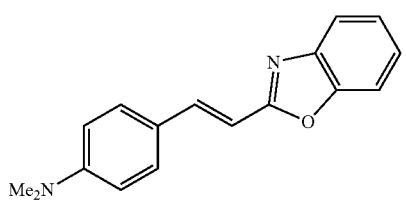

S-5

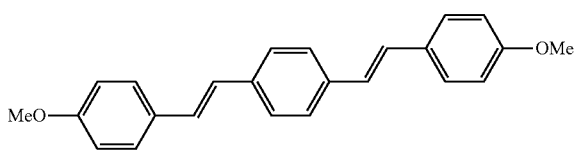

S-6

The content of the sensitizer in the photosensitive resin composition layer is preferably in a range of 0.1 parts by mass to 10 parts by mass and more preferably in a range of 0.5 parts by mass to 5 parts by mass in relation to 100 parts by mass of polymerizing components. When the content of the sensitizer is set to 0.1 parts by mass or more, it is easy to obtain a desired sensitivity and, when the content is set to 10 parts by mass or less, it is easy to ensure the transparency of a coated film.

<Component S: Basic Compound>

The photosensitive resin composition layer may include a basic compound. The basic compound can be arbitrarily selected from basic compounds that can be used as a chemical amplification resist and examples thereof include aliphatic amines, aromatic amines, heterocyclic amines, quaternary ammonium hydroxides, quaternary ammonium salts of carboxylic acid, and the like. Specific examples thereof include the compounds described in Paragraphs [0204] to [0207] in JP2011-221494A, the content of which is incorporated into the present specification.

Specific examples of the aliphatic amines include trimethylamine, diethylamine, triethylamine, di-n-propylamine, tri-n-propylamine, di-n-pentylamine, tri-n-pentylamine, diethanolamine, triethanolamine, dicyclohexylamine, dicyclohexylmethylamine, and the like.

Examples of the aromatic amines include aniline, benzylamine, N,N-dimethyl aniline, diphenylamine, and the like.

Examples of the heterocyclic amines include pyridine, 2-methylpyridine, 4-methylpyridine, 2-ethylpyridine, 4-ethylpyridine, 2-phenylpyridine, 4-phenylpyridine, N-methyl-4-phenylpyridine, 4-dimethylaminopyridine, imidazole, benzimidazole, 4-methylimidazole, 2-phenylbenzimidazole, 2,4,5-triphenylimidazole, nicotine, nicotinic acid, nicotinamide, quinoline, 8-oxyquinoline, pyrazine, pyrazole, pyridazine, purine, pyrrolidine, piperidine, piperazine, morpholine, 4-methylmorpholine, 1,5-diazabicyclo [4.3.0]-5-nonene, 1,8-diazabicyclo [5.3.0]-7-undecene, and the like.

Examples of the quaternary ammonium hydroxides include tetramethylammonium hydroxide, tetraethylammonium hydroxide, tetra-n-butylammonium hydroxide, tetra-n-hexyl ammonium hydroxide, and the like.

Examples of the quaternary ammonium salts of carboxylic acid include tetramethylammonium acetate, tetramethylammonium benzoate, tetra-n-butylammonium acetate, tetra-n-butylammonium benzoate, and the like.

The basic compound that can be used in the present invention may be singly used or two or more basic compounds may be jointly used.

The content of the basic compound in the photosensitive resin composition layer is preferably in a range of 0.001 parts by mass to 3 parts by mass and more preferably in a range of 0.005 parts by mass to 1 part by mass in relation to 100 parts by mass of the total solid content in the photosensitive resin composition.

<Component F: Heterocyclic Compound>

The photosensitive resin composition layer preferably includes a heterocyclic compound (F) as necessary. The addition of the heterocyclic compound can make a hardened film obtained from the photosensitive resin composition layer a firmer film and also improves the line width stability.

Regarding the heterocyclic compound (F), there is no particular limitation except for the polymer component. For example, it is possible to add a compound having an epoxy group or an oxetanyl group in the molecule, an alkoxy methyl group-containing heterocyclic compound, additionally, an oxygen-containing monomer such as a variety of cyclic ethers and heterocyclic esters (lactones), a nitrogen-containing monomer such as a cyclic amine or oxazoline, furthermore, a heterocyclic monomer having a d electron such as silicon, sulfur, or phosphorous, or the like.

The amount of the heterocyclic compound (F) added to the photosensitive resin composition layer is preferably in a range of 0.01 parts by mass to 50 parts by mass, more preferably in a range of 0.1 parts by mass to 10 parts by mass, and still more preferably in a range of 1 part by mass to 5 parts by mass in relation to 100 parts by mass of the total solid content of the photosensitive resin composition. When the heterocyclic compound (F) is added in the above-described range, a hardened film having excellent mechanical strength can be obtained, a hardened film having excellent chemical resistance can be obtained, and the line width stability also improves. A plurality of kinds of heterocyclic compounds can also be jointly used as the heterocyclic compound (F) and, in such a case, the total content of all the heterocyclic compounds is preferably in the above-described range.

[Compound Having Epoxy Group or Oxetanyl Group in Molecule]

Specific examples of the compound having an epoxy group in the molecule include bisphenol A-type epoxy resins, bisphenol F-type epoxy resins, phenol novolac-type epoxy resins, cresol novolac-type epoxy resins, aliphatic epoxy resins, and the like.

The compound having an epoxy group in the molecule can be procured from commercially available products. Examples thereof include the commercially available products described in Paragraph [0189] in JP2011-221494A such as JER 828, JER 1007, JER 157S70 (manufactured by Mitsubishi Chemical Corporation), and JER 157S65 (manufactured by Mitsubishi Chemical holdings Corporation).

Additionally, examples thereof include ADEKA RESIN EP-4000S, ADEKA RESIN EP-4003S, ADEKA RESIN EP-4010S, ADEKA RESIN EP-4011S (all manufactured by ADEKA Corporation), NC-2000, NC-3000, NC-7300, XD-1000, EPPN-501, EPPN-502 (manufactured by ADEKA Corporation), DENACOL EX-611, EX-612, EX-614, EX-614B, EX-622, EX-512, EX-521, EX-411, EX-421, EX-313, EX-314, EX-321, EX-211, EX-212, EX-810, EX-811, EX-850, EX-851, EX-821, EX-830, EX-832, EX-841, EX-911, EX-941, EX-920, EX-931, EX-212L, EX-214L, EX-216L, EX-321L, EX-850L, DLC-201, DLC-203, DLC-204, DLC-205, DLC-206, DLC-301, DLC-402, EX-111, EX-121, EX-141, EX-145, EX-146, EX-147, EX-171, EX-192 (manufactured by Nagase ChemiteX Corporation), YH-300, YH-301, YH-302, YH-315, YH-324, YH-325 (all manufactured by Nippon Steel & Sumikin Chemical Co., Ltd.), CELLOXIDE 2021P, 2081, 2000, 3000, EHPE 3150, EPOLEAD GT400, CELL VENUS B0134, B0177 (manufactured by Daicel Corporation), and the like.

The compound having an epoxy group in the molecule can be singly used or a combination of two or more compounds can be used.

Among them, bisphenol A-type epoxy resins, bisphenol F-type epoxy resins, phenol novolac-type epoxy resins, and aliphatic epoxy resins are more preferred and aliphatic epoxy resins are particularly preferred.

As specific examples of the compound having an oxetanyl group in the molecule, it is possible to use ARON OXETANE OXT-201, OXT-211, OXT-212, OXT-213, OXT-121, OXT-221, OX-SQ, and PNOX (all manufactured by Toagosei Company, Limited).

The compound having an oxetanyl group can be singly used or can be used as a mixture with the compound having an epoxy group.

Among them, in the photosensitive transfer material of the present invention, the heterocyclic compound (C) preferably has an epoxy group from the viewpoint of improving the line width stability.

In addition, it is also possible to preferably use a compound having both an alkoxysilane structure and a heterocyclic structure in the molecule. Examples thereof include γ-glycidoxypropyltrialkoxysilane, γ-glycidoxypropylalkyldialkoxysilane, and 3-(3,4-epoxycyclohexyl)ethyltrialkoxysilane. Among them, γ-glycidoxypropyltrialkoxysilane is more preferred. The compound having both an alkoxysilane structure and a heterocyclic structure in the molecule can be singly used or a combination of two or more compounds can be used.

<Component W: Surfactant>

The photosensitive resin composition layer may also include a surfactant. As the surfactant, any of an anionic surfactant, a cationic surfactant, a nonionic surfactant, and an amphoteric surfactant can be used, but a nonionic surfactant is preferred.

Examples of the nonionic surfactant include polyoxyethylene higher alkyl ethers, polyoxyethylene higher alkyl phenyl ethers, higher fatty acid diesters of polyoxyethylene glycol, silicone-based surfactants, and fluorine-based surfactants. In addition, examples of commercially available products of the nonionic surfactant include a variety of series such as KP (manufactured by Shin-Etsu Chemical Co., Ltd.), POLYFLOW (manufactured by Kyoeisha Chemical Co., Ltd.), F-TOP (manufactured by JEMCO Inc.), MEGAFAC (manufactured by DIC Corporation), FLORADE (manufactured by 3M), ASAHI GUARD, SURFLON (manufactured by Asahi Glass Co., Ltd.), PolyFox (manufactured by OMNOVA Inc.), and SH-8400 (manufactured by Dow Corning Toray Silicone).

In addition, preferable examples of the surfactant include copolymers which includes a constituent unit A and constituent unit B represented by General Formula (I-1) and has a polystyrene-equivalent weight-average molecular weight (Mw), which is measured through gel permeation chromatography in a case in which tetrahydrofuran (THF) is used as a solvent, in a range of 1,000 to 10,000.

GENERAL FORMULA (I-1)

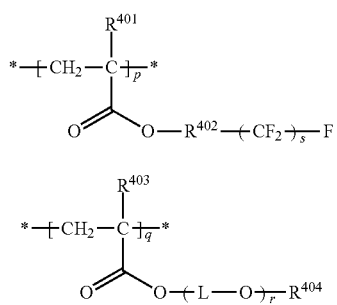

Constituent Unit A

Constituent Unit B (In Formula (I-1), each of $R^{401}$ and $R^{403}$ independently represents a hydrogen atom or a methyl group, $R^{402}$ represents a straight alkylene group having 1 to 4 carbon atoms, $R^{404}$ represents a hydrogen atom or an alkyl group having 1 to 4 carbon atoms, L represents an alkylene group having 3 to 6 carbon atoms, p and q are mass percentages expressed in terms of weight ratio, p represents a numerical value in a range of 10% by mass to 80% by mass, q represents a numerical value in a range of 20% by mass to 90% by mass, r represents an integer of 1 to 18, and s represents an integer of 1 to 10.)

The L is preferably a branched alkylene group represented by General Formula (1-2). $R^{405}$ in General Formula (1-2) represents an alkyl group having 1 to 4 carbon atoms, is preferably an alkyl group having 1 to 3 carbon atoms and more preferably an alkyl group having 2 or 3 carbon atoms from the viewpoint of compatibility and wetting properties against a coated surface. The sum (p+q) of p and q is p+q=100, that is, preferably 100% by mass.

GENERAL FORMULA (I-2)

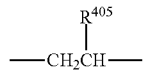

The weight-average molecular weight (Mw) of the copolymer is more preferably in a range of 1,500 to 5,000.

Additionally, it is also possible to use the surfactants described in Paragraph [0017] in JP4502784B and Paragraphs [0060] to [0071] in JP2009-237362A.

The surfactants can be singly used or a mixture of two or more surfactants can be used.

The amount of the surfactant added to the photosensitive resin composition layer is preferably 10 parts by mass or less, more preferably in a range of 0.001 parts by mass to 10 parts by mass, and still more preferably in a range of 0.01 parts by mass to 3 parts by mass in relation to 100 parts by mass of the total solid content in the photosensitive resin composition.

<Other Components>

In the photosensitive resin composition layer, in addition to the above-described components, it is possible to further add well-known additives such as metal oxide particles, crosslinking agents other than the heterocyclic compound, alkoxysilane compounds, antioxidants, dispersing agents, acid-proliferating agents, development accelerators, conductive fibers, colorants, plasticizers, thermal radical generator, thermal acid generators, ultraviolet absorbents, thickeners, and, organic or inorganic precipitation inhibitors to the photosensitive resin composition layer. For example, in a case in which the photosensitive transfer material of the present invention is used to form a mask layer in a capacitance-type input device, it is preferable to produce a colored photosensitive resin composition layer by adding a colorant to the photosensitive resin composition. In addition, in a case in which the photosensitive transfer material of the present invention is used for a transparent electrode pattern in a capacitance-type input device, it is preferable to produce a conductive photosensitive resin composition layer by adding a conductive fiber and the like to the photosensitive resin composition layer.

[Metal Oxide Particles]

The photosensitive resin composition layer preferably includes the metal oxide particles for the purpose of adjusting the refractive index or light transmittance. Since the metal oxide particles are highly transparent and light-transmissive, it is possible to obtain a positive-type photosensitive resin composition having a high refractive index and transparency.

The metal oxide particles preferably have a refractive index higher than the refractive index of a resin composition made of a material that does not include the particles and, specifically, with respect to light having a wavelength in a range of 400 nm to 750 nm, the refractive index is more preferably 1.50 or more, more preferably 1.70 or more, and particularly preferably 1.90 or more.

Here, the refractive index of 1.50 or more with respect to light having a wavelength in a range of 400 nm to 750 nm means that the average refractive index is 1.50 or more with respect to light having a wavelength in the above-described range and the refractive index does not need to be 1.50 or more with respect to all light rays having a wavelength in the above-described range. In addition, the average refractive index refers to a value obtained by dividing the sum of the measurement values of the refractive index with respective to individual light rays having a wavelength in the above-described range by the number of measurement points.

Meanwhile, the scope of metals that serve as parent materials of the metal oxide particles in the present invention also include half metals such as B, Si, Ge, As, Sb, and Te.

Light-transmissive metal oxide particles having a high refractive index are preferably oxide particles having atoms of Be, Mg, Ca, Sr, Ba, Sc, Y, La, Ce, Gd, Tb, Dy, Yb, Lu, Ti, Zr, Hf, Nb, Mo, W, Zn, B, Al, Si, Ge, Sn, Pb, Sb, Bi, Te, or the like, more preferably titanium oxide, titanium composite oxide, zinc oxide, zirconium oxide, indium/tin oxide, or antimony/tin oxide, still more preferably titanium oxide, titanium composite oxide, or zirconium oxide, particularly preferably titanium oxide or zirconium oxide, and most preferably titanium dioxide. The titanium dioxide is particularly preferably rutile-type titanium dioxide having a high refractive index. The surfaces of the metal oxide particles can also be treated with an organic material in order to impart dispersion stability.

From the viewpoint of the transparency of the resin composition, the average primary particle diameter of the component C is preferably in a range of 1 nm to 200 nm, and particularly preferably in a range of 3 nm to 80 nm. Here, the average primary particle diameter of the particles refers to an arithmetic average of the particle diameters of 200 arbitrary particles measured using an electronic microscope. In a case in which the shape of a particle is not spherical, the longest side is considered as the diameter.

A single kind of metal oxide particles may be used or two or more kinds of metal oxide particles may be jointly used.

The content of the metal oxide particles in the photosensitive resin composition layer can be appropriately determined in consideration of the refractive index, light transmittance, and the like required for optical members obtained from the resin composition and is preferably set in a range of 5% by mass to 80% by mass and more preferably set in a range of 10% by mass to 70% by mass in relation to the total solid content of the photosensitive resin composition layer.

[Blocked Isocyanate Compound: Crosslinking Agent Other than Heterocyclic Compound]

In the photosensitive resin composition layer, a blocked isocyanate-based compound can also be preferably employed as the crosslinking agent. There is no particular limitation regarding the blocked isocyanate compound as long as the compound has a blocked isocyanate group, but the blocked isocyanate compound is preferably a compound having two or more blocked isocyanate groups in a molecule from the viewpoint of hardening properties.

The blocked isocyanate group in the present invention refers to a group capable of generating an isocyanate group using heat and preferable examples thereof include a group in which an isocyanate group is protected by reacting a blocking agent and an isocyanate group. The blocked isocyanate group is preferably a group capable of generating an isocyanate group using heat having a temperature in a range of 90° C. to 250° C.

Regarding the blocked isocyanate compound, the skeleton thereof is not particularly limited as long as two isocyanate groups are included in one molecule and the skeleton may be aliphatic, alicyclic, or aromatic poly isocyanate. For example, it is possible to preferably use a compound having a prepolymer-type skeleton derived from an isocyante compound such as 2,4-tolylene diisocyanate, 2,6-tolylene diisocyanate, isophorone diisocyanate, 1,6-hexamethylene diisocyanate, 1,3-trimethylene diisocyanate, 1,4-tetramethylene diisocyanate, 2,2,4-trimethyl hexamethylene diisocyanate, 2,4,4-trimethyl hexamethylene diisocyanate, 1,9-nonamethylene diisocyanate, 1,10-decamethylene diisocyanate, 1,4-cyclohexane diisocyanate, 2,2'-diethyl ether diisocyanate, diphenylmethane-4,4'-diisocyanate, o-xylene diisocyanate, m-xylene diisocyanate, p-xylene diisocyanate, methylene bis(cyclohexyl isocyanate), cyclohexane-1,3-dimethylene diisocyanate, cyclohexane-1,4-dimethylene diisocyanate, 1,5-naphthalene diisocyanate, p-phenylene diisocyanate, 3,3'-methylene ditolylene-4,4'-diisocyanate, 4,4'-diphenyl ether diisocyanate, tetrachlorophenylene diisocyanate, norbornane diisocyanate, hydrogenated 1,3-xylylene diisocyanate, or hydrogenated 1,4-xylylene diisocyanate or a compound thereof. Among them, tolylene diisocyanate (TDI), diphenyl methandiisocyanate (MDI), hexamethylene diisocyanate (HDI), and isophorone diisocyanate (IPDI) are particularly preferred.

Examples of the mother structure of the blocked isocyanate compound in the photosensitive resin composition layer include biuret-type mother structures, isocyanurate-type mother structures, adduct-type mother structures, bifunctional prepolymer-type mother structures, and the like.

Examples of the blocking agent that forms the block structure of the blocked isocyanate compound include oxime compounds, lactam compounds, phenol compounds, alcohol compounds, amine compounds, active methylene compounds, pyrazole compounds, mercaptan compounds, imidazole-based compounds, imide-based compounds, and the like. Among them, a blocking agent selected from oxime compounds, lactam compounds, phenol compounds, alcohol compounds, amine compounds, active methylene compounds, and pyrazole compounds is particularly preferred.

Examples of the oxime compounds include oximes and ketoximes and specific examples thereof include acetoxime, formaldoxime, cyclohexane oxime, methyl ethyl ketone oxime, cyclohexanone oxime, benzophenone oxime, and the like.

Examples of the lactam compounds include ε-caprolactam, γ-butyrolactam, and the like.

Examples of the phenol compounds include phenol, naphthol, cresol, xylenol, halogen-substituted phenol, and the like.

Examples of the alcohol compounds include methanol, ethanol, propanol, butanol, cyclohexanol, ethylene glycol monoalkyl ethers, propylene glycol monoalkyl ether, alkyl lactate, and the like.

Examples of the amine compounds include primary amines and secondary amines, the amine compounds may be any of aromatic amines, aliphatic amines, and alicyclic amines and specific examples thereof include aniline, diphenylamine, ethylene imine, polyethylene imine, and the like.

Examples of the active methylene compounds include diethyl malonate, dimethyl malonate, ethyl acetoacetate, methyl acetoacetate, and the like.

Examples of the pyrazole compounds include pyrazole, methylpyrazole, dimethylpyrazole, and the like.

Examples of the mercaptan compounds include alkyl mercaptans, aryl mercaptan, and the like.

The blocked isocyanate compound that can be used in the photosensitive resin composition layer can be procured from commercially available products and, for example, it is possible to preferably use CORONATE AP stable M, CORONATE 2503, 2515, 2507, 2513, 2555, MILLIONATE MS-50 (all manufactured by Nippon Polyurethane Industry Co., Ltd.), TAKENATE B-830, B-815N, B-820NSU, B-842N, B-846N, B-870N, B-874N, B-882N (all manufactured by Mitsui Chemicals, Co., Ltd.), DURANATE 17B-

60PX, 17B-60P, TPA-B80X, TPA-B80E, MF-B60X, MF-B60B, MF-K60X, MF-K60B, E402-B80B, SBN-70D, SBB-70P, K6000 (all manufactured by Sumika Asahi Kasei Chemicals Co., Ltd.), DESMODUR BL1100, BL1265 MPA/X, BL3575/1, BL3272MPA, BL3370MPA, BL3475BA/SN, BL5375MPA, VPLS2078/2, BL4265SN, PL340, PL350, SUMIJULE BL3175 (all manufactured by Bayer Urethane Co., Ltd.), or the like.

[Alkoxysilane Compound]

The photosensitive resin composition layer preferably includes an alkoxysilane compound. The use of the alkoxysilane compound can improve adhesiveness between a film formed using the photosensitive resin composition layer and a substrate and, furthermore, can adjust the properties of a film formed using the photosensitive resin composition layer. The alkoxysilane compound is preferably a compound having a dialkoxysilane structure or a compound having a trialkoxysilane structure and more preferably a compound having a trialkoxysilane structure. The number of carbon atoms in an alkoxy group included in the alkoxysilane compound is preferably in a range of 1 to 5. The molecular weight of the alkoxysilane compound is preferably in a range of 100 to 500 and more preferably in a range of 150 to 400.

The alkoxysilane compound that can be used in the photosensitive resin composition layer is preferably a compound capable of improving adhesiveness between an inorganic substance that serves as a base material, for example, a silicon compound such as silicon, silicon oxide, or silicon nitride or metal such as gold, copper, molybdenum, titanium, or aluminum and an insulating film. As the alkoxysilane compound, it is also possible to use a compound which has an alkoxysilane structure and is also included in the heterocyclic compound (3-glycidoxypropyltrimethoxysilane or the like).

Specifically, a well-known silane coupling agent or the like is also effective.

Examples of the silane coupling agent include γ-aminopropyltrimethoxysilane, γ-aminopropyltriethoxysilane, γ-glycidoxypropyltrialkoxysilane, γ-glycidoxypropylalkyldialkoxysilane, γ-methacryloxypropylalkyldialkoxysilane, γ-chloropropyltrialkoxysilane, γ-mercaptopropyl trialkoxysilane, β-(3,4-epoxycyclohexyl) ethyltrialkoxysilane, and vinyltrialkoxysilane. The silane coupling agent can be singly used or a combination of two or more silane coupling agents can be used.

Compounds represented in the following specific examples can also be preferably employed.

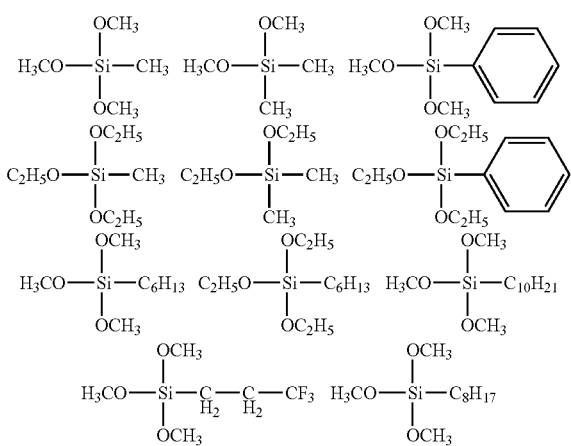

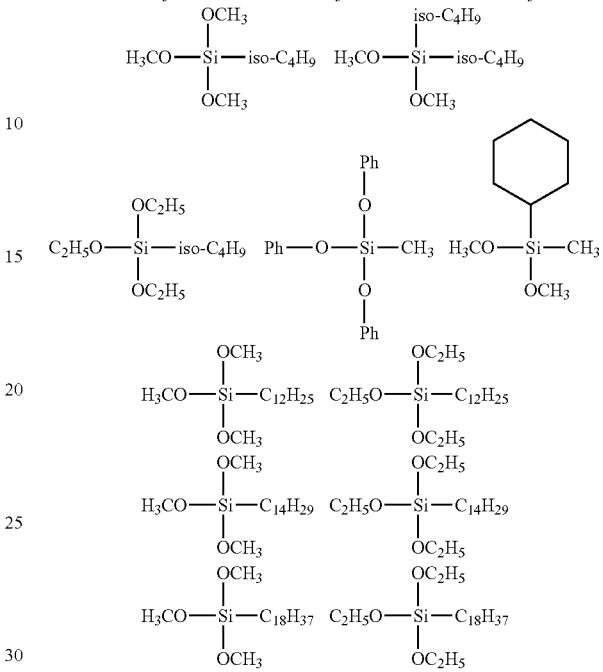

In the specific examples represented above, Ph represents a phenyl group.

The alkoxysilane compound in the photosensitive resin composition layer is not limited to, particularly, those represented above and well-known alkoxysilane compounds can be used.

The content of the alkoxysilane compound in the photosensitive resin composition layer is preferably in a range of 0.1 parts by mass to 30 parts by mass, more preferably in a range of 0.5 parts by mass to 30 part by mass, and still more preferably in a range of 5 parts by mass to 25 part by mass in relation to 100 parts by mass of the total solid content in the photosensitive resin composition.

In the present invention, the photosensitive transfer material becomes particularly excellent when sensitivity, insulating properties, and preservation stability are collectively evaluated by setting the fraction in a range of 5 parts by mass to 25 parts by mass.

[Antioxidant]

The photosensitive resin composition layer may include an antioxidant. As the antioxidant, a well-known antioxidant can be included. The addition of the antioxidant can prevent the coloration of hardened films or can reduce the decrease in the film thickness caused by decomposition and has an advantage of excellent heat-resistant transparency.

Examples of the antioxidant include phosphorus-based antioxidants, amides, hydrazides, hindered amine-based antioxidants, sulfur-based antioxidants, phenol-based antioxidants, ascorbic acids, zinc sulfate, sugars, nitrites, sulfites, thiosulfate salts, hydroxylamine derivatives, and the like. Among them, from the viewpoint of the coloration of hardened films and the decrease in the film thickness, phenol-based antioxidants, amide-based antioxidants, hydrazide-based antioxidants, and sulfur-based antioxidants are particularly preferred. The antioxidant may be singly used or two or more antioxidants may be mixed together.

Examples of commercially available products of the phenol-based antioxidants include ADK STAB AO-15, ADK STAB AO-18, ADK STAB AO-20, ADK STAB AO-23, ADK STAB AO-30, ADK STAB AO-37, ADK STAB AO-40, ADK STAB AO-50, ADK STAB AO-51, ADK STAB AO-60, ADK STAB AO-70, ADK STAB AO-80, ADK STAB AO-330, ADK STAB AO-412S, ADK STAB AO-503, ADK STAB A-611, ADK STAB A-612, ADK STAB-613, ADK STAB PEP-4C, ADK STAB PEP-8, ADK STAB PEP-8W, ADK STAB PEP-24G, ADK STAB PEP-36, ADK STAB PEP-36Z, ADK STAB HP-10, ADK STAB 2112, ADK STAB 260, ADK STAB 522A, ADK STAB 1178, ADK STAB 1500, ADK STAB C, ADK STAB 135A, ADK STAB 3010, ADK STAB TPP, ADK STAB CDA-1, ADK STAB CDA-6, ADK STAB ZS-27, ADK STAB ZS-90, ADK STAB ZS-91 (all manufactured by ADEKA Corporation), IRGANOX 245FF, IRGANOX 1010FF, IRGANOX 1010, IRGANOX MD1024, IRGANOX 1035FF, IRGANOX 1035, IRGANOX 1098, IRGANOX 1330, IRGANOX 1520L, IRGANOX 3114, IRGANOX 1726, IRGAFOS 168, IRUGAMODDO 295 (manufactured by BASF Co., Ltd.), and the like. Among them, ADK STAB AO-60, ADK STAB AO-80, IRGANOX 1726, IRGANOX 1035, and IRGANOX 1098 can be preferably used.

The content of the antioxidant is preferably in a range of 0.1% by mass to 10% by mass, more preferably in a range of 0.2% by mass to 5% by mass, and particularly preferably in a range of 0.5% by mass to 4% by mass in relation to the total solid content of the photosensitive resin composition. When the content of the antioxidant is set in the above-described range, the sufficient transparency of formed films can be obtained and sensitivity during the formation of patterns also becomes favorable.

In addition, as additives other than the antioxidant, a variety of ultraviolet absorbents, metal deactivator, and the like described in "New Development of the Polymeric Additive (published by Nikkan Kogyo Shimbun Ltd.)" may be added to the photosensitive resin composition layer.

[Dispersing Agent]

In the photosensitive resin composition layer, a well-known dispersing agent can be used as the dispersing agent and a dispersing agent having an acid group is preferred.

[Acid-proliferating Agent]

In the photosensitive resin composition layer, an acid-proliferating agent can be used in order to improve sensitivity.

The acid-proliferating agent that can be used in the present invention is a compound capable of further generating an acid through an acid catalyst reaction so as to increase the acid concentration in a system and a compound that remains stable present in the absence of an acid. Since the above-described compound proliferates one or more acids in a single reaction, a reaction proceeds at an accelerating rate as the reaction proceeds. However, since the generated acids cause self-decomposition, the intensity of acids that are generated at this time is preferably 3 or less and particularly preferably 2 or less in terms of acid dissociation constant pKa.

Specific examples of the acid-proliferating agent include the compounds described in Paragraph [0203] to [0223] in JP1989-1508A (JP-H10-1508A), Paragraph [0016] to [0055] in JP1989-282642A (JP-H10-282642A), and Row 12 on Page 39 to Row 2 on Page 47 in JP1988-512498A (JP-H09-512498A), the contents of which are incorporated into the present specification.

Examples of the acid-proliferating agent that can be used in the present invention include compounds which are decomposed by an acid generated by an acid generator and generate an acid having a pKa of 3 or less such as dichloroacetic acid, trichloroacetic acid, methanesulfonic acid, benzenesulfonic acid, trifluoromethanesulfonic acid, or phenyl sulfonic acid.

Specific examples thereof include compounds represented below.

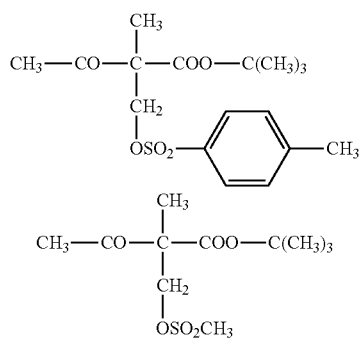

The content of the acid-proliferating agent in the photosensitive composition is preferably set in a range of 10 parts by mass to 1,000 parts by mass and more preferably set in a range of 20 parts by mass to 500 parts by mass in relation to 100 parts by mass of the photoacid generator from the viewpoint of dissolution contrast between exposed portions and non-exposed portions.

[Development Accelerator]

The photosensitive resin composition layer is capable of including a development accelerator.

Regarding the development accelerator, Paragraphs [0171] and [0172] in JP2012-042837A can be referenced, and the content thereof is incorporated into the present specification.

The development accelerator may be singly used or two or more development accelerators can also be jointly used.

The amount of the development accelerator added to the photosensitive resin composition layer is preferably in a range of 0 parts by mass to 30 parts by mass, more preferably in a range of 0.1 parts by mass to 20 parts by mass, and most preferably in a range of 0.5 part by mass to 10 parts by mass in relation to 100 parts by mass of the total solid content of the photosensitive composition from the viewpoint of sensitivity and residual film ratio.

[Other Additives]

In addition, as other additives, it is also possible to use the thermal radical generators described in Paragraphs [0120] and [0121] in JP2012-8223A, and the nitrogen-containing compounds and thermal acid generators described in WO2011/136074A1, and the contents thereof are incorporated into the present specification.

Furthermore, in the photosensitive resin composition, it is possible to use the thermal polymerization inhibitors described in Paragraph [0018] in JP4502784B, furthermore, other additives described in Paragraphs [0058] to [0071] in JP2000-310706A, the materials described in JP2005-221726A, and the like, but the additives are not limited thereto.

<Film Thickness of Photosensitive Resin Composition Layer>

The film thickness of the photosensitive resin composition layer is preferably in a range of 0.5 μm to 10 μm. When the film thickness of the photosensitive resin composition layer is 10 μm or less, the resolution of patterns improves and, when the film thickness is 0.5 μm or more, the resistance against etchants improves.

The film thickness of the photosensitive resin composition layer is more preferably in a range of 0.8 μm to 5 μm and particularly preferably in a range of 1.0 μm to 3.0 μm.

<Photosensitive Resin Composition Layer Formation Method>

The respective components are mixed together at a predetermined ratio using an arbitrary method, stirred, and dissolved, thereby preparing a photosensitive resin composition. For example, it is also possible to prepare solutions obtained by respectively dissolving the components in solvent in advance, mixing the solutions at a predetermined ratio so as to prepare a resin composition. The resin composition prepared as described above can also be used after being filtered using a filter or the like having a pore diameter of 0.2 μm.

{Other Layers}

The photosensitive transfer material used in the present invention can be preferably constituted by providing a peeling layer between the photosensitive resin composition and the temporary support or by further providing a protective film (hereinafter, also referred to as a cover film) or the like on the surface of the photosensitive resin composition. The photosensitive transfer material of the present invention preferably further includes a protective film for the photosensitive resin composition layer.

<Photosensitive Transfer Material Production Method>

The photosensitive transfer material of the present invention can be preferably produced by applying and drying a coating fluid for a photosensitive resin composition layer on the temporary support and thus laminating the photosensitive resin composition layer. The production method may further include a step of further laminating a protective film for the photosensitive resin composition layer.

[Pattern Formation Method]

A pattern formation method includes a photosensitive resin composition layer formation step of forming the photosensitive resin composition layer on at least one surface of a substrate using the photosensitive transfer material of the present invention, an exposure step of exposing the photosensitive resin composition layer, and a development step of developing the exposed photosensitive resin composition layer.

An etching method of the present invention includes an etching step of carrying out etching using a pattern produced using the pattern formation method of the present invention as an etching resist and a pattern removal step of removing the pattern after the etching treatment through a chemical treatment.

Hereinafter, regarding a case in which a resist pattern is obtained using the photosensitive transfer material of the present invention as an etching resist (etching pattern), the pattern formation method of the present invention and the etching method of the present invention will be described using a method for forming a transparent electrode pattern in a capacitance-type input device as an example.

(Cover Film Removal Step)

In a case in which the photosensitive transfer material of the present invention includes the cover film, the pattern formation method of the present invention preferably includes a cover film removal step of removing the cover film from the photosensitive transfer material of the present invention.

At this time, in the photosensitive resin composition layer formation step, the photosensitive resin composition layer is preferably formed on at least one surface of a substrate using the photosensitive transfer material of the present invention from which the cover film is removed.

(Photosensitive Resin Composition Layer Formation Step)

The photosensitive resin composition layer formation step is a step of forming the photosensitive resin composition layer on at least one surface of a substrate using the photosensitive transfer material of the present invention. The photosensitive resin composition layer formation step is preferably a step of transferring the photosensitive resin composition of the photosensitive transfer material from which the cover film is removed to the substrate.

At this time, after the photosensitive resin composition of the photosensitive transfer material is laminated on the substrate, the photosensitive resin composition layer can be used after the support (temporary support) is removed or not removed. In a case in which the following exposure is carried out without removing the temporary support, the temporary support is peeled off after exposure. Exposing the photosensitive resin composition layer without removing the temporary support is preferred in terms of the attachment of foreign substances to a hot mask, and exposing the photosensitive resin composition layer after peeling the temporary support off also has a merit since there is no influence on foreign substances in the temporary support.

The photosensitive resin composition is transferred (attached) to the substrate surface by overlying, pressurizing, and heating the photosensitive resin composition on the substrate surface. For the attachment, it is possible to use a well-known laminator such as a laminator, a vacuum laminator, or an auto-cut laminator capable of further increasing the productivity.

(Exposure Step, Development Step, and Other Steps)

As examples of the exposure step, the development step, and other steps, it is possible to preferably use the method described in Paragraphs [0035] to [0051] in JP2006-23696A even in the present invention.

The exposure step is a step of exposing the photosensitive resin composition layer transferred to the substrate.

Specifically, a predetermined mask is disposed above the photosensitive resin composition layer formed on the substrate, and then the photosensitive resin composition layer is exposed through the mask from above the mask.

Here, the light source for the exposure can be appropriately selected from light sources capable of radiating light in a wavelength range (for example, 365 nm, 405 nm, or the like) which is capable of hardening the photosensitive resin composition layer. Specific examples thereof include an ultrahigh-pressure mercury lamp, a high-pressure mercury lamp, a metal halide lamp, and the like. The exposure intensity is generally in a range of approximately 5 mJ/cm$^2$ to 200 mJ/cm$^2$ and preferably in a range of approximately 10 mJ/cm$^2$ to 100 mJ/cm$^2$.

The pattern may be exposed after the pattern is peeled off from the support or the pattern may be exposed before being peeled off from the support and then be peeled off from the support. The pattern may be exposed through the mask or may be digital-exposed using a laser or the like.

The development step also includes, in addition to a narrowly-defined development step of developing the (patterned) exposed photosensitive resin composition layer using a developer so as to obtain a desired pattern, a step of removing other layers which may include the photosensitive transfer material (for example, a thermoplastic resin layer or another intermediate layer). The development step is preferably is preferably the narrowly-defined development step of developing the (patterned) exposed photosensitive resin composition layer using a developer so as to obtain a desired pattern.

The development can be carried out using a developer. There is no particular limitation regarding the developer and well-known developers such as the developers described in JP1993-72724A (JP-H5-72724A) can be used. The developer is preferably a developer exhibiting a development behavior of dissolving the photosensitive resin composition layer and is preferably, for example, a developer including a compound having a pKa in a range of 7 to 13 in a concentration in a range of 0.05 mol/L to 5 mol/L. Furthermore, a small amount of an organic solvent having miscibility with water may be added thereto. Examples of the organic solvent having miscibility with water include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, ε-caprolactone, γ-butyrolactone, dimethyl formamide, dimethylacetamide, hexamethylphosphoramide, ethyl lactate, methyl lactate, ε-caprolactam, N-methyl pyrrolidone, and the like. The concentration of the organic solvent is preferably in a range of 0.1% by mass to 30% by mass.

A well-known surfactant can be further added to the developer. The concentration of the surfactant is preferably in a range of 0.01% by mass to 10% by mass.

The development method may be any of puddle development, shower development, shower and spin development, dip development, and the like. In the shower development, when the developer is sprayed to the exposed photosensitive resin composition through showering, exposed portions in a positive-type photosensitive resin composition can be removed. In addition, after the development, it is preferable to remove development residue by spraying a cleaning agent or the like through showering and rubbing the photosensitive resin composition layer with a brush or the like. The temperature of the developer is preferably in a range of 20° C. to 40° C. and the pH of the developer is preferably in a range of 8 to 13.

The pattern formation method of the present invention preferably further includes a post-baking step of heating a pattern including the photosensitive resin composition layer obtained by means of the development.

The inclusion of the post-baking step can accelerate the detachment of a protected group by an acid in the photosensitive resin composition layer, which is preferable. In the constituent unit (a1) that includes a group in which an acid group is protected by an acid-decomposable group in the photosensitive transfer material of the present invention, a carboxyl group is preferably acetal-protected since the activation energy for the detachment of the protected group is decreased and the heating treatment after the exposure is avoided.

The heating for the post-baking is preferably carried out in an environment of 0.08 atm to 1.2 atm and more preferably carried out in an environment of 0.5 atm or more. Meanwhile, the heating is more preferably carried out in an environment of 1.1 atm or less and particularly preferably carried out in an environment of 1.0 atm or less. Furthermore, the heating is particularly preferably carried out in an environment of approximately 1 atm (atmosphere) since there is no need of using a special decompression device and the manufacturing costs can be reduced.

The temperature of the post-baking is preferably in a range of 110° C. to 170° C., more preferably in a range of 120° C. to 160° C., and particularly preferably in a range of 130° C. to 150° C.

The time of the post-baking is preferably in a range of 1 minute to 30 minutes, more preferably in a range of 2 minutes to 10 minutes, and particularly preferably in a range of 2 minutes to 4 minutes.

The post-baking may be carried out in an air environment or a nitrogen-substituted environment, but is particularly preferably carried out in an air environment since there is no need of using a special decompression device and the manufacturing costs can be reduced.

The pattern formation method of the present invention may include a post exposure step and other steps. The post exposure step is a step of exposing the full surface of the developed photosensitive resin composition after the development step and before the post-baking step.

(Etching)

An etching method of the present invention includes an etching step of carrying out etching using the pattern produced using the pattern formation method of the present invention as an etching resist.

In the etching, etching and resist peeling can be carried out by applying the well-known method described in Paragraphs [0048] to [0054] and the like in JP2010-152155A.

Examples of the etching method include an ordinarily-performed wet etching method in which a subject is immersed in an etchant. As the etchant used in the wet etching, an acid-type etchant or an alkali-type etchant may be appropriately selected depending on the etching subject. Examples of the acid-type etchant include aqueous solutions of an acidic component such as hydrochloric acid, sulfuric acid, hydrofluoric acid, or phosphoric acid, mixed aqueous solutions of an acidic component and a salt such as ferric chloride, ammonium fluoride, or potassium permanganate, and the like. As the acid component, a combination of a plurality of acidic components may be used. Examples of the alkali-type etchant include aqueous solutions of an alkali component such as a salt of an organic amine such as sodium hydroxide, potassium hydroxide, ammonium, an organic amine, or tetramethyl ammonium hydroxide, mixed aqueous solutions of an alkali component and a salt such as potassium permanganate, and the like. As the alkali component, a combination of a plurality of alkali components may be used.

The temperature of the etchant is not particularly limited and is preferably 45° C. or lower. Since a resin pattern used as an etching mask (etching pattern) in the present invention is formed using the above-described photosensitive resin composition, the resin pattern exhibits particularly excellent resistance against the acidic or alkaline etchant in the above-described temperature range. Therefore, the peeling of the resin pattern during the etching step is prevented and portions that are not present under the resin pattern are selectively etched.

After the etching, in order to prevent line contamination, a cleaning step and a drying step may be carried out as necessary. The cleaning step may be carried out by, for example, cleaning the substrate using pure water at room temperature for 10 seconds to 300 seconds and the drying step may be carried out by using an air blower and appropriately adjusting the air blowing pressure (in a range of approximately 0.1 kg/cm$^2$ to 5 kg/cm$^2$).

The etching method of the present invention includes a step of removing the pattern after the etching step (hereinafter, also referred to as the resin pattern) through a chemical treatment.

Next, the resin pattern peeling method is not particularly limited and examples thereof include a method in which the substrate is immersed for 5 minutes to 30 minutes in a peeling fluid under stirring at a temperature in a range of 30° C. to 80° C. and preferably in a range of 50° C. to 80° C. The resin pattern used as the etching mask in the present invention exhibits excellent chemical resistance at 45° C. or lower as described above and also has a property of swelling by an alkaline peeling fluid when the chemical temperature reaches 50° C. or higher. Due to the above-described property, when a peeling step is carried out using a peeling fluid of 50° C. to 80° C., the step time is shortened, creating an advantage that the peeling residue of the resin pattern becomes little. That is, when the chemical temperature is made to be different between the etching step and the peeling step, the resin pattern used as the etching mask in the present invention exhibits favorable chemical resistance in the etching step and exhibits a favorable peeling property in the peeling step, whereby the conflicting characteristics such as the chemical resistance and the peeling property can be both satisfied.

Examples of the peeling fluid include peeling fluids obtained by dissolving an inorganic alkaline component such as sodium hydroxide or potassium hydroxide or an organic alkaline component such as a tertiary amine or a quaternary ammonium salt in water, dimethyl sulfoxide, N-methylpyrrolidone, or a mixed solution thereof. The resin pattern may be peeled off using the above-described peeling fluid through a spray method, a shower method, a paddle method, or the like.

(Method for Forming Electrode Pattern in Capacitance-type Input Device)

A case in which an electrode pattern in a capacitance-type input device is obtained using the photosensitive transfer material of the present invention as an etching resist (etching pattern) will be described.

The capacitance-type input device includes a front plate and at least the following (1) to (4) elements on a non-contact surface side of the front plate, and at least one of the (2) and (3) is preferably formed using the pattern formation method of the present invention and the etching method of the present invention.

(1) A mask layer (2) A plurality of first transparent electrode patterns formed of a plurality of pad portions extending in a first direction through connection portions (3) A plurality of second electrode patterns formed of a plurality of pad portions which are electrically insulated from the first transparent electrode patterns and extend in a direction orthogonal to the first direction (4) Insulating layers that electrically insulate the first transparent electrode patterns and the second electrode patterns In addition, in the capacitance-type input device, a second electrode pattern may be a transparent electrode pattern. Hereinafter, in some cases, a case in which the second electrode pattern is a transparent electrode pattern will be described, but the present invention is not limited to such an aspect.

Furthermore, the capacitance-type input device may further include the (5), and at least one of the (2), (3), or (5) is preferably formed using the pattern formation method of the present invention and the etching method of the present invention.

(5) A conductive element which is electrically connected to either or both the first transparent electrode patterns and the second electrode patterns and is a separate element from the first transparent electrode patterns and the second electrode patterns In the capacitance-type input device, a transparent protective layer is preferably further installed so as to cover all or part of the (1) to (5) elements.

First, the constitution of the capacitance-type input device will be described. FIG. 1 is a sectional view illustrating the constitution of a capacitance-type input device. In FIG. 1, the capacitance-type input is made up of a front plate 1, a mask layer 2, first transparent electrode patterns 3, second transparent electrode patterns 4, insulating layers 5, a conductive element 6, and a transparent protective layer 7.

The front plate 1 is made of a translucent substrate such as a glass substrate and reinforced glass or the like represented by GORILLA glass manufactured by Corning Inc. can be used. In FIG. 1, a side of the front plate 1 on which the respective elements are provided will be referred to as a non-contact surface. In the capacitance-type input device 10, an input operation is carried out by touching a contact surface (a surface opposite to the non-contact surface) of the front plate 1 with a finger or the like. Hereinafter, the front plate will be, in some cases, referred to as the "base material".

Figure 2:
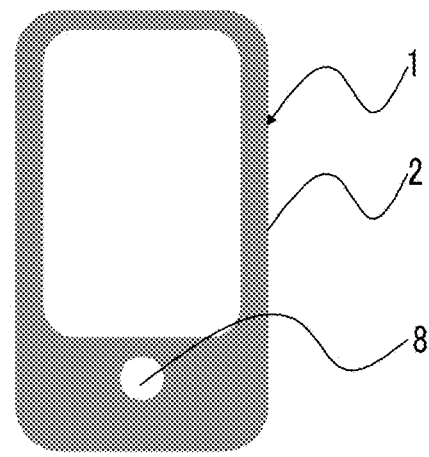
FIG. 2 is an explanatory view illustrating an example of a front plate in the present invention.

The mask layer 2 is provided on the non-contact surface of the front plate 1. The mask layer 2 is a frame-like pattern around a display region formed on the non-contact surface side of the touch panel front plate and is formed to hide wires and the like. In the capacitance-type input device 10, as illustrated in FIG. 2, the mask layer 2 is provided so as to cover a part of a region (a region other than an input surface in FIG. 2) of the front plate 1. Furthermore, an opening portion 8 can be provided in a part of the front plate 1 as illustrated in FIG. 2. In the opening portion 8, it is possible to install a press-type mechanical switch.

On the contact surface of the front plate 1, a plurality of the first transparent electrode patterns 3 formed of a plurality of pad portions extending in a first direction through connection portions, a plurality of the second transparent electrode patterns 4 formed of a plurality of pad portions which are electrically insulated from the first transparent electrode patterns 3 and extend in a direction orthogonal to the first direction, and the insulating layers 5 that electrically insulates the first transparent electrode patterns 3 and the second transparent electrode patterns 4 are formed. The first transparent electrode pattern 3, the second transparent electrode pattern 4, and the conductive element 6 described below can be produced using a translucent conductive metal oxide film such as indium tin oxide (ITO) or indium zinc oxide (IZO). Examples of the metal film include ITO films; metal films of Al, Zn, Cu, Fe, Ni, Cr, Mo, and the like; metal oxide films such as $SiO_2$; and the like. At this time, the film thicknesses of the respective elements can be set in a range of 10 nm to 200 nm. In addition, it is also possible to reduce electrical resistance by turning an amorphous ITO film into a polycrystalline ITO film through firing.

The first transparent electrode pattern 3, the second transparent electrode pattern 4, and the conductive element 6 described below are preferably formed using the photosensitive transfer material of the present invention as the etching resist (etching pattern). Additionally, it is also possible to manufacture the elements using a photosensitive transfer material including a photosensitive resin composition in which the conductive fiber is used. In a case in which the first conductive patterns and the like are formed using ITO or the like, it is possible to reference Paragraphs [0014] to [0016] and the like in JP4506785B.

In addition, either or both the first transparent electrode pattern 3 and the second transparent electrode pattern 4 can be installed astride in regions of both the non-contact surface of the front plate 1 and the surface opposite to the front plate 1 of the mask layer 2. FIG. 1 illustrates the second transparent electrode pattern installed astride in regions of both the non-contact surface of the front plate 1 and the surface opposite to the front plate 1 of the mask layer 2.

Figure 3:
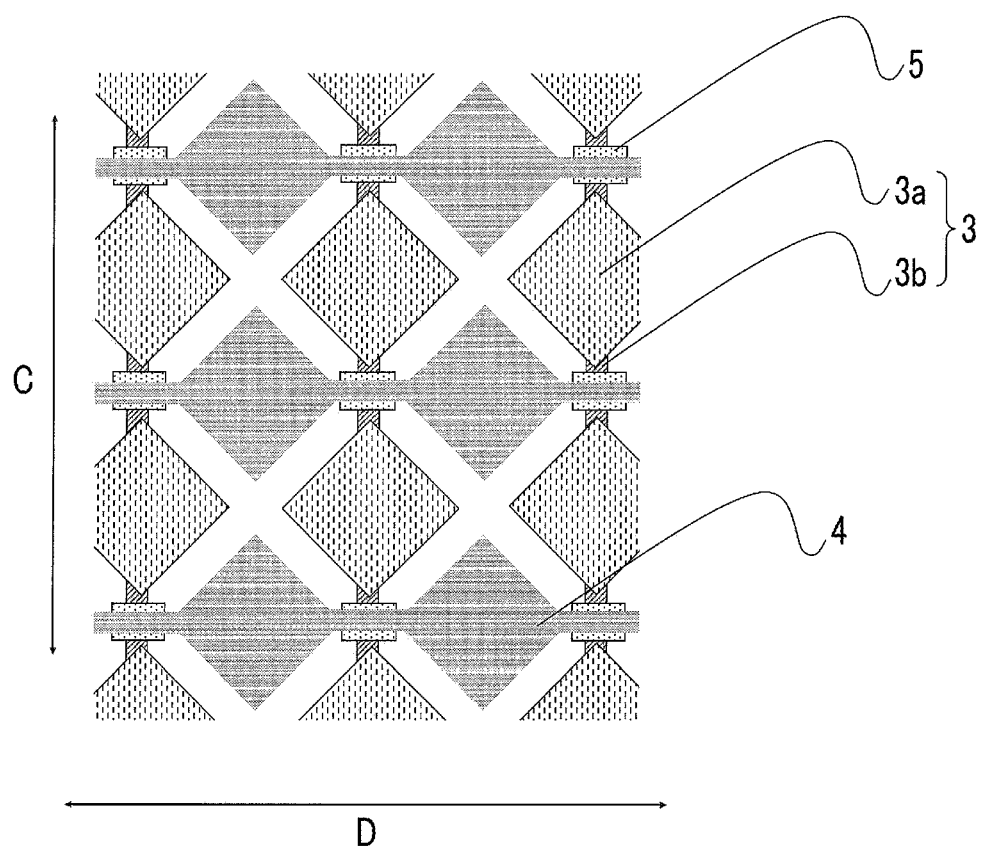
FIG. 3 is an explanatory view illustrating an example of first transparent electrode patterns and second transparent electrode patterns in the present invention.

The first transparent electrode pattern 3 and the second transparent electrode pattern 4 will be described using FIG. 3. FIG. 3 is an explanatory view illustrating an example of the first transparent electrode patterns and the second transparent electrode patterns in the present invention. As illustrated in FIG. 3, the first transparent electrode pattern 3 is formed of a pad portion 3a extending in a first direction through a connection portion 3b. In addition, the second transparent electrode patterns 4 are electrically insulated from the first transparent electrode patterns 3 through the insulating layers 5 and are made up of a plurality of pad portions that extend in a direction orthogonal to the first direction (the second direction in FIG. 3). In a case in which the first transparent electrode patterns 3 are formed, it is possible to integrally form the pad portions 3a and the connection portions 3b or to produce the connection portions 3b alone and integrally produce (pattern) the pad portions 3a and the second transparent electrode patterns 4. In a case in which the pad portions 3a and the second transparent electrode patterns 4 are integrally produced (patterned), a part of the connection portion 3b and a part of the pad portion 3a are coupled together as illustrated in FIG. 3 and the respective layers are formed so that the first transparent electrode pattern 3 and the second transparent electrode pattern 4 are electrically insulated from each other through the insulating layers 5.

In FIG. 1, on the surface of the mask layer 2 opposite to the front plate 1, the conductive element 6 is installed. The conductive element 6 is electrically connected either or both the first transparent electrode pattern 3 and the second transparent electrode pattern 4 and is a separate element from the first transparent electrode patterns 3 and the second transparent electrode patterns 4. FIG. 1 illustrates the conductive element 6 connected to the second transparent electrode pattern 4.

In addition, in FIG. 1, the transparent protective layer 7 is installed so as to cover all the constituents. The transparent protective layer 7 may be constituted so as to cover only a part of the constituents. The insulating layers 5 and the transparent protective layer 7 may be made of the same material or different materials. The material constituting the insulating layers 5 and the transparent protective layer 7 preferably has high surface hardness and high heat resistance and a well-known photosensitive siloxane resin material, acryl resin material, or the like can be used.

In the manufacturing method of the capacitance-type input device, at least one of the first transparent electrode pattern 3, the second transparent electrode pattern 4, or the conductive element 6 is preferably formed through an etching treatment using the photosensitive transfer material of the present invention as the etching resist (etching pattern). In addition, at least one element of the black mask layer 2, the insulating layers 5, or, as necessary, the transparent protective layer 7 is also preferably formed using a photosensitive film including the temporary support, the thermoplastic resin layer, and the photohardenable resin layer in this order.

At least one of the first transparent electrode pattern 3, the second transparent electrode pattern 4, or the conductive element 6 is preferably formed through an etching treatment using the photosensitive transfer material of the present invention as the etching resist (etching pattern).

In a case in which the first transparent electrode pattern 3, the second transparent electrode pattern 4, and the separate conductive element 6 are formed through an etching treatment, first, at least an inorganic insulating layer is provided in portions in which the black mask layer 2 is provided on the non-contact surface of the front plate 1 on which the black mask layer 2 and the like are formed and a transparent electrode layer such as ITO is formed on the non-contact surface of the front plate 1 or the inorganic insulating layer through sputtering. Next, an etching pattern is formed on the transparent electrode layer using the photosensitive transfer material of the present invention including a conductive photohardenable resin layer as the photohardenable resin layer through exposure and development. After that, the transparent electrode layer is etched so as to pattern the transparent electrode and the etching pattern is removed, whereby the first transparent electrode patterns 3 and the like can be formed.

In a case in which the first transparent electrode pattern 3, the second transparent electrode pattern 4, and the separate conductive element 6 are formed using the photosensitive film including a conductive photohardenable resin layer, the first transparent electrode pattern, the second transparent electrode pattern, and the separate conductive element can be formed by providing at least an inorganic insulating layer in portions in which the black mask layer 2 is provided on the surface of the front plate 1 and transferring the conductive photohardenable resin layer onto the non-contact surface of the front plate 1 or the inorganic insulating layer.

The mask layer 2, the insulating layers 5, and the transparent protective layer 7 can be formed by transferring a photohardenable resin layer to the front plate 1 using a photosensitive film. For example, in a case in which the black mask layer 2 is formed, the black mask layer can be formed by transferring the black photohardenable resin layer to the surface of the front plate 1 using the photosensitive film including a black photohardenable resin layer as the photohardenable resin layer. In a case in which the insulating layers 5 are formed, the insulating layers can be formed by transferring the photohardenable resin layer to the surface of the front plate 1 on which the first or second transparent electrode patterns are formed using the photosensitive film including an insulating photohardenable resin layer as the photohardenable resin layer. In a case in which the transparent protective layer 7 is formed, the transparent protective layer can be formed by transferring the photohardenable resin layer to the surface of the front plate 1 on which the respective elements are formed using the photosensitive film including a transparent photohardenable resin layer as the photohardenable resin layer.

Figure 4:
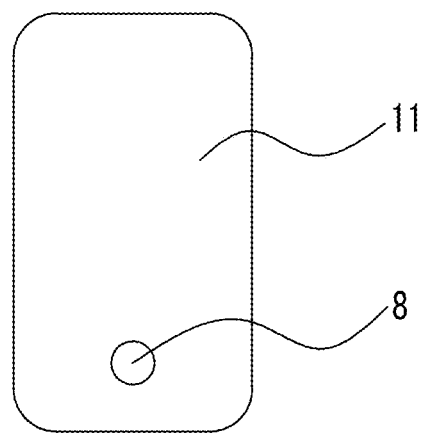
FIG. 4 is a top view illustrating an example of reinforced glass including an opening portion formed therein.
Figure 5:
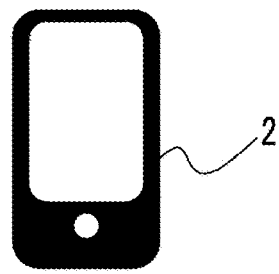
FIG. 5 is a top view illustrating an example of the front plate on which a mask layer is formed.
Figure 6:
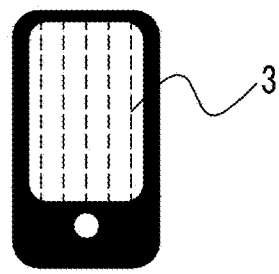
FIG. 6 is a top view illustrating an example of the front plate on which the first transparent electrode patterns are formed.
Figure 7:
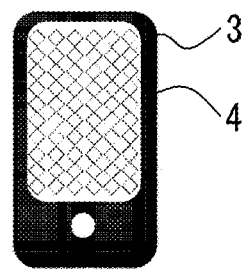
FIG. 7 is a top view illustrating an example of the front plate on which first and second transparent electrode patterns are formed.
Figure 8:
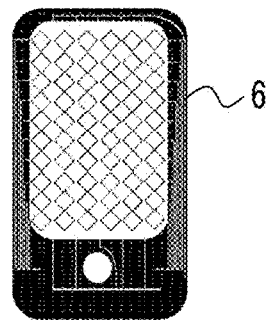
FIG. 8 is a top view illustrating an example of the front plate on which a conductive element other than the first and second transparent electrode patterns is formed.

Examples of the aspect of the capacitance-type input device can include the aspects of FIGS. 4 to 8. FIG. 4 is a top view illustrating an example of reinforced glass 11 including the opening portion 8 formed therein. FIG. 5 is a top view illustrating an example of the front plate on which the mask layer 2 is formed. FIG. 6 is a top view illustrating an example of the front plate on which the first transparent electrode patterns 3 are formed. FIG. 7 is a top view illustrating an example of the front plate on which first transparent electrode patterns 3 and the second transparent electrode patterns 4 are formed. FIG. 8 is a top view illustrating an example of the front plate on which the conductive element 6 other than the first and second transparent electrode patterns is formed. These are simply examples of the embodiment of the above description and the scope of the present invention should not be interpreted to be limited by these drawings.

In a case in which the transparent electrode patterns, other conductive elements, and the like are formed using the photosensitive transfer material of the present invention as an etching resist (etching pattern), the patterns can be obtained by laminating the photosensitive transfer material on the base material, then, exposing the photosensitive transfer material in a necessary pattern shape, and removing exposed portion through a development treatment in the case of a positive-type material. At this time, in the development, the thermoplastic resin layer and the photosensitive resin composition layer may be developed and removed using separate fluids or may be removed using the same fluid. A well-known development facility such as a brush or a high-pressure jet may be combined as necessary. After the development, post exposure and post-baking may also be carried out as necessary.

In addition, in order to increase the adhesiveness of the photosensitive resin composition layer using a laminator in the subsequent transferring step, it is possible to carry out a surface treatment on the non-contact surface of the base material (front plate) in advance. As the surface treatment, a surface treatment in which a silane compound is used (silane coupling treatment) is preferably carried out. The silane coupling agent preferably has a functional group that interacts with photosensitive resins. For example, the silane coupling fluid (an aqueous solution of 0.3% by mass of N-β(aminoethyl)γ-aminopropyltrimethoxysilane, trade name: KBM603, manufactured by Shin-Etsu Chemical Co., Ltd.) is sprayed for 20 seconds through showering and the non-contact surface is cleaned with pure water through showering. After that, a reaction is caused by heating. A heating vessel may be used or the reaction can be accelerated by heating the substrate of the laminator in advance.

<<Capacitance-type Input Device and Image Display Device Including Capacitance-type Input Device as Constituent>>

To the capacitance-type input device obtained using the pattern formation method of the present invention and an image display device including the capacitance-type input device as a constituent, it is possible to apply the constitutions disclosed in "The Advanced Touch Panel Technologies" (published by Techno Times Co., Ltd. on Jul. 6, 2009) edited by Yuji Mitani, "Technologies and Development of Touch Panels" by CMC Publishing Co., Ltd. (December 2004), FPD international 2009 Forum T-11 lecture textbook, Cypress Semiconductor Corporation Application Note AN2292, and the like.

EXAMPLES

Hereinafter, the present invention will be more specifically described using examples. Materials, amounts used, fractions, treatment contents, treatment orders, and the like described in the following examples can be appropriately changed within the scope of the gist of the present invention. Therefore, the scope of the present invention is not limited to specific examples described below. Meanwhile, "parts" and "%" are mass-based unless particularly otherwise described.

In the following synthesis examples, the following symbols respectively represent the following compounds.
MATHF: 2-tetrahydrofuranyl methacrylate (synthetic product)
MATHF: 1-ethoxyethyl methacrylate (manufactured by Wako Pure chemical Industries, Ltd.)
PHS: Parahydroxystyrene
PHS-EVE: 1-ethoxyethyl protector of parahydroxystyrene
PHS-THF: 2-tetrahydrofuranyl protector of parahydroxystyrene
MAA: Methacrylic acid (manufactured by Wako Pure chemical Industries, Ltd.)
HEMA: Hydroxyethyl methacrylate (manufactured by Wako Pure chemical Industries, Ltd.)
BzMA: Benzyl methacrylate
EDM: Diethylene glycol ethyl methyl ether
PGMEA: propylene glycol monomethyl ether acetate Synthesis Example 1

Synthesis of PHS-EVE

An alkali-soluble resin (20 g, VP-8000, manufactured by Nippon Soda Co., Ltd.) and propylene glycol monomethyl ether acetate (PGMEA, 320 g) were dissolved in a flask and were distilled at a reduced pressure, and water and PGMEA were azeotropically distilled away. After it was confirmed that the water content was sufficiently decreased, ethyl vinyl ether (24 g) and p-toluene sulfonate (0.35 g) were added thereto and the components were stirred at room temperature for 1 hour. Triethylamine (0.28 g) was added thereto so as to stop the reaction. After ethyl acetate was added to the reaction solution and the reaction solution was further cleaned with water, ethyl acetate, water, and PGMEA of the azeotropic component were distilled away through reduced-pressure distillation, thereby obtaining a polymer PHS-EVE which was an alkali-soluble resin protected by an acid-decomposable group. The weight-average molecular weight of the obtained resin was 11,000. In addition, the polydispersity was 1.13.

The structure of the polymer PHS-EVE was 1-ethoxyethyl protector of p-hydroxystyrene/p-hydroxystyrene copolymer (30 mol %/70 mol %).

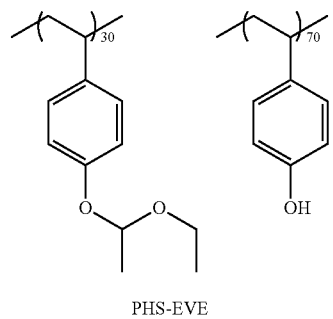

PHS-EVE

Synthesis Example 2

Synthesis of PHS-THF

An alkali-soluble resin (15.6 g, VP-8000, manufactured by Nippon Soda Co., Ltd.) and propylene glycol monomethyl ether acetate (PGMEA, 100 g) were dissolved in a flask and were distilled at a reduced pressure, and water and PGMEA were azeotropically distilled away. After it was confirmed that the water content was sufficiently decreased, 2,3-dihydrofuran (2.7 g) and p-toluene sulfonate (0.015 g) were added thereto and the components were stirred at room temperature for 2 hours. Triethylamine (0.090 g) was added thereto so as to stop the reaction. After ethyl acetate was added to the reaction solution and the reaction solution was further cleaned with water, ethyl acetate and water were distilled away through reduced-pressure distillation, thereby obtaining a polymer PHS-THF which was an alkali-soluble resin having a protection ratio of 25 mol %. The weight-average molecular weight of the obtained resin was 12,000. In addition, the polydispersity was 1.13.

The structure of the polymer PHS-THF was 2-tetrahydrofuranyl protector of p-hydroxystyrene/p-hydroxystyrene copolymer (30 mol %/70 mol %).

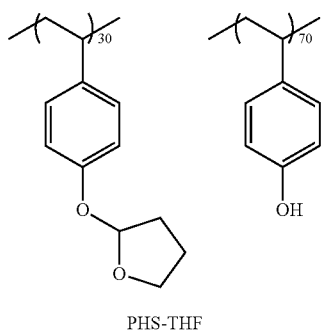

PHS-THF

Synthesis Example 3

Synthesis of Polymer Novolac-EVE (1-Ethoxyethyl Protector)

A polymer was synthesized using the same method as in Example 1 of JP2003-98671A. The weight-average molecular weight of the obtained polymer novolac-EVE was 5,000. In addition, the polydisersity was 7.0.

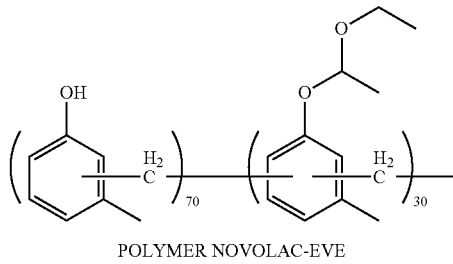

POLYMER NOVOLAC-EVE

Synthesis Example 4

Synthesis of MAEVE Copolymer

A MAEVE copolymer was synthesized as described below.

Phenothiazine (0.5 parts) was added to ethyl vinyl ether (144.2 parts, 2 molar equivalent), methacylic acid (86.1 parts, 1 molar equivalent) was added dropwise while the inside of the reaction system was cooled to 10° C. or lower, and then the components were stirred at room temperature (25° C.) for 4 hours. Pyridinium p-toluene sulfonate (5.0 parts) was added thereto, the obtained mixture was stirred at room temperature for 2 hours, and then was left to stand one night at room temperature. Sodium hydrogen carbonate (5 parts) and sodium sulfate (5 parts) were added to the reaction solution, the components were stirred at room temperature for 1 hour, insoluble substances were filtered and were condensed at a reduced pressure at 40° C. or lower, and the yellow oily substance of the residue was distilled at a reduced pressure, thereby obtaining methacrylic acid 1-ethoxyethyl (MAEVE, 134.0 parts) having a boiling point (bp.) in a range of 43° C. to 45° C. and a distillate fraction of 7 mmHg as a colorless oily substance.

A mixed solution of the obtained methacrylic acid 1-ethoxyethyl (63.28 parts (0.4 molar equivalent)), BzMA (52.83 parts (0.3 molar equivalent)), MAA (8.61 parts (0.1 molar equivalent)), HEMA (26.03 parts (0.2 molar equivalent)), and EDM (110.8 parts) was heated at 70° C. under a nitrogen stream. While the mixed solution was stirred, a radical polymerization initiator V-65 (trade name, manufactured by Wako Pure chemical Industries, Ltd., 4 parts) and EDM (100.0 parts) was added dropwise for 2.5 hours. After the dropwise addition, a reaction was caused at 70° C. for 4 hours, thereby obtaining an EDM solution (concentration of solid contents: 40%) of a MAEVE copolymer synthesized using MAEVE as one of monomers.

The weight-average molecular weight of the obtained MAEVE copolymer measured through gel permeation chromatography (GPC) was 15,000.

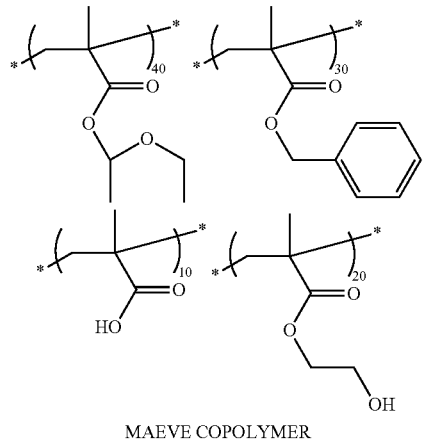

MAEVE COPOLYMER

Synthesis Example 5

Synthesis of MATHF Copolymer

Methacrylic acid (86 g, 1 mol) was cooled to 15° C., and camphorsulfonic acid (4.6 g, 0.02 mol) was added to the methacrylic acid. 2-Dihydrofuran (71 g, 1 mol, 1.0 equivalent) was added dropwise to the solution. After the solution was stirred for 1 hour, saturated sodium hydrogen carbonate (500 mL) was added thereto, the mixture was extracted using ethyl acetate (500 mL), was dried using magnesium sulfate, and then insoluble substances were filtered and were condensed at a reduced pressure at 40° C. or lower, thereby obtaining methacrylic acid tetrahydro-2H-furan-2-yl (MATHF, 125 g) having a boiling point (bp.) in a range of 54° C. to 56° C. and a distillate fraction of 3.5 mmHg as a colorless oily substance (yield of 80%).

A MATHF copolymer was synthesized in the same manner as in the synthesis of the MAEVE copolymer of Synthesis Example 4 except for the fact that the obtained methacrylic acid tetrahydro-2H-furan-2-yl was used in place of the methacrylic acid 1-ethoxyethyl.

The weight-average molecular weight of the obtained MATHF copolymer measured through gel permeation chromatography (GPC) was 14,000.

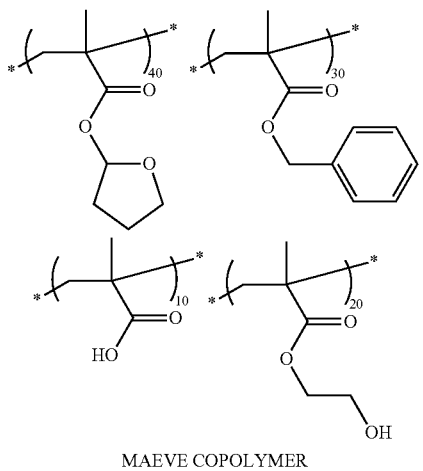

MAEVE COPOLYMER (Binders Other than Those Described in Synthesis Examples)

PHS: Parahydroxystyrene having the following structure

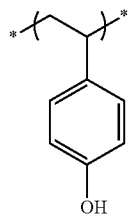

Novolac: A novolac resin having the following structure (manufactured by Meiwa Plastic Industries, Ltd., a polymer (A) that does not include a constituent unit having a group in which an acid group is protected by an acid-decomposable group)

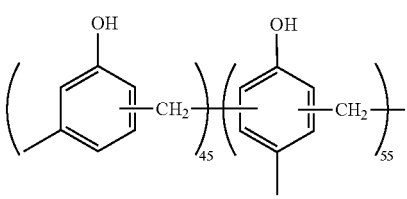

(Monomer)

Monomer A: A compound having the following structure synthesized according to the method described in Paragraphs [0126] to [0130] of JP4654938B (and forming a crosslinking structure after being polymerized).

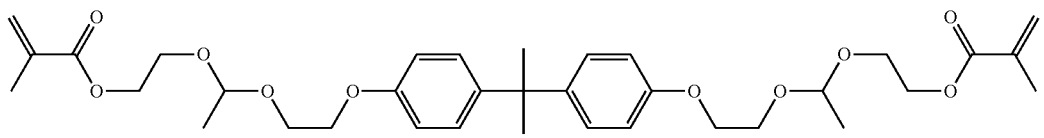 [SMILES: C=C(C)C(=O)OCCOC(C)OCCOc1ccc(C(C)(C)c2ccc(OCCOC(C)OCCOC(=O)C(=C)C)cc2)cc1]

Examples 1 to 16 and Comparative Examples 1 and 2

1. Preparation of Photosensitive Resin Composition (Preparation of Photosensitive Resin Composition)

Individual components described in Table 1 below were dissolved and mixed together (a surfactant 1 (F-554) which was added to all photosensitive resin compositions is not shown in Table 1 below), and a mixture was filtered using a polytetrafluoroethylene filter having a pore diameter of 0.2 μm, thereby obtaining a photosensitive resin composition coating fluid. The photosensitive resin composition has the solid content composition shown in Table 2 below. Before the filtration, the mixture was dissolved in PGMEA to prepare a solution having a solid content of 10% by weight.

The details of the abbreviations representing individual compounds used in examples and comparative examples are as described below.

(Photoacid Generator)

PAG-1: A compound having the following structure synthesized according to the method described in Paragraph [0108] of JP2002-528451A (Ts represents p-toluene sulfonate).

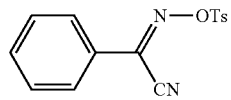

NAI-105: Trifluoromethanesulfonate-1,8-naphthalimide having the following structure (Photosensitizing Agent)

Naphthoquinone diazide (NQD): A compound having the following structure (producer: manufactured by Daito Chemix Corporation, product number: DTEP-250)

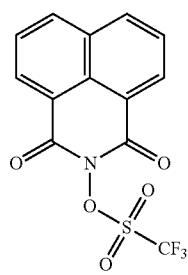 [SMILES: O=C1c2cccc3cccc(c23)C(=O)N1OS(=O)(=O)C(F)(F)F]

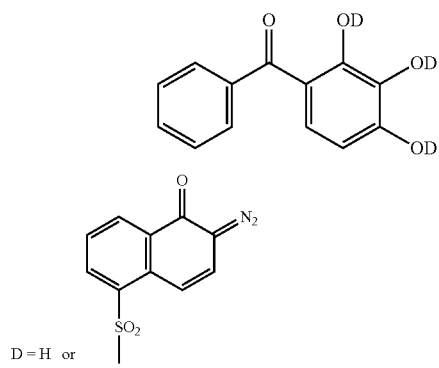

D = H or (Thermopolymerization Initiator)

Initiator 1: 2,2-Azobisisobutyronitrile (AIBN) having the following structure

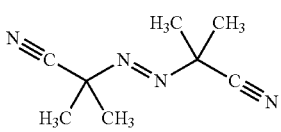

(Sensitizer)

Sensitizer 1: Dibutoxyanthracene having the following structure (producer: manufactured by Kawasaki Kasei Chemicals, product number: 9,10-dibutoxyanthracene)

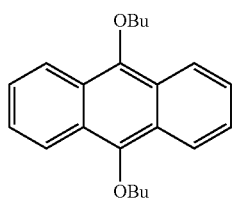

(Basic Compound)

Basic compound 1: A compound having the following structure (producer: Toyo Kasei Co., Ltd., product number: CMTU)

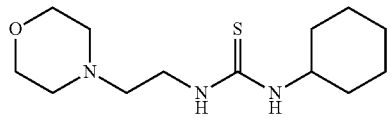 [SMILES: S=C(NCCN1CCOCC1)NC1CCCCC1]

(Heterocyclic Compound)

Heterocyclic compound 1: DENACOL EX-321L (manufactured by Nagase ChemiteX Corporation)

Heterocyclic compound 2: 3-Glycidoxypropyltrimethoxysilane having the following structure (trade name, KBM-403, manufactured by Shin-Etsu Chemical Co., Ltd.)

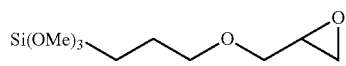

(Surfactant)

Surfactant 1: F-554, a perfluoroalkyl group-containing nonionic surfactant expressed by the following structural formula (manufactured by DIC Corporation)

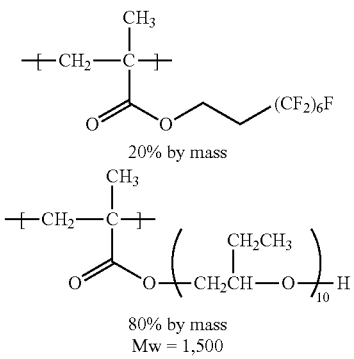

2. Production of Photosensitive Transfer Material

The photosensitive resin compositions of the examples and the comparative examples having compositions shown in Tables 1 and 2 below were applied onto 75 μm-thick polyethylene terephthalate film supports (temporary supports) using a slit-shaped nozzle so as to obtain a dried film thickness of 2.0 μm and were dried in a convection oven at 100° C. for two minutes. In the end, a polyethylene film (manufactured by Tredegar Co., Ltd., OSM-N) was pressure-bonded thereto as the protective film. Therefore, photosensitive transfer materials of Examples 1 to 16 and Comparative Examples 1 and 2 in which the temporary support, the photosensitive resin composition layer, and the protective film were integrated together were produced.

[Evaluation]

The photosensitive transfer materials of the respective examples and the respective comparative examples were evaluated using methods described in the following evaluation methods. The obtained results are shown in Table 1 below.

<Substrates Used>

As copper (Cu) thin film-attached PET substrates which were substrates used in individual evaluations, Cu-attached PET produced in a thickness of 500 nm on 188 μm-thick polyethylene terephthalate (PET) substrates using a sputtering method were used. Before use, the substrates were washed with 1N of hydrochloric acid at room temperature for 30 seconds, thereby removing oxides on the surface.

<Evaluation of Tackiness>

The surface of the produced photosensitive transfer resin material was pressed with a finger, and 1 point was given when tackiness was felt and 5 point was given when no tackiness was felt.

<Evaluation of Sensitivity>

The photosensitive transfer material was laminated on the Cu-attached PET substrate at a laminator roll temperature of 130° C., thereby producing a photosensitive transfer material-attached glass substrate. The produced photosensitive transfer material-attached glass substrate was exposed through a mask with the PET temporary support attached thereto/the PET temporary support was peeled off/the photosensitive transfer material-attached glass substrate was developed, and the sensitivity was evaluated using an exposure intensity at which the line and space pattern reached exactly 10 μm as the optimal exposure intensity.

Point 1: The exposure intensity of 100 mJ/cm$^2$ or more was required

Point 2: The exposure intensity in a range of 50 mJ/cm$^2$ to less than 100 mJ/cm$^2$ was required Point 3: The exposure intensity in a range of 20 mJ/cm$^2$ to less than 50 mJ/cm$^2$ was required Point 4: The exposure intensity in a range of 10 mJ/cm$^2$ to less than 20 mJ/cm$^2$ was required Point 5: The exposure intensity of less than 10 mJ/cm$^2$ was required <Evaluation of Resolution>

The photosensitive transfer material was laminated on the Cu-attached PET substrate at a laminator roll temperature of 130° C., thereby producing a photosensitive transfer material-attached glass substrate. The produced photosensitive transfer material-attached glass substrate was exposed through a mask with the PET temporary support attached thereto/the PET temporary support was peeled off/the photosensitive transfer material-attached glass substrate was developed, and the resolution was evaluated using the smallest pattern out of the line and space patterns which could be resolved.

Point 1: The resolution was 5 μm or more

Point 2: A pattern of 3.0 μm could be resolved but a pattern of 2.5 μm could not be resolved Point 3: A pattern of 2.5 μm could be resolved but a pattern of 2.0 μm could not be resolved Point 4: A pattern of 2.0 μm could be resolved but a pattern of 1.5 μm could not be resolved Point 5: A pattern of 1.5 μm could be resolved <Evaluation of Heat-resistant Rectangular Properties>

The photosensitive transfer material was laminated on the Cu-attached PET substrate at a laminator roll temperature of 130° C., thereby producing a photosensitive transfer material-attached glass substrate. The produced photosensitive transfer material-attached glass substrate was exposed through a mask with the PET temporary support attached thereto/the PET temporary support was peeled off/the photosensitive transfer material-attached glass substrate was developed. After that, the photosensitive transfer material-attached glass substrate was post-baked at 140° C. for 3 minutes, and the rectangular properties of the shape of the post-baked line and space pattern of 3 μm were evaluated.

Point 1: The sectional shape was a dome shape, did not have any edges, and the taper angle was less than 45°

Point 2: The sectional shape was a dome shape, did not have any edges, and the taper angle was in a range of 450 to less than 60°

Point 3: The sectional shape was a dome shape, did not have any edges, and the taper angle was in a range of 60° to less than 75°

Point 4: The sectional shape had edges and the taper angle was in a range of 60° to less than 75°

Point 5: The sectional shape had edges and the taper angle was 75° or more

<Evaluation of Line Width Stability>

The photosensitive transfer material was laminated on the Cu-attached PET substrate at a laminator roll temperature of 130° C., thereby producing a photosensitive transfer material-attached glass substrate. The produced photosensitive transfer material-attached glass substrate was exposed through a mask with the PET temporary support attached thereto at an exposure intensity at which a 10 μm line and space pattern reached exactly 10 μm/the PET temporary support was peeled off/the photosensitive transfer material-attached glass substrate was developed. Ten line and space pattern-attached substrates as described above were prepared, 10 μm-line widths were measured at 10 positions in each of the substrates using an optical measurement instrument ZYGO New View 7200 (manufactured by ZYGO Corporation), and the standard deviation (σ) of a total of 100 actually-measured line widths was computed. The evaluation standards are as described below.

1: The standard deviation σ was 0.4 μm or more

2: The standard deviation σ was in a range of 0.25 μm to less than 0.4 μm

3: The standard deviation σ was in a range of 0.15 μm to less than 0.25 μm

4: The standard deviation σ was in a range of 0.1 μm to less than 0.15 μm

5: The standard deviation σ was less than 0.1 μm

<Evaluation of Etchant Resistance>

The photosensitive transfer material was laminated on the Cu-attached PET substrate at a laminator roll temperature of 130° C., thereby producing a photosensitive transfer material-attached glass substrate. The produced photosensitive transfer material-attached glass substrate was exposed through a mask having a transmitting portion with a line width of 10 μm with the PET temporary support attached thereto/the PET temporary support was peeled off/the photosensitive transfer material-attached glass substrate was developed. After that, the photosensitive transfer material-attached glass substrate was post-baked at 140° C. for 3 minutes and was immersed in a copper etchant (ADEKATECH DP manufactured by ADEKA Corporation, a liquid mixture of A liquid/B liquid/pure water=1/2/10 (mass ratio)) at 35° C. for five minutes, and the peeling of resist lines was evaluated. 5 Point was given to a photosensitive transfer material-attached glass substrate in which resist lines were not peeled off, 3 point was given to a photosensitive transfer material-attached glass substrate in which resist lines were partially peeled off, and 1 point was given to a photosensitive transfer material-attached glass substrate in which resist lines were all peeled off.

<Evaluation of Resist Peeling Properties>

The photosensitive transfer material was laminated on the Cu-attached PET substrate at a laminator roll temperature of 130° C., thereby producing a photosensitive transfer material-attached glass substrate. The produced photosensitive transfer material-attached glass substrate was exposed through a mask having a transmitting portion with a line width of 10 μm with the PET temporary support attached thereto/the PET temporary support was peeled off/the photosensitive transfer material-attached glass substrate was developed. After that, the photosensitive transfer material-attached glass substrate was post-baked at 140° C. for 3 minutes and was immersed in a resist peeling solution (MS2001 manufactured by Fujifilm Electronic Materials Inc.) at 70° C., and the peeling duration was evaluated. 5 Point was given in a case in which a resist was peeled off within 5 minutes, 4 point was given in a case in which a resist was peeled off within 7 minutes, 3 point was given in a case in which a resist was peeled off within 9 minutes, 2 point was given in a case in which a resist was peeled off within 11 minutes, and 1 point was given in a case in which a resist was not peeled off within 11 minutes.

<Evaluation of Dust Generation Properties During Processes>

A 20 cm-long cut was opened in the photosensitive transfer material using a knife, the cut portion was observed using a microscope, and the number of foreign substances having a size of 50 μm or larger attached to the short surface of the cut was counted. The maximum length of the foreign substance was used as the size of the foreign substance. Evaluation was conducted using 1: The number of foreign substances was 100 or larger 2: The number of foreign substances was in a range of 50 to 99

3: The number of foreign substances was in a range of 20 to 49

4: The number of foreign substances was in a range of 5 to 19

5: The number of foreign substances was 4 or smaller

TABLE 1

| | Photosensitive resin composition | | | | | | | | | | | |
|---|---|---|---|---|---|---|---|---|---|---|---|---|
| | Polymer component (A) | | | | | | | | | | | |
| | A1 | A2 | A3 | Mixing ratio | Cross-linking group (% by mass) | Monomer | Photoacid generator | Photo-sensi-tizing agent | Thermo-polymeri-zation initiator | Sensi-tizer | Basic compound | Hetero-cyclic compound |
| Example 1 | PHS-EVE | — | — | — | 0 | — | PAG-1 | — | — | Sensi-tizer 1 | Basic compound 1 | — |
| Example 2 | PHS-THF | — | — | — | 0 | — | PAG-1 | — | — | Sensi-tizer 1 | Basic compound 1 | — |
| Example 3 | MAEVE copolymer | — | — | — | 0 | — | PAG-1 | — | — | Sensi-tizer 1 | Basic compound 1 | — |
| Example 4 | MAEVE copolymer | — | — | — | 0 | — | PAG-1 | — | — | Sensi-tizer 1 | Basic compound 1 | — |
| Example 5 | Novolac EVE | — | — | — | 0 | — | PAG-1 | — | — | Sensi-tizer 1 | Basic compound 1 | — |
| Example 6 | PHS-EVE | PHS-THF | — | 1:1 | 0 | — | PAG-1 | — | — | Sensi-tizer 1 | Basic compound 1 | — |
| Example 7 | PHS-EVE | PHS-THF | PHS | 1:1:0.2 | 0 | — | PAG-1 | — | — | Sensi-tizer 1 | Basic compound 1 | — |
| Example 8 | PHS-EVE | MATHF copolymer | — | 1:1 | 0 | — | PAG-1 | — | — | Sensi-tizer 1 | Basic compound 1 | — |
| Example 9 | PHS-EVE | MATHF copolymer | — | 1:1 | 0 | — | PAG-1 | — | — | Sensi-tizer 1 | Basic compound 1 | — |
| Example 10 | PHS-EVE | MATHF copolymer | — | 1:1 | 0 | — | PAG-1 | — | — | Sensi-tizer 1 | Basic compound 1 | — |
| Example 11 | PHS-EVE | MATHF copolymer | — | 1:1 | 0 | — | PAG-1 | — | — | Sensi-tizer 1 | Basic compound 1 | — |
| Example 12 | PHS-EVE | MATHF copolymer | — | 1:1 | 0 | — | PAG-1 | — | — | Sensi-tizer 1 | Basic compound 1 | — |
| Example 13 | PHS-EVE | — | — | — | 0 | — | PAG-1 | — | — | Sensi-tizer 1 | Basic compound 1 | Heterocyclic compound 1 |
| Example 14 | PHS-EVE | MATHF copolymer | — | 1:1 | 0 | — | PAG-1 | — | — | Sensi-tizer 1 | Basic compound 1 | Heterocyclic compound 1 |
| Example 15 | PHS-EVE | MATHF copolymer | — | 1:1 | 0 | — | PAG-1 | — | — | Sensi-tizer 1 | Basic compound 1 | Heterocyclic compound 2 |
| Example 16 | PHS-EVE | — | — | — | 0 | — | PAG-1 | — | — | Sensi-tizer 1 | Basic compound 1 | — |
| Comparative Example 1 | — | — | — | — | — | Monomer A | NAI-105 | — | Initiator 1 | — | — | — |
| Comparative Example 2 | — | — | Novolac | — | 0 | — | — | NQD | — | — | — | — |

| | Evaluation | | | | | | | | | |
|---|---|---|---|---|---|---|---|---|---|---|
| | PET peeling | Cross-linking structure | Tack-iness | Sensi-tivity | Resolv-ing power | Heat-resistant rectangular properties | Line width stability | Etchant resistance | Resist peeling properties | Dust generation properties |
| Example 1 | After exposure | None | 5 | 3 | 5 | 4 | 4 | 5 | 5 | 5 |

TABLE 1-continued

| | | | | | | | | | | | |
|---|---|---|---|---|---|---|---|---|---|---|---|
| Example 2 | After exposure | None | 5 | 3 | 5 | 5 | 4 | 5 | 5 | 5 | |
| Example 3 | After exposure | None | 5 | 4 | 4 | 4 | 4 | 5 | 5 | 5 | |
| Example 4 | After exposure | None | 5 | 5 | 4 | 4 | 4 | 5 | 5 | 5 | |
| Example 5 | After exposure | None | 5 | 3 | 5 | 4 | 4 | 5 | 5 | 5 | |
| Example 6 | After exposure | None | 5 | 4 | 5 | 5 | 4 | 5 | 5 | 5 | |
| Example 7 | After exposure | None | 5 | 4 | 5 | 5 | 4 | 5 | 5 | 5 | |
| Example 8 | After exposure | None | 5 | 5 | 5 | 5 | 4 | 5 | 5 | 5 | |
| Example 9 | After exposure | None | 5 | 5 | 5 | 5 | 4 | 5 | 5 | 5 | |
| Example 10 | After exposure | None | 5 | 4 | 5 | 5 | 4 | 5 | 5 | 5 | |
| Example 11 | After exposure | None | 5 | 4 | 5 | 5 | 4 | 5 | 5 | 5 | |
| Example 12 | After exposure | None | 5 | 5 | 5 | 5 | 4 | 5 | 5 | 5 | |
| Example 13 | After exposure | Epoxy | 5 | 3 | 5 | 5 | 5 | 5 | 5 | 5 | |
| Example 14 | After exposure | Epoxy | 5 | 5 | 5 | 5 | 5 | 5 | 5 | 5 | |
| Example 15 | After exposure | Epoxy | 5 | 5 | 5 | 5 | 5 | 5 | 5 | 5 | |
| Example 16 | Before exposure | None | 5 | 3 | 5 | 4 | 3 | 5 | 5 | 5 | |
| Comparative Example 1 | After exposure | Epoxy | 1 | 1 | 1 | 1 | — | 2 | 1 | 2 | |
| Comparative Example 2 | After exposure | None | 5 | 3 | 3 | 2 | 3 | 5 | 5 | 1 | |

TABLE 2

| | Solid content composition of photosensitive resin composition (% by mass) | | | | | | | | | | | |
|---|---|---|---|---|---|---|---|---|---|---|---|---|
| | Polymer component (A) | | | | Mono-mer | Photoacid generator | Photo-sensi-tizing agent | Thermo-polymer-ization initiator | Sensi-tizer | Basic com-pound | Sur-factant | Hetero-cyclic com-pound |
| | A1 | A2 | A3 | Mixing ratio | | | | | | | | |
| Example 1 | 95.8 | — | — | — | — | 2 | — | — | 2 | 0.1 | 0.1 | — |
| Example 2 | 95.8 | — | — | — | — | 2 | — | — | 2 | 0.1 | 0.1 | — |
| Example 3 | 95.8 | — | — | — | — | 2 | — | — | 2 | 0.1 | 0.1 | — |
| Example 4 | 95.8 | — | — | — | — | 2 | — | — | 2 | 0.1 | 0.1 | — |
| Example 5 | 95.8 | — | — | — | — | 2 | — | — | 2 | 0.1 | 0.1 | — |
| Example 6 | 47.9 | 47.9 | — | 1:1 | — | 2 | — | — | 2 | 0.1 | 0.1 | — |
| Example 7 | 43.5 | 43.5 | 8.7 | 1:1:0.2 | — | 2 | — | — | 2 | 0.1 | 0.1 | — |
| Example 8 | 47.9 | 47.9 | — | 1:1 | — | 2 | — | — | 2 | 0.1 | 0.1 | — |
| Example 9 | 47.9 | 47.9 | — | 1:1 | — | 2 | — | — | 2 | 0.1 | 0.1 | — |
| Example 10 | 47.9 | 47.9 | — | 1:1 | — | 2 | — | — | 2 | 0.1 | 0.1 | — |
| Example 11 | 47.9 | 47.9 | — | 1:1 | — | 2 | — | — | 2 | 0.1 | 0.1 | — |
| Example 12 | 47.9 | 47.9 | — | 1:1 | — | 2 | — | — | 2 | 0.1 | 0.1 | — |
| Example 13 | 95.8 | — | — | — | — | 2 | — | — | 2 | 0.1 | 0.1 | 5 |
| Example 14 | 47.9 | 47.9 | — | 1:1 | — | 2 | — | — | 2 | 0.1 | 0.1 | 5 |
| Example 15 | 47.9 | 47.9 | — | 1:1 | — | 2 | — | — | 2 | 0.1 | 0.1 | 5 |
| Example 16 | 95.8 | — | — | — | — | 2 | — | — | 2 | 0.1 | 0.1 | — |
| Comparative Example 1 | — | — | — | — | 96.9 | 2 | — | 1 | — | — | 0.1 | — |
| Comparative Example 2 | — | — | 98.4 | — | — | — | 1.5 | — | — | — | 0.1 | — |

From Tables 1 and 2, it was found that the photosensitive transfer material of the present invention is a positive-type material, is excellent in terms of heat-resistant rectangular properties, etchant resistance, and resist peeling properties, and generates only a small amount of dust during processes.

On the other hand, it was found that the photosensitive transfer material of Comparative Example 1 in which the polymer having the constituent unit (a1) that included a group in which an acid group was protected by an acid-decomposable group was not included in the photosensitive resin composition layer and a crosslinking structure could be formed using a monomer having two ethylenic unsaturated double bonds was poor in terms of heat-resistant rectangular properties, etchant resistance, and resist peeling properties, and also had poor dust generation properties.

It was found that the photosensitive transfer material of Comparative Example 2 in which a novolac-based polymer including a structural unit that had an acid group which was not protected by an acid-decomposable group was used instead of the polymer having the constituent unit (a1) that included a group in which an acid group was protected by an acid-decomposable group was also poor in terms of heat-resistant rectangular properties, and also had poor dust generation properties.

Meanwhile, it was found that the photosensitive transfer material of the present invention was also favorable in terms of tackiness, sensitivity, resolving power, and line width stability.

Examples 101 to 115

<Attachment to ITO Substrate and Pattern Formation by Etching>

Each of the photosensitive transfer materials of Examples 1 to 15 was laminated on an ITO substrate heated to 140° C. at a rubber roller temperature of 130° C., a linear pressure of 100 N/cm, and a transport speed of 2.2 m/min using an Lamic I-type laminator manufactured by Hitachi Industries Co., Ltd. After that, an i ray (365 nm) was radiated over the mask at 100 mJ/cm$^2$ (illuminance of 20 mW/cm$^2$) using a high-pressure mercury lamp. Subsequently, the photosensitive resin composition layer was developed using an alkali aqueous solution, thereby forming a resist pattern. After that, a post bake heating treatment was carried out at 140° C. for 3 minutes before the etching step.

This resist pattern was used as an etching resist (so-called mask) and the ITO substrate was immersed in an ITO etchant (aqueous solution of 3% oxalic acid) at 40° C./min, thereby patterning the ITO substrate through wet etching. After that, the patterned ITO substrate was immersed in a resist peeling solution (MS2001, manufactured by Fujifilm Electronic Materials Co., Ltd.) at 70° C./7 minutes, thereby peeling the resist pattern.

It was found that the ITO patterns obtained using the photosensitive transfer materials of Examples 1 to 15 as the etching resists were defect-free and could be used as transparent electrode patterns in capacitance-type input devices. That is, it was found that the photosensitive transfer material of the present invention exhibits favorable characteristics even when used as a removable etching resist.

Example 116

A photosensitive transfer material was produced in the same manner as in Example 101 except for the fact that, in Example 101, exposure was carried out without peeling PET off before the exposure as in Example 16 and then PET was peeled off. It was found that the obtained ITO pattern was defect-free and could be used as a transparent electrode pattern in capacitance-type input devices. That is, it was found that the photosensitive transfer material of the present invention exhibits favorable characteristics even when used as a removable etching resist.

Examples 201 to 216

Photosensitive transfer materials were produced in the same manner except for the fact that, in Examples 101 to 116, PET having a Cu film (thickness: 1000 nm) formed using a sputtering method was used and a hydrogen peroxide/sulfuric acid-based etchant was used for etching. It was found that the obtained Cu patterns were defect-free and could be used as electrode patterns in capacitance-type input devices. That is, it was found that the photosensitive transfer material of the present invention exhibits favorable characteristics even when used as a removable etching resist.

EXPLANATION OF REFERENCES

1: front plate
2: mask layer
3: first transparent electrode pattern
3$a$: pad portion
3$b$: connection portion
4: second transparent electrode pattern
5: insulating layer
6: conductive element
7: transparent protective layer
8: opening portion
10: capacitance-type input device
11: reinforced glass
C: first direction
D: second direction

What is claimed is:

1. A method for producing a capacitance-type input device, comprising a pattern formation method which includes the following steps:
   a photosensitive resin composition layer formation step of forming a photosensitive resin composition layer on at least one surface of a substrate using the following photosensitive transfer material;
   an exposure step of exposing the photosensitive resin composition layer; and
   a development step of developing the exposed photosensitive resin composition layer, wherein the photosensitive transfer material comprises:
   a support; and
   a photosensitive resin composition layer,
   wherein the photosensitive resin composition layer includes a polymer component (A) including a polymer having a constituent unit (a1) that includes a group in which an acid group is protected by an acid-decomposable group and a photoacid generator (B),
   the photosensitive resin composition layer does not have an ethylenic crosslinking structure; and
   the constituent unit (a1) of the polymer component (A) is a constituent unit represented by General Formula (A2') below:

GENERAL FORMULA (A2')

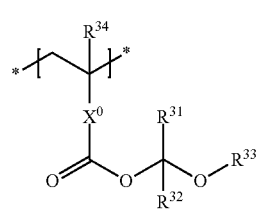

in General Formula (A2'), each of $R^{31}$ and $R^{32}$ independently represents a hydrogen atom, an alkyl group, or an aryl group, either or both $R^{31}$ or $R^{32}$ is an alkyl group or an aryl group, $R^{33}$ represents an alkyl group or an aryl group, $R^{31}$ or $R^{32}$ and $R^{33}$ may be combined together so as to form a cyclic ether, $R^{34}$ represents a hydrogen atom or a methyl group, and $X^0$ represents a single bond or an arylene group.

2. The method for producing a capacitance-type input device according to claim 1, wherein the recited pattern formation method further comprises:
   a post-baking step of heating a pattern image made of the photosensitive resin composition layer obtained by means of development.

3. The method for producing a capacitance-type input device according to claim 1, wherein the method further comprises:
   a step of carrying out etching using a pattern produced using the pattern formation method recited in claim 1 as an etching resist; and
   a step of removing the pattern through a chemical treatment after an etching treatment.

4. The method for producing a capacitance-type input device according to claim 1,
   wherein the photosensitive resin composition layer of the photosensitive transfer material includes two or more kinds of polymers having the constituent unit (a1) that includes a group in which an acid group is protected by an acid-decomposable group and;
   the photosensitive resin composition layer includes a polymer having a constituent unit represented by General Formula (A2') as the polymer component (A) having the constituent unit (a1) that includes a group in which an acid group is protected by an acid-decomposable group and a polymer not having a constituent unit represented by the General Formula (A2') as the polymer having the constituent unit (a1) that includes a group in which an acid group is protected by an acid-decomposable group

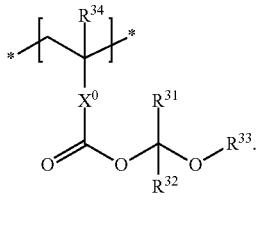

* * * * *